(12) United States Patent
Komatsu et al.

(10) Patent No.: US 11,267,715 B2
(45) Date of Patent: *Mar. 8, 2022

(54) CERIA-BASED COMPOSITE FINE PARTICLE DISPERSION, PRODUCTION METHOD THEREFOR, AND POLISHING ABRASIVE GRAIN DISPERSION INCLUDING CERIA-BASED COMPOSITE FINE PARTICLE DISPERSION

(71) Applicant: JGC Catalysts and Chemicals Ltd., Kawasaki (JP)

(72) Inventors: Michio Komatsu, Kitakyushu (JP); Hiroyasu Nishida, Kitakyushu (JP); Yuji Tawarazako, Kitakyushu (JP); Shinya Usuda, Kitakyushu (JP); Kazuhiro Nakayama, Kitakyushu (JP)

(73) Assignee: JGC Catalysts and Chemicals Ltd., Kawasaki (JP)

( * ) Notice: Subject to any disclaimer, the term of this patent is extended or adjusted under 35 U.S.C. 154(b) by 95 days.

This patent is subject to a terminal disclaimer.

(21) Appl. No.: 16/616,010

(22) PCT Filed: May 23, 2018

(86) PCT No.: PCT/JP2018/019902
§ 371 (c)(1),
(2) Date: Nov. 22, 2019

(87) PCT Pub. No.: WO2018/221357
PCT Pub. Date: Dec. 6, 2018

(65) Prior Publication Data
US 2020/0087554 A1    Mar. 19, 2020

(30) Foreign Application Priority Data

Jun. 1, 2017  (JP) .............................. JP2017-109087
Jun. 16, 2017 (JP) .............................. JP2017-118993

(51) Int. Cl.
*C01B 33/12* (2006.01)
*C09K 3/14* (2006.01)
*H01L 21/304* (2006.01)

(52) U.S. Cl.
CPC ............ *C01B 33/12* (2013.01); *C09K 3/1472* (2013.01); *H01L 21/304* (2013.01)

(58) Field of Classification Search
CPC .... C01B 33/12; C09K 3/1472; C09K 3/1463; C09K 3/1436; C09K 3/1454; H01L 21/304; H01L 21/31053; C09G 1/02; B24B 37/00
(Continued)

(56) References Cited

U.S. PATENT DOCUMENTS 5,766,279 A    6/1998 Ueda et al.
5,938,837 A    8/1999 Hanawa et al.
(Continued)

FOREIGN PATENT DOCUMENTS

EP    3447790 A1    2/2019
EP    3539926 A1    9/2019
(Continued)

OTHER PUBLICATIONS

Translation of JP2015231029A (Year: 2015).*
(Continued)

*Primary Examiner* — Duy Vu N Deo
(74) *Attorney, Agent, or Firm* — The Webb Law Firm

(57) ABSTRACT

Aiming at providing a ceria-based composite particle dispersion capable of polishing silica film, Si wafer or even hard-to-process material at high polishing rate, and can give high surface accuracy, disclosed is a ceria-based composite particle dispersion that contains a ceria-based composite particle that has an average particle size of 50 to 350 nm, to solve the aforementioned problem, featured by that the ceria-based composite particle has a mother particle, a cerium-containing silica layer, a child particle, and an easily soluble silica-containing layer; the mother particle contains amorphous silica as a major ingredient; the child particle (Continued)

contains crystalline ceria as a major ingredient; ratio of the mass of the easily soluble silica-containing layer relative to the mass of the ceria-based composite particle falls in a specific range; mass ratio of silica and ceria in the ceria-based composite particle falls in a specific range; the ceria-based composite particle, when analyzed by X-ray diffractometry, shows only a crystal phase of ceria; and the ceria-based composite particle has an average crystallite size of the crystalline ceria, when analyzed by X-ray diffractometry, of 10 to 25 nm.

15 Claims, 9 Drawing Sheets

(58) Field of Classification Search
USPC .............................. 51/307–309; 438/690–693
See application file for complete search history.

(56) References Cited

U.S. PATENT DOCUMENTS

| | | | |
|---|---|---|---|
| 10,730,755 B2* | 8/2020 | Tawarazako | C09K 3/14 |
| 10,844,259 B2* | 11/2020 | Tawarazako | B24B 37/00 |
| 10,920,120 B2* | 2/2021 | Komatsu | C09G 1/04 |
| 2012/0077419 A1 | 3/2012 | Zhang et al. | |
| 2018/0016477 A1 | 1/2018 | Inoue et al. | |
| 2018/0105428 A1 | 4/2018 | Tawarazako et al. | |
| 2019/0153279 A1 | 5/2019 | Tawarazako et al. | |
| 2019/0248668 A1 | 8/2019 | Komatsu et al. | |

FOREIGN PATENT DOCUMENTS

| | | |
|---|---|---|
| JP | 9-132770 A | 5/1997 |
| JP | 2746861 A | 2/1998 |
| JP | 2013119131 A | 6/2013 |
| JP | 2017043531 A | 3/2017 |
| WO | 2016129486 A1 | 8/2016 |
| WO | 2016159167 A1 | 10/2016 |
| WO | 2016129476 A1 | 4/2017 |

OTHER PUBLICATIONS

WO2005035688A (Year: 2005).*
Lee, Seung-Ho, et al., Chemical mechanical polishing of thermal oxide films using silica particules coated with ceria, J. Mater Res., Oct. 2002, pp. 2744-2749, vol. 17, No. 10, Materials Research Society.

* cited by examiner

[Fig 1]
(a)
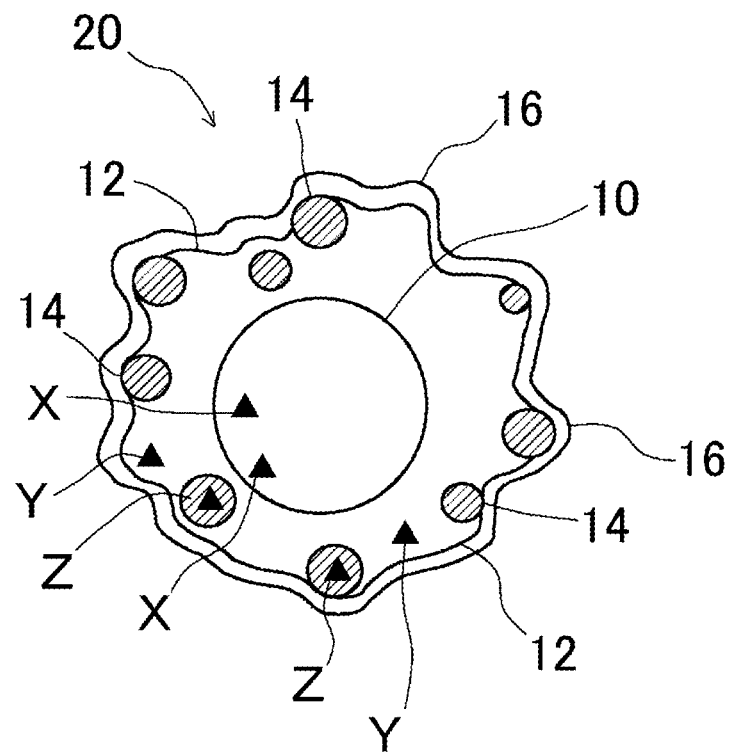
(b)
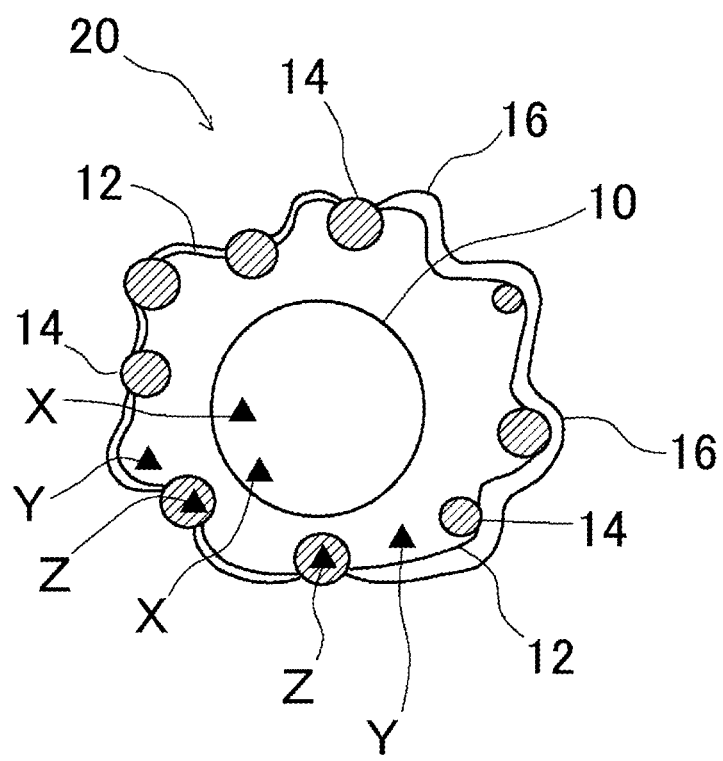

[Fig 2]
(a)
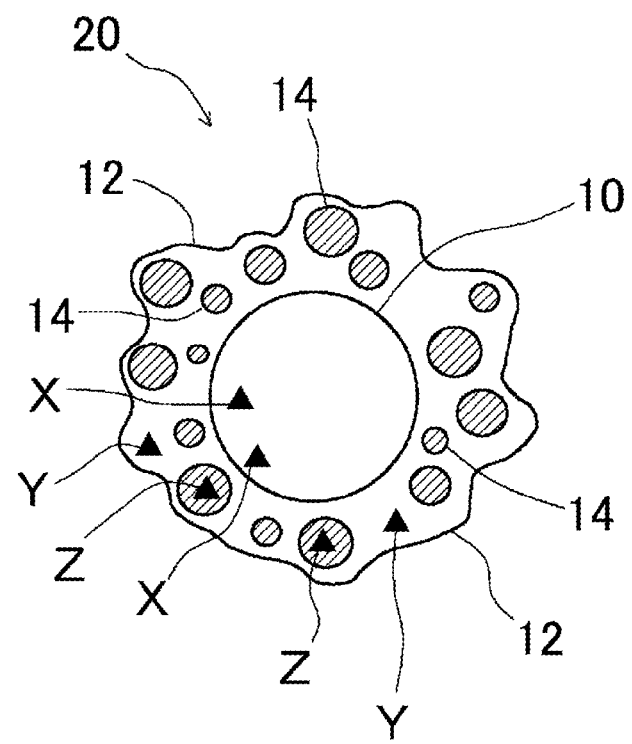
(b)
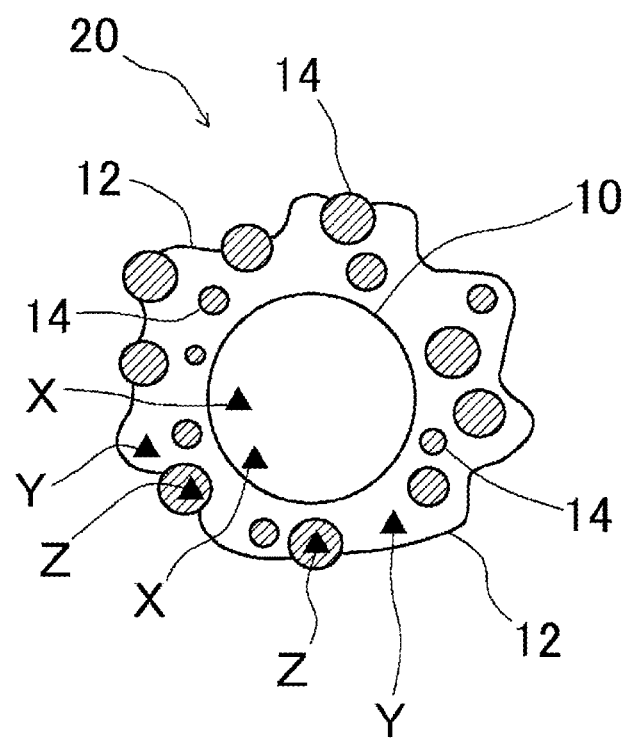

[Fig 3]
(a)
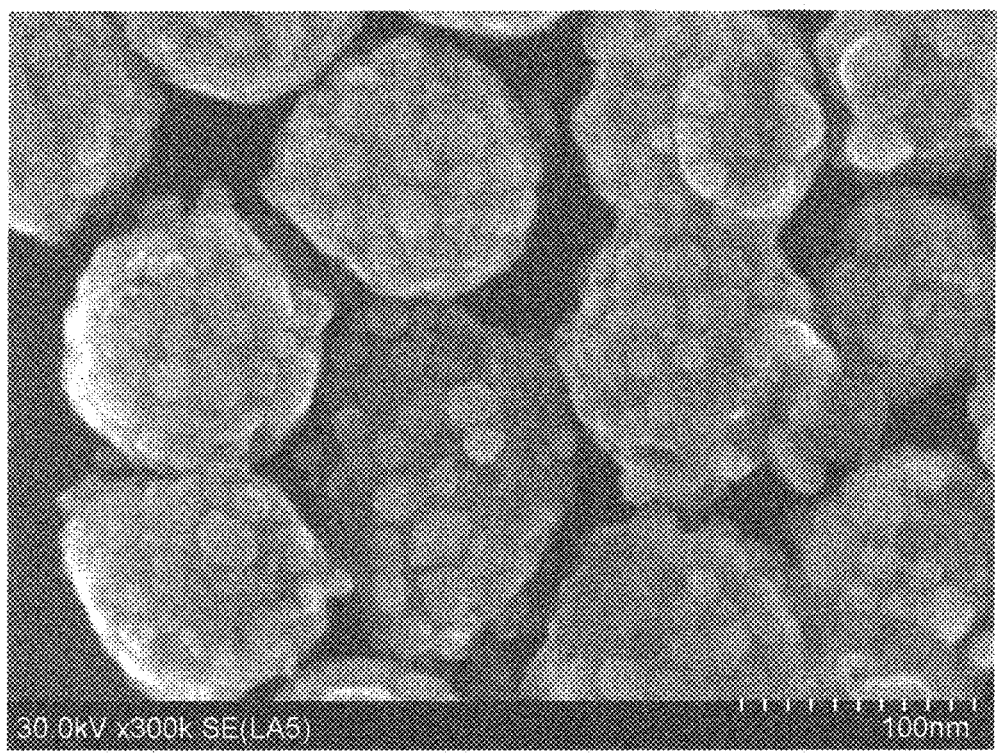
(b)
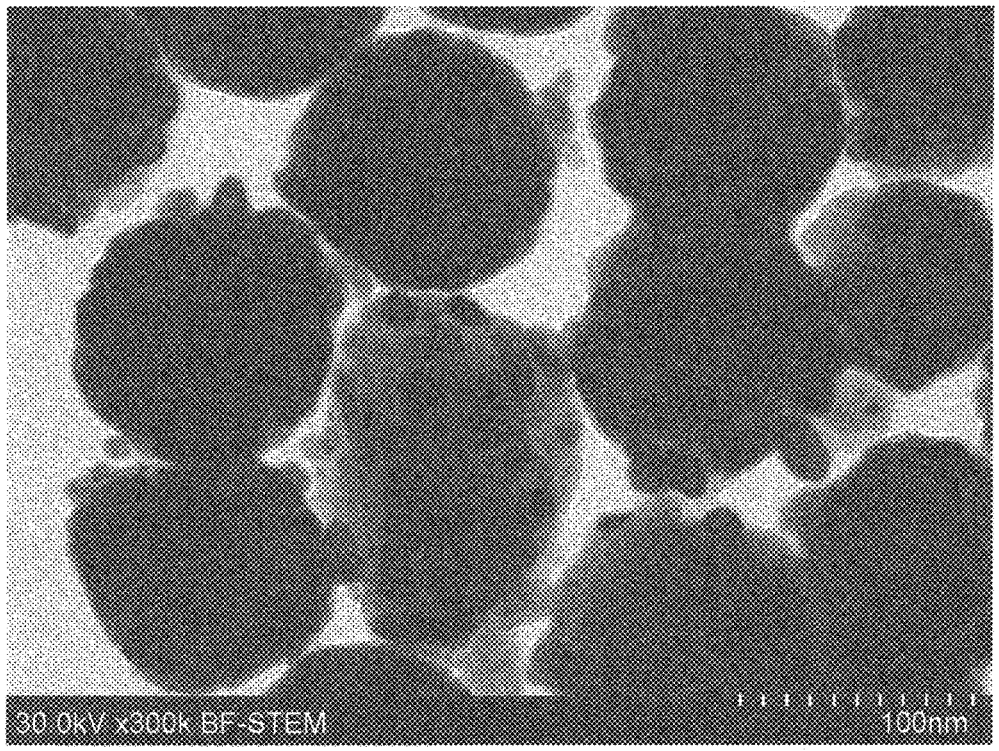

[Fig 4]
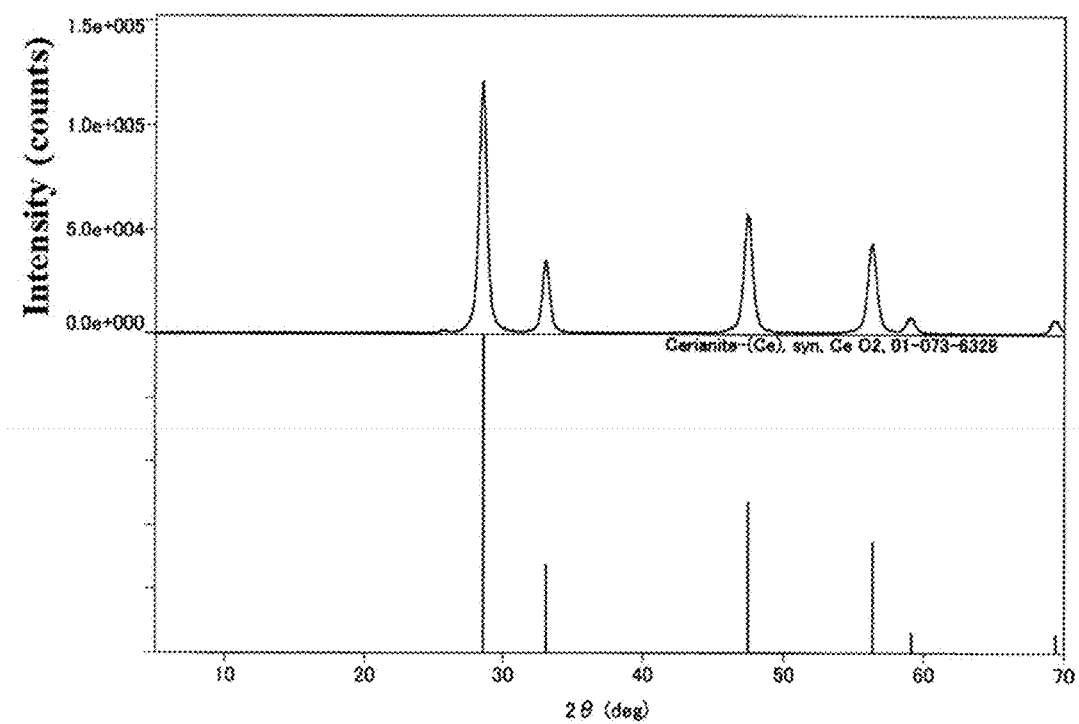

[Fig 5]
(a)
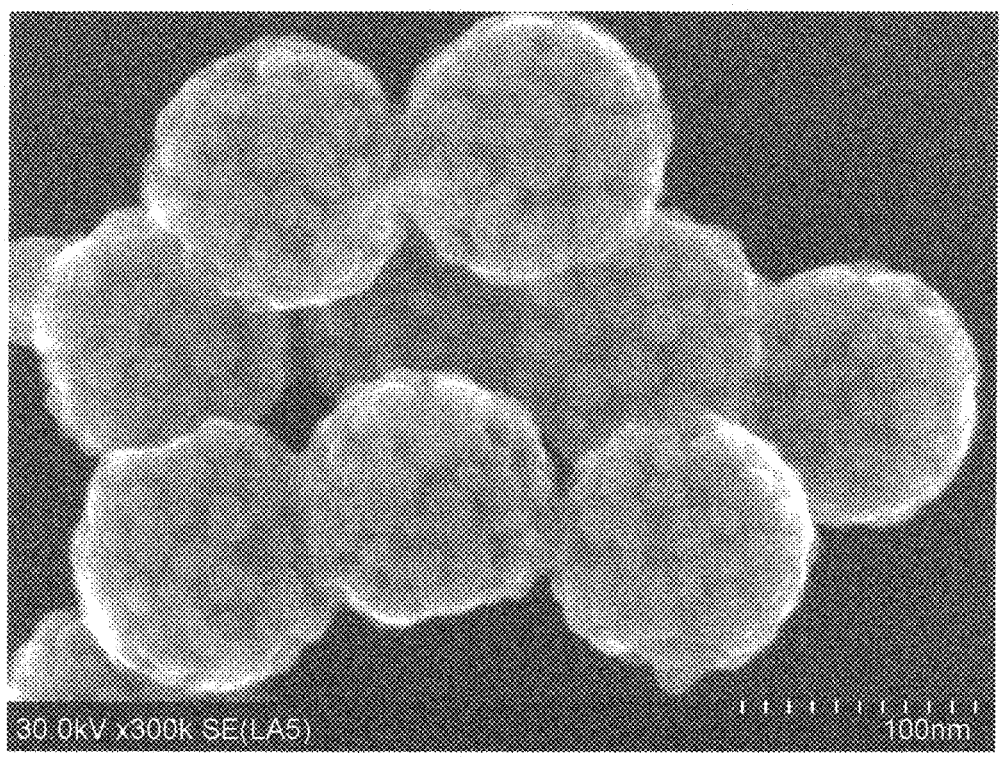
(b)
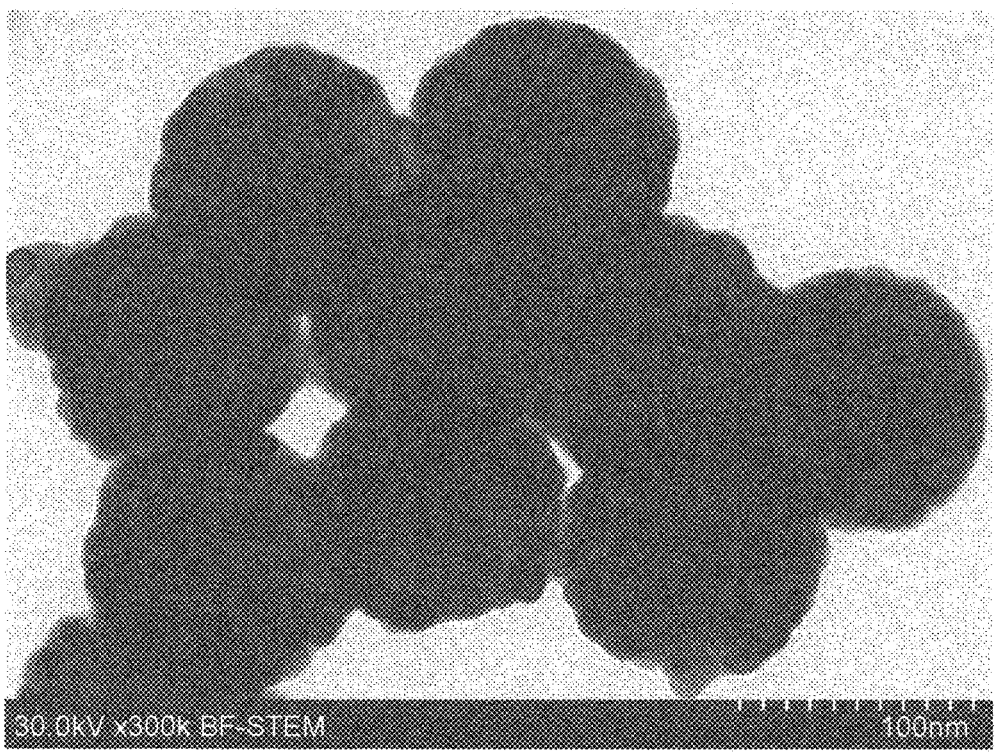

[Fig 6]
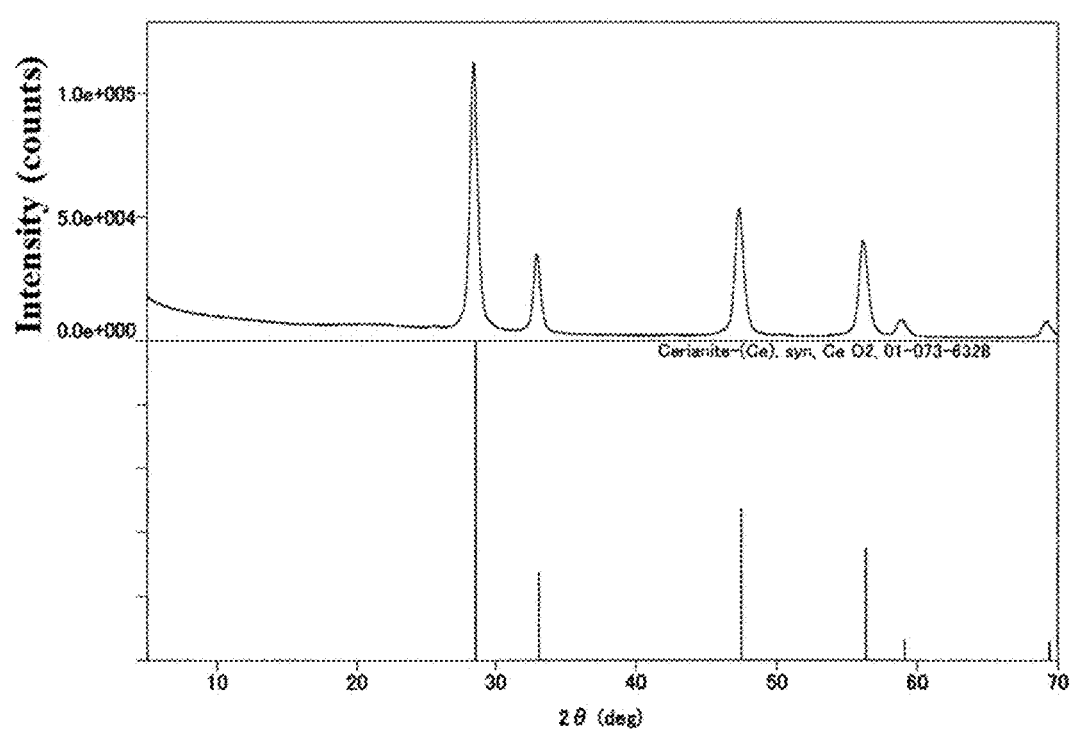
[Fig 7]
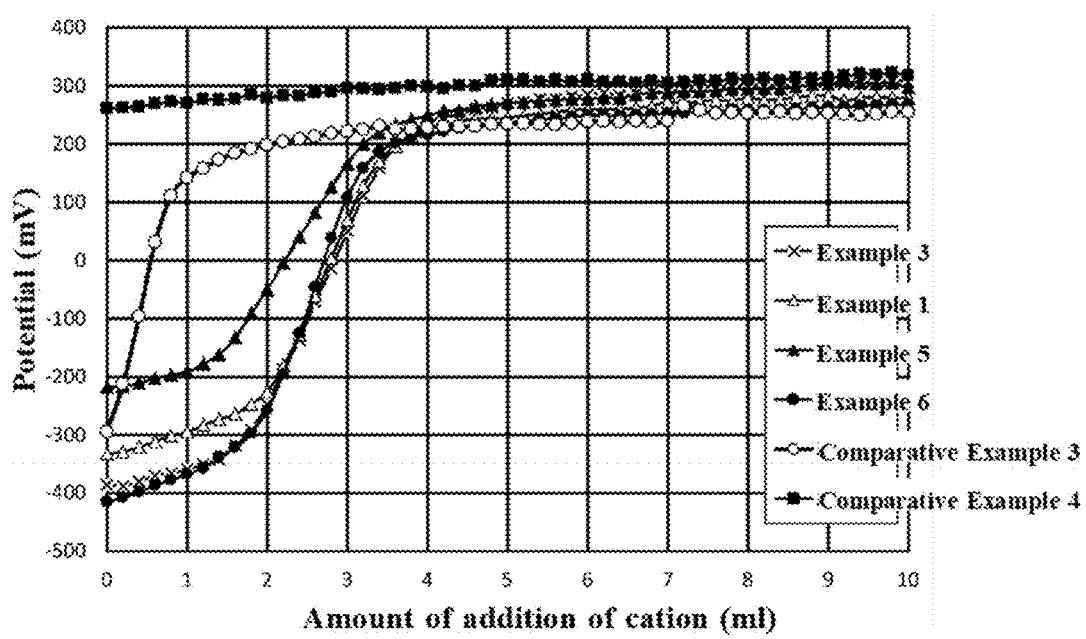

[Fig 8]
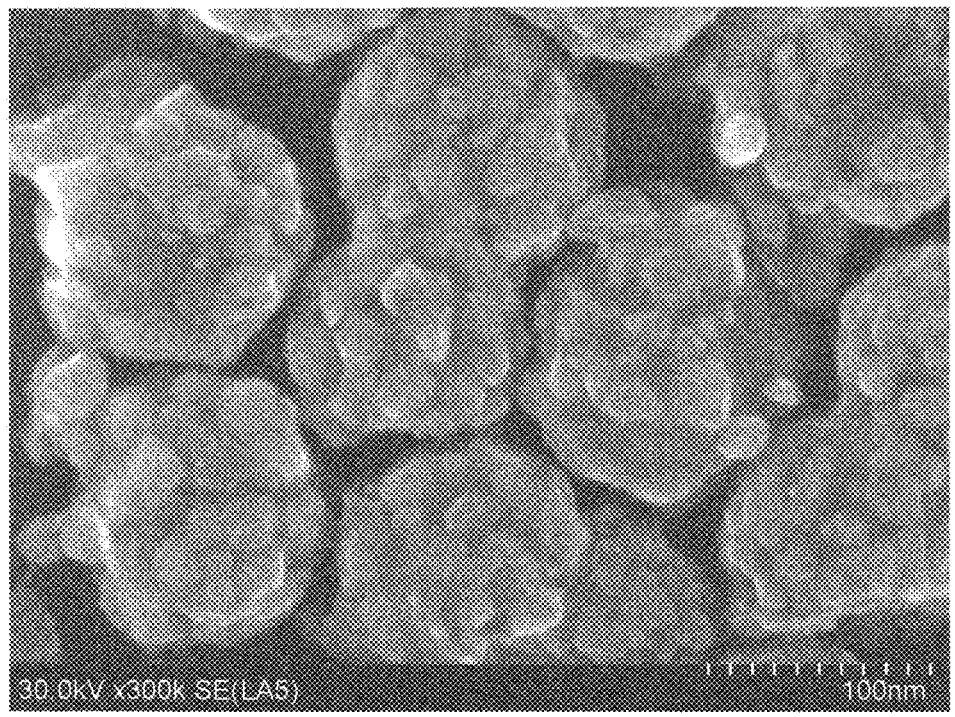
[Fig 9]
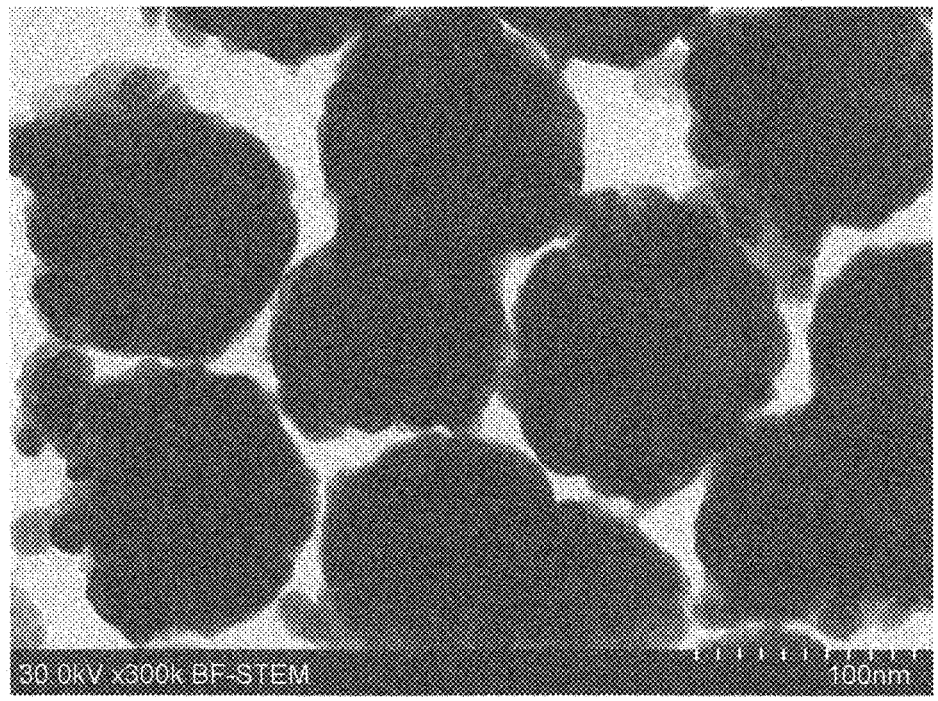

[Fig 10]
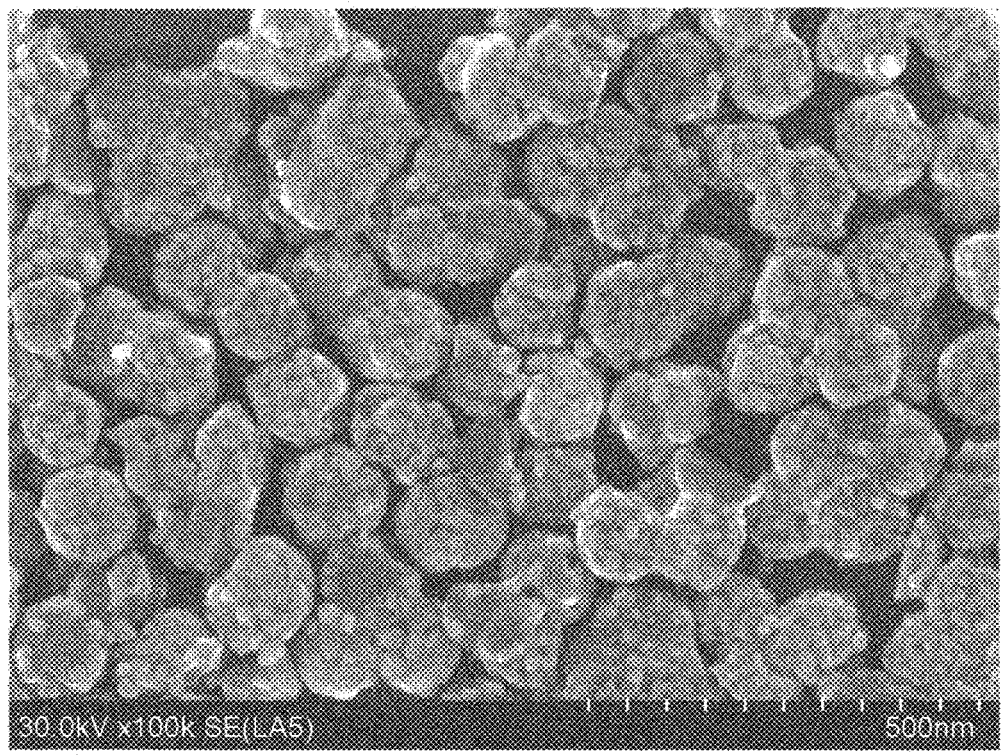
[Fig 11]
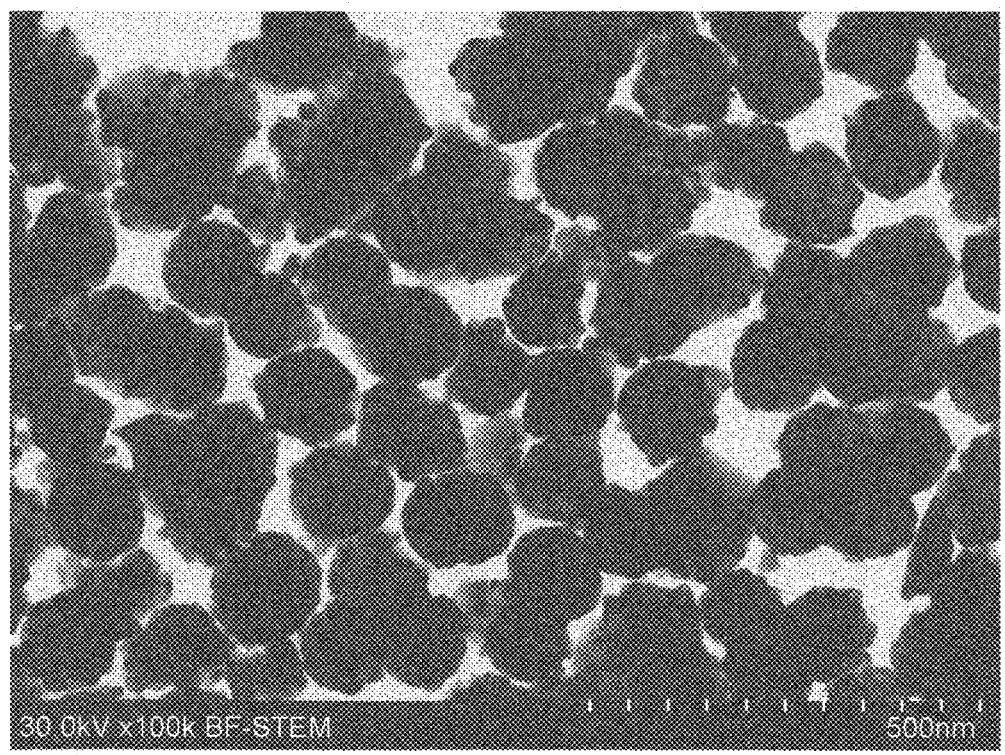

[Fig 12]
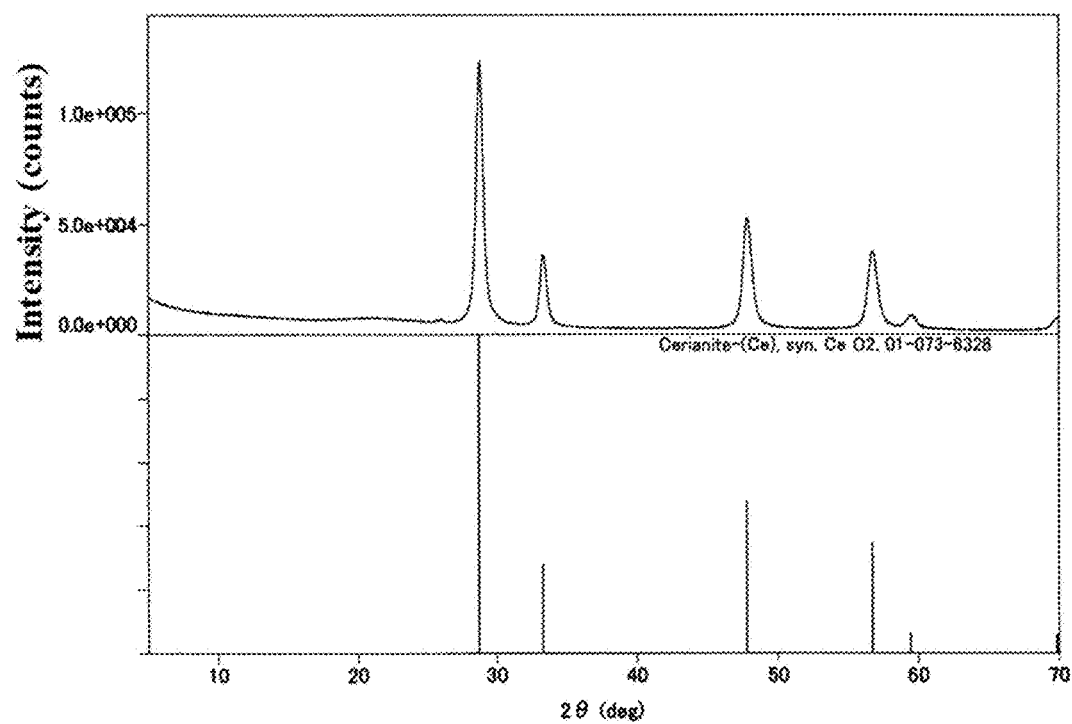

CERIA-BASED COMPOSITE FINE PARTICLE DISPERSION, PRODUCTION METHOD THEREFOR, AND POLISHING ABRASIVE GRAIN DISPERSION INCLUDING CERIA-BASED COMPOSITE FINE PARTICLE DISPERSION

CROSS-REFERENCE TO RELATED APPLICATIONS

This application is the United States national phase of International Application No. PCT/JP2018/019902 filed May 23, 2018, and claims priority to Japanese Patent Application Nos. 2017-109087 and 2017-118993, filed Jun. 1, 2017 and Jun. 16, 2017, respectively, the disclosures of which are hereby incorporated by reference in their entirety.

TECHNICAL FIELD

This invention relates to a ceria-based composite particle dispersion suitably applicable to an abrasive used for manufacture of semiconductor devices, and in particular to a ceria-based composite particle dispersion used in chemical mechanical polishing (CMP) for planarizing a film to be polished formed on a substrate, a method for manufacturing the same, and a polishing abrasive particle dispersion containing the ceria-based composite particle dispersion.

BACKGROUND ART

Semiconductor devices on semiconductor substrates, circuit boards and so forth achieve their high performances by high integration density and dimensional shrinkage. Manufacturing process for such semiconductor devices has employed so-called chemical mechanical polishing (CMP), which has become an indispensable technology for shallow trench isolation, planalization of interlayer insulating film, and formation of contact plugs or Cu damascene interconnect.

Most abrasives for CMP are composed of abrasive particle and chemical ingredient, wherein the chemical ingredient takes part in promoting polishing through oxidation and corrosion of a target film. Meanwhile, the abrasive particle takes part in polishing based on mechanical action, for which colloidal silica, fumed silica, and ceria particle are employed. In particular, ceria particle is applied to polishing in a shallow trench isolation process, for its specifically high polishing rate exerted on silicon oxide film.

In the shallow trench isolation step, not only the silicon oxide film, but also silicon nitride film is polished. For easy element isolation, polishing preferably advances rapidly on the silicon oxide film, meanwhile slowly on the silicon nitride film, placing importance on such ratio of polishing rate (selectivity).

An exemplary practiced method for polishing on such material employs a relatively rough primary polishing and a precise secondary polishing, so as to obtain a very precisely finished surface with less defects such as scratches.

Abrasives used for such secondary polishing, as finish polishing, have been manufactured by the methods proposed as below.

For example, Patent Literature 1 describes a method for manufacturing a ultrafine cerium oxide particle (with an average particle size of 10 to 80 nm) composed of single-crystalline cerium oxide, by which an aqueous cerium(III) nitrate solution and a base are mixed according to a volume proportion so as to adjust pH to 5 to 10, the mixture under stirring is rapidly heated to 70 to 100° C. and kept at that temperature for ripening. The literature also describes that the method can provide ultrafine cerium oxide particle with high uniformity of particle size and high uniformity of particle shape.

Non-Patent Literature 1 describes a method for manufacturing a ceria-coated silica, which includes a manufacturing process similar to the method for manufacturing a ultrafine cerium oxide particle described in Patent Literature 1. The method for manufacturing a ceria-coated silica does not have firing and dispersion processes that are contained the method of manufacturing described in Patent Literature 1.

Patent Literature 2 describes a method of manufacturing a silica-based composite particle that has an amorphous silica particle A, and formed on the surface thereof, a crystalline oxide layer B that contains one or more kinds of elements selected from zirconium, titanium, iron, manganese, zinc, cerium, yttrium, calcium, magnesium, fluorine, lanthanum, and strontium. The literature also describes a preferred mode in which the amorphous silica particle A has, on the surface thereof, an amorphous oxide layer C which is an amorphous oxide layer containing aluminum or other element but different from an amorphous silica layer, and further thereon, the crystalline oxide layer B that contains one or more kinds of elements selected from zirconium, titanium, iron, manganese, zinc, cerium, yttrium, calcium, magnesium, fluorine, lanthanum, and strontium. According to the description, such silica-based composite particle, having the crystalline oxide layer B on the surface of the amorphous silica particle A, can improve the polishing rate; can advantageously suppresses the particles from being sintered during firing, and can thereby improve dispersibility in a polishing slurry, owing to pretreatment of the silica particle; and can provide an inexpensive abrasive with high polishing performance, since cerium oxide may be excluded or the amount of consumption thereof may be reduced to a large degree. The literature further describes that the particle additionally having the amorphous oxide layer C between the silica-based particle A and the oxide layer B particularly excels in an effect of suppressing sintering of particles, and an effect of improving the polishing rate.

CITATION LIST

Patent Literature

[Patent Literature 1] JP-B2-2746861
[Patent Literature 2] JP-A-2013-119131

Non-Patent Literature

[Non-Patent Literature 1] Seung-Ho Lee, Zhenyu Lu, S. V. Babu and Egon Matijevic, "Chemical mechanical polishing of thermal oxide films using silica particles coated with ceria", *Journal of Materials Research*, Volume 17, Issue 10, 2002, pp 2744-2749

The present inventors actually manufactured and then investigated the ultrafine cerium oxide particle described in Patent Literature 1, and found that the particle showed only low polishing rate, and was likely to cause defects on the surface of a target substrate to be polished (degraded surface accuracy, increased scratches, and residence of the abrasive on the surface of the target substrate to be polished).

According to the present inventors, this is supposedly and largely because the method for manufacturing a ultrafine cerium oxide particle described in Patent Literature 1 does not contain a firing step but only to allow the cerium oxide particle to crystallize from a liquid phase (aqueous cerium (III) nitrate solution), unlike the method for manufacturing a ceria particle which includes a firing process (crystallinity of ceria particle may be increased by firing), so that the obtainable cerium oxide particle can have only a relatively low crystallinity, and so that the cerium oxide that remains unbound to the mother particle, due to lack of firing process, is likely to reside on the surface of the target substrate to be polished.

Meanwhile, the ceria-coated silica described in Non-Patent Literature 1, having not been fired, is considered to actually demonstrate low polishing rate. Also since the ceria is neither fused nor integrated with the silica particle, the ceria is anticipated to fall easily, and this reduces polishing rate, destabilizes polishing, and leaves the abrasive on the surface of the target substrate to be polished.

The present inventors additionally found that the silica-based composite particle with the oxide layer C described in Patent Literature 2, when used for polishing, occasionally causes residence of aluminum or other impurities on the surface of semiconductor devices, and may adversely affect the semiconductor devices.

The ceria particles described in these literatures merely adhere on the mother particles, rather than being strongly bound, and are likely to fall from the mother particles.

Moreover, the abrasive particle described in Patent Literature 2, having the spherical silica mother particle and crystalline ceria particles formed thereon, and when used as an abrasive particle for polishing, can advantageously suppress scratching, and can demonstrate a high polishing rate on silica film, while being assisted by a chemical reaction that occurs concurrently with mechanical action during the polishing. However, due to sphericity of the mother particle, the abrasive particle tends to decrease the dynamic coefficient of friction since the abrasive particle can roll, so that the polishing rate would be insufficient for applications where higher polishing rate is required.

SUMMARY OF THE INVENTION

It is therefore an object of this invention to solve the aforementioned problems. That is, this invention is to provide a ceria-based composite particle dispersion that can polish silica film, Si wafer and even hard-to-process material at high rates, and can give high surface accuracy (less scratches, less residence of abrasive particle on substrate, improved Ra value of substrate); a method for manufacturing the same; and a polishing abrasive particle dispersion. The ceria-based composite particle of this invention, in its preferred mode free of impurities, is suitably applicable to polishing of the surfaces of semiconductor devices such as semiconductor substrates, circuit boards, and so forth.

The present inventors conducted thorough investigations aimed at solving the aforementioned problems, and arrived at this invention.

According to this invention, there is provided a ceria-based composite particle dispersion, containing a ceria-based composite particle that has an average particle size of 50 to 350 nm and is featured by [1] to [3] below:

[1] the ceria-based composite particle has a mother particle, a cerium-containing silica layer on the surface of the mother particle, and a child particle dispersed inside the cerium-containing silica layer;

[2] the mother particle contains amorphous silica as a major ingredient, and the child particle contains crystalline ceria as a major ingredient; and

[3] the ceria-based composite particle has an average crystallite size of the crystalline ceria, when analyzed by X-ray diffractometry, of 10 to 25 nm.

Such ceria-based composite particle dispersion also will be referred to as "the dispersion liquid of this invention", hereinafter.

Meanwhile, the ceria-based composite particle contained in the dispersion of this invention will be referred to as "the composite particle of this invention", hereinafter.

The ceria-based composite particle dispersion of this invention preferably contains the ceria-based composite particle further featured by [4] to [7] below:

[4] the ceria-based composite particle further has an easily soluble silica-containing layer as the outermost layer;

[5] ratio D of mass $D_1$ of the easily soluble silica-containing layer to mass $D_2$ of the ceria-based composite particle ($D=D_1/D_2 \times 100$) is 0.08 to 30%;

[6] the ceria-based composite particle has a mass ratio of silica and ceria of 100:11 to 316; and

[7] the ceria-based composite particle, when analyzed by X-ray diffractometry, shows ceria detectable only in a crystal phase.

The ceria-based composite particle that has an average particle size of 50 to 350 nm and is featured by [1] to [7] above will be referred to as "a first composite particle of this invention", hereinafter.

Meanwhile, the ceria-based composite particle dispersion that contains such first composite particle of this invention also will be referred to as "a first dispersion of this invention".

The ceria-based composite particle dispersion of this invention preferably contains the ceria-based composite particle further featured by [9] to [11] below:

[9] the crystalline ceria in the child particle has silicon atom solid-solubilized therein, and additionally has one or more different atoms solid-solubilized therein;

[10] each of contents of cerium, silicon and the different atom(s) in the ceria-based composite particle satisfies a relation given by (Ce+M)/Si=0.038 to 1.11, where M means a total mole number of one or more different atoms, and Ce and Si mean mole numbers of cerium atom and silicon atom, respectively; and

[11] the ceria-based composite particle, when analyzed by X-ray diffractometry, shows (i) only a crystal phase of ceria, or (ii) only a crystal phase of ceria and crystal phase(s) of oxide(s) of the different atom(s).

The ceria-based composite particle that has an average particle size of 50 to 350 nm and is featured by [1] to [3] and [9] to [11] above will be referred to as "a second composite particle of this invention", hereinafter.

Meanwhile, the ceria-based composite particle dispersion that contains such second composite particle of this invention also will be referred to as "a second dispersion of this invention".

Note that a simple notation of "the dispersion of this invention" in the description below is defined to encompass both of "the first dispersion of this invention" and "the second dispersion of this invention".

According to this invention, there is also provided a method for manufacturing a ceria-based composite particle dispersion of this invention, the method including the Steps 1 to 3 below:

Step 1: keeping a silica-based particle dispersion, having a silica-based particle dispersed in a solvent, stirred at a temperature of 0 to 20° C., at a pH of 7.0 to 9.0, and at a redox potential of 50 to 500 mV, and adding thereto a metal salt of cerium is continuously or intermittently, to thereby obtain a precursor particle dispersion that contains a precursor particle;

Step 2: drying the precursor particle dispersion, firing the precursor particle at 800 to 1,200° C., bringing the obtained fired product into contact with a solvent, wet crushing the fired product within the pH range from 8.6 to 11.5, to obtain a crushed fired product dispersion; and Step 3: centrifuging the crushed fired product dispersion at a relative centrifugal acceleration of 300 G or larger, and then removing a sediment fraction, to thereby obtain the ceria-based composite particle dispersion.

Note that the relative centrifugal acceleration is given by a ratio relative to the gravitational acceleration of earth assumed as 1 G.

Such manufacturing method also will be referred to as "a first manufacturing method of this invention", hereinafter.

The first dispersion of this invention is preferably manufactured by the first manufacturing method of this invention.

According to this invention, there is also provided a method for manufacturing a ceria-based composite particle dispersion, the method including the Steps 4 to 6 below:

Step 4: keeping a silica-based particle dispersion, having a silica-based particle dispersed in a solvent, stirred at a temperature of 0 to 20° C., at a pH of 7.0 to 9.0, and at a redox potential of 50 to 500 mV, and adding thereto a metal salt of cerium and a salt containing different atom independently or in a premixed manner, is continuously or intermittently, to thereby obtain a precursor particle dispersion that contains a precursor particle;

Step 5: drying the precursor particle dispersion, firing the precursor particle at 800 to 1,200° C., bringing the obtained fired product into contact with a solvent, wet crushing the fired product within the pH range from 8.6 to 10.8, to obtain a crushed fired product dispersion; and Step 6: centrifuging the crushed fired product dispersion at a relative centrifugal acceleration of 300 G or larger, and then removing a sediment fraction, to thereby obtain the ceria-based composite particle dispersion.

Note that the relative centrifugal acceleration is given by a ratio relative to the gravitational acceleration of earth assumed as 1 G.

Such manufacturing method also will be referred to as "a second manufacturing method of this invention", hereinafter.

The second dispersion of this invention is preferably manufactured by the second manufacturing method of this invention.

Note that a simple notation of "the manufacturing method of this invention" in the description below is defined to encompass both of "the first manufacturing method of this invention" and "the second manufacturing method of this invention".

Note that a simple notation of "this invention" in the description below is defined to encompass all of the first dispersion of this invention, the second dispersion of this invention, the first composite particle of this invention, the second composite particle of this invention, the first manufacturing method of this invention, and the second manufacturing method of this invention.

The dispersion of this invention, when applied as a polishing abrasive particle dispersion to polishing, or the polishing abrasive particle dispersion when applied directly as a polishing slurry to polishing, can polish silica film, Si wafer and even hard-to-process material at high rates, and can give high surface accuracy (less scratches, small surface roughness (Ra) of a target substrate to be polished). The manufacturing method of this invention is to provide a method for efficiently manufacturing the dispersion of this invention demonstrating such excellent performances.

A preferred mode of the manufacturing method of this invention also can dramatically reduce the content of impurities contained in the ceria-based composite particle, in pursuit of higher purity. Such highly purified ceria-based composite particle dispersion, obtainable by the preferred mode of the manufacturing method of this invention, is suitably applicable to polishing of the surfaces of semiconductor devices such as semiconductor substrates, circuit boards, and so forth, by virtue of absence of impurities.

The dispersion of this invention, when employed as a polishing abrasive particle dispersion, is effective for planarizing the surfaces of the semiconductor devices, and is particularly suitable for polishing of substrates having a silica insulating film formed thereon.

BRIEF DESCRIPTION OF DRAWINGS

FIG. 1 is a schematic cross sectional view of a first composite particle of this invention.

FIG. 2 is a schematic cross sectional view of a second composite particle of this invention.

FIG. 3(a) is a SEM image of a composite particle of Example 7, and

FIG. 3(b) is a TEM image of the composite particle of Example 7.

FIG. 4 is an X-ray diffraction pattern of Example 7.

FIG. 5(a) is a SEM image of a composite particle of Comparative Example 3, and

FIG. 5(b) is a TEM image of the composite particle of Comparative Example 3.

FIG. 6 is an X-ray diffraction pattern of Comparative Example 3.

FIG. 7 is a titration chart based on streaming potential.

FIG. 8 is a SEM image (300,000× magnification) of a ceria-based composite particle obtained in Example 15.

FIG. 9 is a TEM image (300,000× magnification) of the ceria-based composite particle obtained in Example 15.

FIG. 10 is a SEM image (100,000× magnification) of the ceria-based composite particle obtained in Example 15.

FIG. 11 is a TEM image (100,000× magnification) of the ceria-based composite particle obtained in Example 15.

FIG. 12 is an X-ray diffraction pattern of the ceria-based composite particle obtained in Example 15.

DESCRIPTION OF THE INVENTION

<First Composite Particle of this Invention>

The first composite particle of this invention will be explained.

The first composite particle of this invention has a structure typically illustrated in FIG. 1. Both of FIG. 1(a) and FIG. 1(b) are schematic sectional views of the first composite particle of this invention. FIG. 1(a) shows a buried type having all child particles unexposed to the outside, meanwhile FIG. 1(b) shows another type having a part of the child particles exposed outside of a cerium-containing silica layer and an easily soluble silica-containing layer.

As illustrated in FIG. 1, the first composite particle of this invention 20 has a mother particle 10, a cerium-containing silica layer 12 on the surface of the mother particle 10, child particles 14 dispersed in the cerium-containing silica layer 12 or an easily soluble silica 16, and the easily soluble silica 16 as the outermost layer.

Marks ▲ in FIG. 1 indicate measurement points X to Z of TEM-EDS analysis described later.

The present inventors presume a mechanism of formation of the cerium-containing silica layer in the first composite particle of this invention, and a mechanism allowing the child particles to stay distributed inside the cerium-containing silica layer, as follows.

Assuming now the case where tetraethyl orthosilicate ($Si(OC_2H_5)_4$) is hydrolyzed and polycondensed under addition of ammonium to obtain a silica sol, and then a cerium salt solution is added thereto while concurrently adding an alkali, to thereby neutralize the cerium salt solution. Then cerium hydroxide and cerium compound, for example, adhere on the surface of the silica sol particle (silica particle), the surface of the silica particle reacts with cerium hydroxide, and after being mediated through cerium hydroxide and silicic acid-containing cerium silicate compounds and so forth, a layer containing $CeO_2.SiO_2.SiOH$ and $CeO_2$ ultrafine particle (with a particle size of 2.5 nm or larger) (also referred to as "$CeO_2$ ultrafine particle-containing layer", hereinafter) is formed outside the silica particle. The layer is considered to be formed as a result of dissolution of the surface of silica particle reacted with cerium hydroxide, and subsequent solidification while being affected by oxygen and so forth. As such reaction proceeds, the $CeO_2$ ultrafine particle-containing layer is formed outside the silica particle.

After drying and firing at around 1,000° C., $CeO_2$ ultrafine particles having a particle size of 2.5 nm or larger, which reside inside the thus formed $CeO_2$ ultrafine particle-containing layer, grow into larger particles while capturing cerium ions that reside in the layer, and finally grow up into crystalline ceria particles of approximately 10 to 20 nm in diameter. Hence, the crystalline ceria particles can stay distributed inside the cerium-containing silica layer. The crystalline ceria particles (child particles) produced according to such mechanism is less likely to cause mutual bonding. In addition, the layer will contain cerium atoms that have not grown up into the crystalline ceria particle.

Meanwhile, after being fired, being allowed to disperse into a solvent, and being crushed while keeping the pH at 8.6 to 11.5, the hard cerium-containing silica layer, obtained by high-temperature firing, causes dissolution of silica to create an equilibrium between dissolution of silica and deposition of silica. Thus the easily soluble silica-containing layer is formed as the outermost layer of the composite particle.

In another exemplary case where the easily soluble silica-containing layer is thickened for reinforcement, a silica-containing additive is added after crushing or centrifugation, and the mixture is ripened under heating at 10 to 98° C., so as to allow silica to deposit on the composite particle to form an outermost shell, and thereby the easily soluble silica-containing layer (also referred to as "easily-soluble silica layer", hereinafter) is formed.

The schematic drawing in FIG. 1, aimed at easy understanding, has illustrated the mother particle 10, the cerium-containing silica layer 12, the child particles 14 and the easily-soluble silica layer 16 in a clearly discriminable manner. However, the actual first composite particle of this invention, presumably formed according to the aforementioned mechanism, contains these components in an integrated manner, so that it is difficult to clearly discriminate the mother particle 10, the cerium-containing silica layer 12, the child particles 14 and the easily-soluble silica layer 16, by any method other than contrast analysis in STEM/SEM image or EDS analysis.

Note, however, that the structure illustrated in FIG. 1 may be confirmed by treating the first composite particle of this invention with an alkali to remove the easily-soluble silica layer, and by analyzing a cross section of the first composite particle of this invention by the STEM-EDS analysis to determine element concentrations of Ce and Si.

More specifically, the first composite particle of this invention is alkaline-treated by a method detailed later to remove the easily-soluble silica layer, and then analyzed by EDS by which an electron beam is selectively irradiated on points specified under a scanning transmission electron microscope (STEM), and the element concentrations of Ce and Si are measured on a cross section of the first composite particle of this invention, at the measurement points X indicated in FIG. 1. Ratio (percentage) of molar concentration of Ce, to the total of molar concentration of Ce and molar concentration of Si ($Ce/(Ce+Si)\times100$) is found to be smaller than 3%. Meanwhile, from the measurement of element concentrations of Ce and Si at measurement points Z, the ratio (percentage) of molar concentration of Ce, to the total of molar concentration of Ce and molar concentration of Si ($Ce/(Ce+Si)\times100$) is found to be larger than 50%. Furthermore, from the measurement of element concentrations of Ce and Si at measurement points Y, the ratio (percentage) of molar concentration of Ce, to the total of molar concentration of Ce and molar concentration of Si ($Ce/(Ce+Si)\times100$) is found to be 3 to 50%.

Hence on an element map obtained by the STEM-EDS analysis, the mother particle 10 and the cerium-containing silica layer 12 in the first composite particle of this invention are discriminable by using a line along which the ratio (percentage) of molar concentration of Ce, to the total of molar concentration of Ce and molar concentration of Si ($Ce/(Ce+Si)\times100$) has a value of 3%. Meanwhile on an element map obtained by the STEM-EDS analysis, the cerium-containing silica layer 12 and the child particles 14 in the first composite particle of this invention are discriminable by using a line along which the ratio (percentage) of molar concentration of Ce, to the total of molar concentration of Ce and molar concentration of Si ($Ce/(Ce+Si)\times100$) has a value of 50%.

The first composite particle of this invention has the easily soluble silica-containing layer (easily-soluble silica layer 16), outside of the cerium-containing silica layer 12. The easily-soluble silica layer 16, containing silica, is difficult to be discriminated clearly from the cerium-containing silica layer 12 by the STEM-EDS analysis. The easily soluble silica-containing layer may, however, be confirmed by keeping the first composite particle of this invention under stirring in an aqueous alkaline solution, and by measuring the concentration of Si dissolved into the solution.

More specifically, a dispersion having the first composite particle of this invention dispersed in water is adjusted to pH9 by adding nitric acid or aqueous sodium hydroxide solution, further adjusted to 3.0 mass % by adding deionized water, the mixture is stirred for 15 minutes, so as to allow the easily-soluble silica layer 16 to dissolve. The mixture is then placed in a centrifugal tube with ultrafiltration membrane, and centrifuged at 1820 G for 30 minutes, during which the constituents of the easily-soluble silica layer are considered to pass through the ultrafiltration membrane. The liquid separated through the ultrafiltration membrane is collected and then measured regarding Si concentration. Letting the mass of silica dissolved in the supernatant be $D_1$, and the mass of ceria-based composite particle be $D_2$, then the first composite particle of this invention having the easily-soluble silica layer 16 gives a ratio D of $D_1$ to $D_2$ ($D=D_1/$ $D_2 \times 100$) of 0.08 to 30%. This enables discrimination from the composite particle free of the easily-soluble silica layer.

<Second Composite Particle of this Invention>

The second composite particle of this invention will be explained.

The second composite particle of this invention has a structure typically illustrated in FIG. 2. Both of FIG. 2(a) and FIG. 2(b) are schematic sectional views of the second composite particle of this invention. FIG. 2(a) shows a buried type having all child particles unexposed to the outside, meanwhile FIG. 2(b) shows another type having a part of the child particles exposed outside of the cerium-containing silica layer.

As illustrated in FIG. 2, the second composite particle of this invention 20 has the mother particle 10, the cerium-containing silica layer 12 on the surface of the mother particle 10, and the child particles 14 dispersed in the cerium-containing silica layer 12.

Marks ▲ in FIG. 2 indicate measurement points X to Z of the STEM-EDS analysis described later.

The present inventors presume a mechanism of formation of the cerium-containing silica layer in the second composite particle of this invention, and a mechanism allowing the child particles to stay distributed inside the cerium-containing silica layer, as follows.

Assuming now the case where tetraethyl orthosilicate ($Si(OC_2H_5)_4$) is hydrolyzed and polycondensed under addition of ammonium to obtain a silica sol, and then a solution containing a cerium salt solution and a salt of different element is added thereto while concurrently adding an alkali, to thereby neutralize the solution containing a cerium salt and a salt of different element. Then cerium hydroxide, cerium compound, hydroxide of the different atom, compound of different atom, as well as composite hydroxide and composite compound of these elements adhere on the surface of the silica sol particle (silica particle), the surface of the silica particle reacts with cerium hydroxide, and after being mediated through cerium hydroxide, cerium compound, silicic acid and compound of different element compound, a layer containing $CeO_2.SiO_2.SiOH$ or $MO_X.CeO_2.SiO_2.SiOH$ and $CeO_2$ ultrafine particle (with a particle size of 2.5 nm or larger) (also referred to as "$CeO_2$ ultrafine particle-containing layer", hereinafter) is formed outside the silica particle. The different atom in this process resides inside the $CeO_2$ ultrafine particle-containing layer or the $CeO_2$ ultrafine particle. The $CeO_2$ ultrafine particle-containing layer is considered to be formed as a result of dissolution of the surface of silica particle reacted with cerium hydroxide, and subsequent solidification while being affected by oxygen and so forth. As such reaction proceeds, the $CeO_2$ ultrafine particle-containing layer containing the different atom is formed.

After drying and firing at around 1,000° C., $CeO_2$ ultrafine particles having a particle size of 2.5 nm or larger, which reside inside the thus formed $CeO_2$ ultrafine particle-containing layer, grow into larger particles while capturing cerium ions that reside in the layer, and finally grow up into crystalline ceria particles of approximately 10 to 20 nm in diameter. Hence, the crystalline ceria particles can stay distributed inside the cerium-containing silica layer. After having gone through such process, the crystalline ceria particle will have silicon atom and different atoms solid-solubilized therein. The crystalline ceria particles (child particles) produced according to such mechanism is less likely to cause mutual bonding. In addition, the layer will contain cerium atoms that have not grown up into the crystalline ceria particle.

The schematic drawing in FIG. 2, aimed at easy understanding, has illustrated the mother particle 10, the cerium-containing silica layer 12, and the child particles 14 in a clearly discriminable manner. However, the actual second composite particle of this invention, presumably formed according to the aforementioned mechanism, contains these components in an integrated manner, so that it is difficult to clearly discriminate the mother particle 10, the cerium-containing silica layer 12, and the child particles 14 by any method other than contrast analysis on STEM/SEM image or EDS analysis.

Note, however, that the structure illustrated in FIG. 2 may be confirmed by the STEM-EDS analysis for measuring element concentrations of Ce and Si on a cross section of the second composite particle of this invention.

More specifically, the second composite particle of this invention is analyzed by EDS by which an electron beam is selectively irradiated on points specified under a scanning transmission electron microscope (STEM), and the element concentrations of Ce and Si are measured on a cross section of the second composite particle of this invention, at the measurement points X indicated in FIG. 2. Ratio (percentage) of molar concentration of Ce, to the total of molar concentration of Ce and molar concentration of Si ($Ce/(Ce+Si) \times 100$) is found to be smaller than 3%. Meanwhile, from the measurement of element concentrations of Ce and Si at measurement points Z, the ratio (percentage) of molar concentration of Ce, to the total of molar concentration of Ce and molar concentration of Si ($Ce/(Ce+Si) \times 100$) is found to be larger than 50%. Furthermore, from the measurement of element concentrations of Ce and Si at measurement points Y, the ratio (percentage) of molar concentration of Ce, to the total of molar concentration of Ce and molar concentration of Si ($Ce/(Ce+Si) \times 100$) is found to be 3 to 50%.

Hence on an element map obtained by the STEM-EDS analysis, the mother particle 10 and the cerium-containing silica layer 12 in the second composite particle of this invention are discriminable by using a line along which the ratio (percentage) of molar concentration of Ce, to the total of molar concentration of Ce and molar concentration of Si ($Ce/(Ce+Si) \times 100$) has a value of 3%. Meanwhile on an element map obtained by the STEM-EDS analysis, the cerium-containing silica layer 12 and the child particles 14 in the second composite particle of this invention are discriminable by using a line along which the ratio (percentage) of molar concentration of Ce, to the total of molar concentration of Ce and molar concentration of Si ($Ce/(Ce+Si) \times 100$) has a value of 50%.

The STEM-EDS analysis described in this specification is on the premise of observation at 800,000× magnification.

When analyzed by the STEM-EDS analysis and subsequent element mapping on the cross sections, the first composite particle of this invention and the second composite particle of this invention, having the structures illustrated in FIGS. 1 and 2, show at least one layer (composed of ceria particle) having a relatively high ceria concentration, on the way from the outermost shell to the central mother particle (mainly composed of amorphous silica).

<Mother Particle>

The mother particle will be explained below.

As described previously, the mother particle is determined by a moiety where the ratio (percentage) of molar concentration of Ce, to the total of molar concentration of Ce and molar concentration of Si ($Ce/(Ce+Si) \times 100$) is found to be smaller than 3%, when the composite particle of this invention is analyzed by the STEM-EDS analysis, and the element concentrations of Ce and Si are determined on a cross section of the composite particle of this invention as illustrated in FIG. 1 or 2.

Since the composite particle of this invention has the average particle size within the range from 50 to 350 nm, so that the upper limit of the average particle size of the mother particle is inevitably smaller than 350 nm. Now, the average particle size of the mother particle in this patent application is defined to be same as the average particle size of the silica-based particle contained in the silica-based particle dispersion, used in later-described Step 1 of the first manufacturing method of this invention, or in Step 4 of the second manufacturing method of this invention. With the average particle size of the mother particle controlled within the range from 30 to 330 nm, the composite particle of this invention is suitably used.

The dispersion of this invention, which is obtained using the silica-based particle with an average particle size of 30 to 330 nm as a starting material, and when used as an abrasive, is less likely to cause scratches in association with polishing. If the average particle size of the mother particle is smaller than 30 nm, the dispersion of this invention obtained by using such silica-based particle and used as an abrasive tends to fail in achieving a practical level of polishing rate. Also the average particle size of the mother particle exceeding 330 nm tends to fail in achieving a practical level of polishing rate, and also tends to degrade surface accuracy of a target substrate to be polished. The silica-based particle preferably shows monodispersity.

The average particle size of the mother particle is measured as described below.

First, the composite particle is observed by the STEM-EDS analysis at 800,000× magnification, to determine a line along which the ratio (percentage) of molar concentration of Ce, to the total of molar concentration of Ce and molar concentration of Si (Ce/(Ce+Si)×100) is found to be 3%, and thereby the mother particle is specified. Next, on an image obtained by the STEM-EDS analysis, the maximum diameter of the mother particle is assumed as the long axis, and the length thereof is determined to be long diameter (DL). On the other hand, a bisection point is found on the long axis, then two points where a line orthogonal to the long axis at the bisection point crosses the outer edge of the particle are found, and the distance between such two points are determined to be short diameter (DS). A geometric mean value of the long diameter (DL) and the short diameter (DS) is determined to be the particle size of the mother particle.

The particle size is measured for 50 mother particles, and a simple average of the obtained values is determined to be the average particle size.

The mother particle may have any shape without special limitation, which is exemplified by shapes of sphere, charcoal sack, staple fiber, cocoon, tetrahedron (trigonal pyramid), hexahedron, octahedron, plate, irregular shape, porous body, okoshi (Japanese millet-brittle), kompeito (Japanese rock candy), and raspberry (spherical or near-spherical particle with the surface on which projections or granular parts are scattered).

The mother particle is preferably has a spherical shape. The spherical shape means that percentage of abundance of particles with a short diameter (DS)/long diameter (DL) value of 0.8 or smaller is 10% or below. The percentage of abundance of particles is determined by measuring 50 mother particles. The mother particle more preferably has a percentage of abundance of particles with a ratio represented by short diameter/long diameter value of 0.8 or smaller of 5% or smaller, which is more preferably 0%.

The mother particle is mainly composed of amorphous silica, and is usually composed of silica particle. The silica particle is preferably used since it may easily be prepared in the form of sphere with highly uniformity of particle size, and may be prepared into a wide variety of particle sizes.

The majority of amorphous silica in the mother particle may be confirmed typically by the method below. A dispersion containing the mother particle (silica particle), namely a silica particle dispersion, is dried, crushed in a mortar, and analyzed using, for example, a known X-ray diffractometer (RINT1400, from Rigaku Corporation) to obtain an X-ray diffraction pattern. The majority of amorphous silica in the mother particle is confirmed by the absence of a peak assignable to crystalline silica such as cristobalite. Conversely, such case is understood to prove the majority of amorphous silica in the mother particle.

Alternatively, the dispersion of this invention is dried, embedded in a resin, coated with Pt by sputtering, and thinned using a known focused ion beam (FIB) apparatus to prepare a cross-section sample. The thus prepared cross-section sample is observed under a known TEM apparatus and analyzed by fast Fourier transformation (FFT) to obtain a FFT pattern, but only to find absence of diffraction pattern assignable to crystalline silica such as cristobalite. From the result, majority of amorphous silica in the mother particle may be confirmed. Also such case is understood to prove the majority of amorphous silica in the mother particle.

According to still another exemplary method, a cross-sample prepared in the same way is subjected to known TEM analysis to observe presence or absence of lattice fringe attributable to atomic arrangement of the mother particle. Crystalline structure gives observable lattice fringe, meanwhile amorphous structure gives no observable lattice fringe. From the result, majority of amorphous silica in the mother particle may be confirmed. Also such case is understood to prove the majority of amorphous silica in the mother particle.

The mother particle is mainly composed of amorphous silica, but may contain other substances such as crystalline silica and impurity elements.

For example, content ratio of each of elements including Na, Ag, Ca, Cr, Cu, K, Mg, Ti and Zn (occasionally referred to as "specific impurity group 1", hereinafter) in the mother particle is preferably 100 ppm or less, more preferably 50 ppm or less, even more preferably 25 ppm or less, yet more preferably 5 ppm or less, and furthermore preferably 1 ppm or less.

Meanwhile, content ratio of each of elements including U, Th, Cl, $NO_3$, $SO_4$ and F (occasionally referred to as "specific impurity group 2", hereinafter) in the mother particle is preferably 5 ppm or less.

Now, the content ratio of the specific impurity group 1 or the specific impurity group 2 in the mother particle (silica-based particle) and the later-described composite particle of this invention mean the content ratio relative to dry weight of silica.

The content ratio relative to dry weight of silica means mass ratio (percentage) of a target substance to be measured (specific impurity group 1 or specific impurity group 2), relative to mass of $SiO_2$ calculated from the content ratio of Si contained in the target substance to be measured (mother particle (silica-based particle) or the composite particle of this invention). Now the content ratio of Si means a value determined by a method described later in Example, in which the ceria-based composite particle dispersion is subjected to ignition loss test at 1000° C. to determine the solid matter concentration, the residue is further analyzed by ICP (inductively coupled plasma) atomic emission spectrometry to determine content ratio of Ce, which is then converted to content ratio of $CeO_2$, and the balance of the solid content is assumed to be $SiO_2$.

Most silica particle prepared from water glass contains approximately several thousand ppm in total of the specific impurity group 1 and the specific impurity group 2 derived from such water glass.

A silica particle dispersion having such silica particle dispersed in a solvent might be ion-exchanged to reduce the content ratios of the specific impurity group 1 and the specific impurity group 2. But even so, several ppm to several hundred ppm in total of the specific impurity group 1 and the specific impurity group 2 would remain. Hence the silica particle obtained from water glass, when used, is occasionally treated with acid to reduce the impurities.

In contrast, a silica-based particle dispersion, having mother particle (silica-based particle) synthesized from alkoxysilane dispersed in a solvent, usually contains 100 ppm or less of each element in the specific impurity group 1, and 5 ppm or less of each element and each anion in the specific impurity group 2.

Now in this invention, the content ratio of each of Na, Ag, Al, Ca, Cr, Cu, Fe, K, Mg, Ni, Ti, Zn, U, Th, Cl, $NO_3$, $SO_4$ and F in the mother particle (silica particle) is individually determined by the methods below.

Na and K: atomic absorption spectrometry

Ag, Al, Ca, Cr, Cu, Fe, Mg, Ni, Ti, Zn, U and Th: ICP (inductively coupled plasma) atomic emission spectrometry Cl: potentiometric titration $NO_3$, $SO_4$ and F: ion chromatography The mother particle suitably employed here has a moderate reactivity with cerium (mass of dissolution of mother particle per unit mass of ceria). When a metal salt of cerium and a salt of different atom are added to the silica-based particle dispersion in Step 1 of the first manufacturing method of this invention, a part of silica is dissolved by cerium, thereby the mother particle is downsized, and a precursor of the cerium-containing silica layer that contains cerium microcrystal is formed on the surface of the partially dissolved mother particle. Alternatively, when a metal salt of cerium and a salt of different atom are added to the silica-based particle dispersion in Step 4 of the second manufacturing method of this invention, a part of silica is dissolved by cerium, thereby the mother particle is downsized, and a precursor of the cerium-containing silica layer that contains cerium microcrystal is formed on the surface of the partially dissolved mother particle. If the silica were highly reactive with cerium, the precursor of the cerium-containing silica layer would be thick, and this would thicken the cerium-containing silica layer after firing, or would excessively increase ratio of silica in the layer, and this would make the crushing process in Step 2 or Step 5 difficult. On the contrary, if the silica were extremely less reactive with cerium, the cerium-containing silica layer would not be fully formed, making the ceria child particles more likely to fall. Now with an appropriate reactivity with cerium, excessive dissolution of silica is suppressed, the cerium-containing silica layer is thickened to an appropriate degree, the child particle are prevented from falling, and the bonding strength becomes larger than the bonding strength among composite particles, so that the fired product will advantageously be easy to crush.

<Child Particle Contained in First Composite Particle of this Invention>

The child particle contained in the first composite particle of this invention will be explained below.

As described previously, the child particle is determined by a moiety where the ratio (percentage) of molar concentration of Ce, to the total of molar concentration of Ce and molar concentration of Si (Ce/(Ce+Si)×100) is found to exceed 50%, when the first composite particle of this invention is treated with alkali to remove the easily-soluble silica layer, and then analyzed by the STEM-EDS analysis, and the element concentrations of Ce and Si are measured on a cross section of the first composite particle of this invention illustrated in FIG. 1.

The child particles mainly composed of crystalline ceria (referred to as "ceria child particle", hereinafter) in the first composite particle of this invention are dispersed inside the cerium-containing silica layer disposed on the mother particle, and preferably have a particle size distribution represented by a coefficient of variation (CV value) of 10 to 60%. This means that the child particles have a broad particle size distribution. When the first dispersion of this invention, containing the ceria child particle with such large particle size distribution, is used as a polishing abrasive particle dispersion, an early stage of polishing proceeds with the aid of large-sized child particles that are brought into contact with a target substrate to be polished. Even if such child particles should be dislocated under polishing pressure or worn out or fractured, the small-sized child particles then come into contact with the target substrate to be polished, while keeping a large contact area. Polishing can therefore proceed efficiently at stable polishing rate.

In the first composite particle of this invention, the child particles that are distributed inside the cerium-containing silica layer preferably shows a particle size distribution represented by a coefficient of variation (CV value) of 10 to 60%, which is more preferably 14 to 40%, even more preferably 16 to 35%, and yet more preferably 17 to 30%.

As for the first composite particle of this invention, the particle size distribution of the child particles is measured as described below.

First, the composite particle is observed by the STEM-EDS analysis at 800,000× magnification, to determine a line along which the ratio (percentage) of molar concentration of Ce, to the total of molar concentration of Ce and molar concentration of Si (Ce/(Ce+Si)×100) is found to be 50%, and thereby the child particle is specified. Next, the maximum diameter of the child particle is assumed as the long axis, and the length thereof is determined to be long diameter (DL). On the other hand, a bisection point is found on the long axis, then two points where a line orthogonal to the long axis at the bisection point crosses the outer edge of the particle are found, and the distance between such two points are determined to be short diameter (DS). A geometric mean value of the long diameter (DL) and the short diameter (DS) is determined to be the particle size of the child particle.

Measurement of the particle size for 100 or more child particles can yield a particle size distribution and a number average value (average of particle size of 100 or more child particles). In this patent application, such number average value is also referred to as "geometric mean particle size".

As for the first composite particle of this invention, the coefficient of variation (CV value) that represents the particle size distribution of the child particles is calculated by finding a standard deviation and a number average value while assuming the thus obtained particle size distribution to be a population, then by dividing the standard deviation by the number average value, and by multiplying the quotient by 100, [that is, (standard deviation/number average value)× 100].

The child particle preferably has a geometric mean particle size of 10 to 30 nm, which is more preferably 12 to 28 nm.

With the geometric mean particle size of the child particles exceeding 30 nm, the precursor particle having such ceria child particles tends to become less crushable in Step 2 due to sintering or coagulation after firing. Such ceria-based composite particle dispersion, when used for polishing, may disadvantageously cause scratches on a target object to be polished. Meanwhile, the child particles with a geometric mean particle size of smaller than 10 nm, when used again for polishing, may tend to become difficult to achieve a practically sufficient rate of polishing.

The child particle is preferably a single crystal, or may be an aggregate of single crystals (that is, an aggregate having a heterogeneous phase interposed among the ceria crystals).

The single crystallinity may be confirmed on the basis of an overall coincidence between the average crystallite size obtained by X-ray diffractometry and the geometric mean particle size obtained by the STEM-EDS analysis. Also a polycrystal (an aggregate without a heterogeneous phase interposed among the ceria crystals) may partially be contained.

The child particles may also be stacked. That is, a plurality of child particles may fall on a line that extends through the cerium-containing silica layer radially from the center of the mother particle.

The child particles may also be buried in the cerium-containing silica layer or in the easily soluble silica-containing layer, or may partially be exposed out from the cerium-containing silica layer or the easily soluble silica-containing layer. When the child particles are buried in the cerium-containing silica layer or the easily soluble silica-containing layer, the surface of the ceria-based composite particle becomes more similar to the surface of silica, thus improving shelf stability and polishing stability, and reducing residence of the abrasive particle on the surface of substrate after polished. The child particles are therefore preferably buried in the cerium-containing silica layer or the easily soluble silica-containing layer.

The child particles may have any shape without special limitation, which may be spherical, elliptic, or rectangular. For the case where the dispersion of this invention is intended for polishing at high polishing rate, the child particles are preferably aspherical, and more preferably rectangular.

The child particle distributed within the cerium-containing silica layer disposed on the mother particle may form a monolayer, or a plurality of child particles may be stacked (that is, a plurality of child particles are kept stacked in the thickness direction of the cerium-containing silica layer), or a plurality of child particles may be linked.

The child particles distributed within the cerium-containing silica layer disposed on the mother particle may stay in a monodisperse state.

In the first composite particle of this invention, the child particles are mainly composed of crystalline ceria.

Majority of the crystalline ceria in the child particle may be confirmed typically by the method below. The dispersion of this invention is dried, the obtained solid matter is crushed in a mortar, and analyzed using, for example, a known X-ray diffractometer (RINT1400, from Rigaku Corporation) to obtain an X-ray diffraction pattern. The majority of crystalline ceria is confirmed by that only a crystal phase of ceria is detected. Such case is understood to indicate the majority of the crystalline ceria in the child particles. The crystal phase of ceria is typically, but not limited to, cerianite.

The child particles, mainly composed of crystalline ceria (crystalline Ce oxide), may contain other substances, for example, elements other than cerium. Still alternatively, a cerium hydrate may be contained as a promoter for polishing.

Note that, the first composite particle of this invention, analyzed by X-ray diffractometry, only allows detection of crystal phase of ceria as described above. That is, even if any crystal phase other than that of ceria should be contained, the content ratio thereof would be small, or would under the detection limit by X-ray diffractometry, since such crystal phase is solid-solubilized in the ceria crystal.

The average crystallite size of the ceria child particle is determined using the full width at half maximum of a largest peak that appears in a chart obtained after subjecting the first composite particle of this invention to X-ray diffractometry. Average crystallite size observed on the (111) plane is typically 10 to 25 nm (full width at half maximum: 0.86 to 0.34°), preferably 14 to 23 nm (full width at half maximum: 0.61 to 0.37°), and more preferably 15 to 22 nm (full width at half maximum: 0.57 to 0.39°). Although the peak assignable to the (111) plane has a maximum intensity in most cases, a peak assignable to any other crystal plane, such as the (100) plane, may have a maximum intensity. Also in such case, the average crystallite size may be calculated in the same way, in which the thus calculated average crystallite size may be same as the average crystallite size on the (111) plane.

A method for measuring the average crystallite size of the child particles will be explained below, referring to the case on the (111) plane (at around $2\theta=28°$).

First, the first composite particle of this invention is crushed using a mortar, and analyzed using, for example, a known X-ray diffractometer (RINT1400, from Rigaku Corporation) to obtain an X-ray diffraction pattern. Crystallite size may be determined on the basis of the full width at half maximum of a peak assignable to a crystal plane corresponded to each crystal form. For an exemplary case of cerianite, the full width at half maximum of a peak at around $2\theta=28°$ assignable to the (111) plane in the X-ray diffraction pattern is measured, and the average crystallite size may be determined using the Scherrer equation below:

$$D = K\lambda/\beta \cos\theta$$

D: average crystallite size (Å);
K: Scherrer constant (K=0.94 employed in this invention);
$\lambda$: X-ray wavelength (1.5419 Å, Cu lamp);
$\beta$: full width at half maximum (rad); and
$\theta$: angle of reflection.

In the first composite particle of this invention, the crystalline ceria which is a major ingredient of the child particles preferably has silicon atom solid-solubilized therein. Silicon (Si) atom is not always necessarily, but preferably, solid-solubilized.

Solid solubilization usually means that two or more elements (metallic or non-metallic) mutually dissolve to form a solid phase which is uniform overall. Solid solution obtained as a result of solid solubilization is classified into substitutional solid solution and interstitial solid solution. The substitutional solid solution can easily occur between atoms having atomic radii close to each other. Ce and Si, however, largely differ in the atomic radius, and are therefore considered to be unlikely to produce at least the substitutional solid solution. In addition, the crystal structure of cerianite has a coordination number of Ce of 8, when viewed around the Ce center, and shall have a coordination number of Ce of 7, if Ce is replaced with Si in an equimolar manner. However, analytical results of one preferred mode of the first composite particle of this invention showed an average coordination number of Ce of 8.0 when viewed around the Ce center, and an average coordination number of Si of 1.2, and this leads us to estimate that the interstitial solid solution is a preferred mode of the first composite particle of this invention. The analytical results of the preferred mode of the first composite particle of this invention also teach that Ce—Si interatomic distance is smaller than Ce—Ce interatomic distance, and this also leads us to estimate that the interstitial solid solution is a preferred mode of the first composite particle of this invention. That is, cerium atom and silicon atom contained in the child particles preferably satisfy a relation given by $R_1<R_2$, where $R_1$ represents the cerium-silicon interatomic distance, and $R_2$ represents the cerium-cerium interatomic distance.

The ceria particle, when employed as an abrasive particle for polishing a substrate with silica film or a glass substrate, has been known to demonstrate specifically high polishing rate, as compared with the cases where other inorganic oxide particles are employed. One of the reasons for such especially high polishing rate of the ceria particle on the substrate with silica film has been ascribed to high chemical reactivity of the ceria particle against the silica film on the substrate to be polished.

In the child particles (ceria particles) which reside on the outer surface of the first composite particle of this invention in the preferred mode, Si atom is considered to be interstitially solid-solubilized in $CeO_2$ crystal. Solid solubilization of Si atom causes crystal strain of the $CeO_2$ crystal, and this promotes chemical reactivity of $CeO_2$ against the base silica, seemingly demonstrating such high polishing rate.

Note that the aforementioned interatomic distances regarding cerium atom and silicon atom, represented by $R_1$, $R_2$, are defined to be average interatomic distances measured by the methods described later in Examples.

<Child Particle Contained in Second Composite Particle of this Invention>

The child particle contained in the second composite particle of this invention will be explained below.

As described previously, the child particle is determined by a moiety where the ratio (percentage) of molar concentration of Ce, to the total of molar concentration of Ce and molar concentration of Si (Ce/(Ce+Si)×100) is found to exceed 50%, when the second composite particle is analyzed by the STEM-EDS analysis, and the element concentrations of Ce and Si are measured on a cross section of the second composite particle of this invention illustrated in FIG. 2.

The child particles, mainly composed of crystalline ceria (also referred to as "ceria child particle", hereinafter) in the second composite particle of this invention, are distributed in cerium-containing silica layer disposed on the mother particle, and the child particles contain the crystalline ceria as a major ingredient. The child particles have Si which is solid-solubilized in the crystalline ceria, and additionally have one or more kinds of different atom solid-solubilized therein.

Majority of the crystalline ceria in the child particle may be confirmed typically by the method below. The second dispersion of this invention is dried and then crushed in a mortar, and analyzed using, for example, a known X-ray diffractometer (RINT1400, from Rigaku Corporation) to obtain an X-ray diffraction pattern. The majority of crystalline ceria is confirmed by that (i) only a crystal phase of ceria is detected, or that (ii) only a crystal phase of ceria and crystal phase(s) of oxide(s) of the different atom(s) are detected. The crystal phase of ceria is typically exemplified by cerianite.

Conversely, such cases (i) and (ii) are understood to prove the majority of crystalline ceria in the child particles.

Now the different atom means inorganic elements that can be solid-solubilized in the crystalline ceria, but excluding silicon atom.

The different atom will suffice if it is entirely or partially solid-solubilized, while allowing another portion to grow in the ceria crystal to form an oxide crystal, rather than being solid-solubilized therein.

The different atom is specifically exemplified by Al, Fe, Co, Ni, Mn, Zr, and lanthanide.

The child particles in the second composite particle of this invention have Si and the different atom solid-solubilized in the ceria crystal, and therefore cause strain of ceria crystal due to difference of atomic radii, or oxygen defect in the crystal due to difference of valence. Since trivalent cerium produced now is chemically active (highly reactive) against silica, so that the second composite particle of this invention, when used as an abrasive for polishing a substrate with a silica-based film formed thereon or a glass substrate, can demonstrate higher polishing rate.

The second composite particle of this invention essentially has Si solid-solubilized in the crystalline ceria in the child particles, and uniquely has the different atom solid-solubilized therein. Si, having an atomic radius considerably smaller than that of Ce, can introduce large strain in the ceria crystal, but only a small amount thereof can be solid-solubilized into the crystalline ceria. Then the different atoms employable to be solid solubilized include elements such as La, having small atomic radii but capable of introducing oxygen defect owing to their trivalency; elements such as Zr, having the same valence with Ce, but largely different atomic radii and can therefore be solid-solubilized much in the cerium crystal; and elements such as Al and Fe, having atomic radii largely different from that of Ce, and capable introducing oxygen defect owing to their trivalency. The present inventors consider that such employment can introduce larger crystal strain or larger number of oxygen defects due to difference of valence, and can produce much trivalent cerium which is chemically active against $SiO_2$, so that the second composite particle of this invention, when used as an abrasive for polishing a substrate with a silica-based film formed thereon or a glass substrate, can demonstrate higher polishing rate.

The present inventors further consider that introduction of such different element can demonstrate an effect of increasing hardness of the cerium-containing silica layer as compared with the case free of the different element since the crushing time tends to become longer. This presumably adds a mechanical polishing effect (frictional effect) during polishing, and increases the polishing rate. Also employment of the fired product in the polishing might increase the polishing rate owing to the effect of increased hardness, but coarse sintered product (coarse particle) produced by firing, and is not crushed, would cause considerable amount of scratches. Meanwhile, with firing within an appropriate temperature range so as to control the average crystallite size of ceria to 25 nm or smaller, only an effect of increasing the hardness is obtainable while suppressing production of such hard-to-crush coarse sintered product. Thus the polishing rate will increase, meanwhile the scratches will be less likely to occur.

The child particles contains crystalline ceria (crystalline Ce oxide), as well as silicon atom and the different atom, and may still also contain other substances.

Note that, the second composite particle of this invention, analyzed by X-ray diffractometry, only allows detection of crystal phase of ceria, and crystal phase of oxide of the different atom as described above. That is, even if any crystal phase other than that of ceria and the different atom should be contained, the content would be small, or would fall under the detection limit of X-ray diffractometry.

The average crystallite size of the crystalline ceria contained in the child particles is determined using the full width at half maximum of a largest peak that appears in a chart obtained after subjecting the second composite particle of this invention to X-ray diffractometry. Average crystallite size observed on the (111) plane is typically 10 to 25 nm (full width at half maximum: 0.86 to 0.34°), preferably 14 to 23 nm (full width at half maximum: 0.61 to 0.37°), and more preferably 15 to 22 nm (full width at half maximum: 0.57 to 0.39°). Also the crystallite size on the crystal planes other than the (111) plane, such as on the (100) plane, may be calculated in the same way, in which the thus calculated average crystallite size may be same as the average crystallite size on the (111) plane. Although the peak assignable to the (111) plane has a maximum intensity in most cases, a peak assignable to any other crystal plane, such as the (100) plane, may have a maximum intensity.

A method for measuring the average crystallite size of crystalline ceria contained in the child particles will be explained below, referring to the case on the (111) plane (at around 2θ=28°).

First, the second composite particle of this invention is crushed using a mortar, and analyzed using, for example, a known X-ray diffractometer (RINT1400, from Rigaku Corporation) to obtain an X-ray diffraction pattern. Crystallite size may be determined on the basis of the full width at half maximum of a peak assignable to a crystal plane corresponded to each crystal form. For an exemplary case of cerianite, the full width at half maximum of a peak at around 2θ=28° assignable to the (111) plane in the X-ray diffraction pattern is measured, and the average crystallite size may be determined using the Scherrer equation below:

$$D = K\lambda/\beta \cos\theta$$

D: average crystallite size (Å);
K: Scherrer constant (K=0.94 employed in this invention);
λ: X-ray wavelength (1.5419 Å, Cu lamp);
β: full width at half maximum (rad); and
θ: angle of reflection.

The second composite particle of this invention is unique in that silicon atom is solid-solubilized in the crystalline ceria which is the major ingredient of the child particles. Solid solubilization usually means that two or more elements (metallic or non-metallic) mutually dissolve to form a solid phase which is uniform overall. Solid solution obtained as a result of solid solubilization is classified into substitutional solid solution and interstitial solid solution. The substitutional solid solution can easily occur between atoms having atomic radii close to each other. Ce and Si, however, largely differ in the atomic radius, and are therefore considered to be unlikely to produce at least the substitutional solid solution. In contrast, La and Ce have the atomic radii close to each other, and are considered to be easy to produce the substitutional solid solution. The crystal structure of cerianite, which can be contained in the second composite particle of this invention, has a coordination number of Ce of 8, when viewed around the Ce center, and shall have a coordination number of Ce of 7, if Ce is replaced with Si in an equimolar manner. However, analytical results of one preferred mode of the second composite particle of this invention occasionally showed an average coordination number of Ce of 7.6 when viewed around the Ce center, and an average coordination number of La of 0.4. It was occasionally shown that the adjoining Ce—Ce interatomic distance was 3.8 Å, whereas the adjoining Ce—La interatomic distance was 3.8 Å. From the results, the La is considered to be solid-solubilized in the ceria crystal in a substitutional manner. Meanwhile, the average coordination number of Si was occasionally found to be 1.2, and the adjoining Ce—Si interatomic distance was found to be 3.1 Å. From the results, Si is considered to be interstitially solid-solubilized. That is, cerium atom and silicon atom contained in the child particles preferably satisfy a relation given by $R_1 < R_2$, where $R_1$ represents the interatomic distance between adjoining cerium and silicon atoms, and $R_2$ represents the interatomic distance between adjoining cerium atoms. The second composite particle preferably contains the different element solid-solubilized therein.

The ceria particle, when employed as an abrasive particle for polishing a substrate with silica film or a glass substrate, has been known to demonstrate specifically high polishing rate, as compared with the cases where other inorganic oxide particles are employed. One of the reasons for such especially high polishing rate of the ceria particle on the substrate with silica film has been ascribed to high chemical reactivity of the ceria particle against the silica film on the substrate to be polished.

In the child particles (ceria particles) which reside on the outer surface of the second composite particle of this invention, Si atom is considered to be interstitially solid-solubilized in $CeO_2$ crystal. Solid solubilization of Si atom causes crystal strain of the $CeO_2$ crystal, and this promotes chemical reactivity of $CeO_2$, seemingly demonstrating such high polishing rate. This action is presumed to be promoted by solid solubilization of the additional different element. Mode of solid solubilization of the different element depends on the species. For example, the different atoms such as Zr and La, having the atomic radii close to that of Ce are considered to be solid-solubilized in a substitutional manner, meanwhile the different atoms such as Fe, Al, Co, Ni and Mn, having the atomic radii largely different from that of Ce are considered to be interstitially solid-solubilized.

Note that the aforementioned interatomic distances regarding cerium atom, silicon atom and oxygen atom, represented by $R_1$, $R_2$ and so forth, are defined to be average interatomic distances measured by the methods described later in Examples.

The child particle preferably has a geometric mean particle size of 10 to 30 nm, which is more preferably 12 to 28 nm.

The geometric mean particle size of the child particles in the second composite particle of this invention is measured as described below.

First, the composite particle is observed by the STEM-EDS analysis at 800,000× magnification, to determine a line along which the ratio (percentage) of molar concentration of Ce, to the total of molar concentration of Ce and molar concentration of Si (Ce/(Ce+Si)×100) is found to be 50%, and thereby the child particle is specified. Next, on an image obtained by the STEM-EDS analysis, the maximum diameter of the child particle is assumed as the long axis, and the length thereof is determined to be long diameter (DL). On the other hand, a bisection point is found on the long axis, then two points where a line orthogonal to the long axis at the bisection point crosses the outer edge of the particle are found, and the distance between such two points are determined to be short diameter (DS). A geometric mean value of the long diameter (DL) and the short diameter (DS) is determined to be the particle size of the child particle.

The particle size is measured for 100 or more child particles, and a simple average of the obtained values is determined to be the average particle size.

The ceria child particle is preferably a single crystal, or may be an aggregate of single crystals (that is, an aggregate having a heterogeneous phase interposed among the ceria crystals). This is because the single-crystalline aggregate is crushed in the crushing process so as to be fractured at the different phase while less damaging the crystal, unlike polycrystal that causes fracture at the crystal grain boundary while damaging the crystal. The crystal free of damage, when used for polishing, is less likely to slow down the polishing rate.

The single crystallinity may be confirmed on the basis of an overall coincidence between the average crystallite size obtained by X-ray diffractometry and the geometric mean particle size obtained by the STEM-EDS analysis. Also a polycrystal (an aggregate without a heterogeneous phase interposed among the ceria crystals) may partially be contained.

With the geometric mean particle size of the child particles exceeding 30 nm, the precursor particle having such ceria child particles tends to become less crushable in Step 2 due to sintering or coagulation after firing. Such ceria-based composite particle dispersion, when used for polishing, may disadvantageously cause scratches on a target object to be polished. Meanwhile, the child particles with a geometric mean particle size of smaller than 10 nm, when used again for polishing, may tend to become difficult to achieve a practically sufficient rate of polishing.

The child particles may also be stacked. That is, a plurality of child particles may fall on a line that extends through the cerium-containing silica layer radially from the center of the mother particle.

The child particles may also be buried in the cerium-containing silica layer, or may partially be exposed out from the cerium-containing silica layer. This is because the cerium-containing silica layer that covers the buried child particles can easily separate, fall or dissolve during polishing without interfering contact between ceria and a substrate, making it possible to demonstrate high polishing rate. The child particles buried in the cerium-containing silica layer will not separate or fall during storage, and the surface of the ceria-based composite particle will be more similar to silica, thus improving shelf stability and polishing stability, and reducing residence of the abrasive particle on the surface of substrate after polished. The child particles are therefore preferably buried in the cerium-containing silica layer.

The child particles may have any shape without special limitation, which may be spherical, elliptic, or rectangular. For the case where the dispersion of this invention is intended for polishing at high polishing rate, the child particles are preferably aspherical, and more preferably rectangular.

The child particles distributed in the cerium-containing silica layer disposed on the surface of the mother particle may stay in a monodisperse state, or may be stacked, or a plurality of child particles may be linked.

<Cerium-Containing Silica Layer Contained in First Composite Particle of this Invention>

The first composite particle of this invention has the cerium-containing silica layer on the surface of the mother particle. The child particles are distributed in the cerium-containing silica layer.

With such structure, the child particles are less likely to fall under pressure exerted during crushing in the manufacturing process or during polishing. Even if a part of the child particles should fall, most of the child particles remain immobilized in the cerium-containing silica layer, successfully preventing the polishing rate from decreasing.

As described previously, the cerium-containing silica layer is determined by a moiety where the ratio (percentage) of molar concentration of Ce, to the total of molar concentration of Ce and molar concentration of Si (Ce/(Ce+Si)× 100) falls within the range from 3 to 50%, when the first composite particle of this invention is treated with an alkali to remove the easily-soluble silica layer, and then analyzed by the STEM-EDS analysis, and the element concentrations of Ce and Si are measured on a cross section of the first composite particle of this invention illustrated in FIG. 1.

In an image (TEM image) of the first composite particle of this invention, obtained by observation under a transmission electron microscope, the child particles look dark on the surface of the mother particle, meanwhile a part of the cerium-containing silica layer on the circumference and the outside of the child particles, that is, the surface of the first composite particle of this invention, appears relatively bright. This part, when measured regarding molar concentrations of Si and Ce by the STEM-EDS analysis can be confirmed to have very high molar concentration of Si. More specifically, the ratio (percentage) of molar concentration of Ce, to the total of molar concentration of Ce and molar concentration of Si (Ce/(Ce+Si)×100) falls within the range from 3 to 50%.

The cerium-containing silica layer preferably has an average thickness of 10 to 40 nm, which is more preferably 12 to 30 nm.

Now the average thickness of the cerium-containing silica layer is determined by treating the first composite particle of this invention with an alkali to remove the easily-soluble silica layer, drawing lines at freely selected 12 positions from the center of the mother particle towards the outermost shell, conducting the STEM-EDS analysis to obtain an element map as described above, determining on the element map lines along which the ratio (percentage) of molar concentration of Ce, to the total of molar concentration of Ce and molar concentration of Si (Ce/(Ce+Si)×100) is found to be 3%, measuring distances from this line to the outermost shell of the first composite particle of this invention (distances measured on the lines that pass through the center of the mother particle), and by finding a simple average of the distances. Note that the center of the mother particle is given by an intersection point of the aforementioned long axis and the short axis.

The cerium-containing silica layer in the first composite particle of this invention is considered to promote bonding force between the child particles (ceria particles mainly composed of crystalline ceria) that are distributed and grown in the cerium-containing silica layer during the firing process, and the mother particle (silica-based particle). The ceria-based composite particle dispersion may be obtained, for example in the step of obtaining the first dispersion of this invention, by subjecting the crushed fired product dispersion obtained after firing to preliminary dry crushing as necessary, followed by wet crushing, and further followed by centrifugation. Now the cerium-containing silica layer is considered to exhibit an effect of preventing falling of the child particles from the mother particle. Local falling of the child particles is now acceptable, so that there is no need of covering the entire surface of the child particles with a part of the cerium-containing silica layer. The cerium-containing silica layer will suffice if it is rigid enough to avoid loosening of the child particles on the mother particle.

<Easily Soluble Silica-Containing Layer Contained in First Composite Particle of this Invention>

The easily soluble silica-containing layer in the first composite particle of this invention may be formed as the outermost layer of the composite particle, typically by adding an additive containing silica (for example, acidic silicic acid solution) during the process of obtaining the crushed fired product dispersion or after centrifugation, followed by heating at 10 to 98° C. for ripening, in the first manufacturing method of this invention.

The additive containing silica will suffice if it contains 10 mass % or more silica, and may contain other ingredient such as Ce, La, Zr, Al or the like.

In another exemplary method for forming the easily soluble silica-containing layer, crushing in Step 2 of the first manufacturing method of this invention may be conducted while keeping pH of the fired product dispersion within the range from 8.6 to 11.5, by which a part of the rigid cerium-containing silica layer obtained after firing dissolves to create an equilibrium between dissolution and deposition during crushing, making it possible to form the easily soluble silica-containing layer with softness and large solubility.

The amount of silica that composes the easily soluble silica-containing layer is determined as described below. The first composite particle of this invention is diluted with deionized water to 3.0 mass %, pH is adjusted to 9.0 with diluted aqueous sodium hydroxide solution or nitric acid, and the mixture is stirred for 15 minutes. The mixture is then placed in a centrifugal tube with ultrafiltration membrane, and centrifuged at 1820 G for 30 minutes. After centrifugation, the liquid separated through the ultrafiltration membrane is collected and then measured regarding $SiO_2$ concentration. Letting the mass of ceria-based composite particle be $D_2$, and letting the mass of dissolved silica be $D_1$, then the first composite particle of this invention having the easily-soluble silica layer gives a ratio D of $D_1$ to $D_2$ ($D=D_1/D_2\times100$) of 0.08 to 30%.

The thus formed easily soluble silica-containing layer is a soft silica layer with low density. Since the layer is also very thin and therefore hardly modifies the average particle size of abrasive particle, so that the particle size distribution is considered to be kept unchanged. Hence, seemingly there is no effect of chemically polishing the substrate, or no effect of increasing depth of indentation of the abrasive particle into the substrate.

However, the easily soluble silica-containing layer, being a low-density and soft silica-containing layer, has an effect of increasing contact area between the composite particle and the substrate, and being a soft film, has an effect of enhancing adhesive force (agglutination action) between the substrate and the adhesive particle, or an effect of suppressing rolling of the adhesive particle. As a consequence, frictional force between the substrate and the composite particle increases, and this seemingly increases the polishing rate. The softness of the easily soluble silica-containing layer formed on the surface of the abrasive particle also relieves the substrate of concentrated stress, and suppresses scratching. Hence, the dispersion of this invention, when used as an abrasive, is considered to achieve high polishing rate, less degradation of surface accuracy, and less scratching.

The easily soluble silica-containing layer may alternatively cover the particle entirely, or may leave a part of the particle uncovered, while allowing the ceria child particle or the cerium-containing silica layer to expose. This is because the agglutinating effect between the substrate and the particle may be demonstrated, and the polishing rate may be increased, by controlling the ratio D of the mass of easily soluble silica-containing layer $D_1$ to the mass of ceria-based composite particle $D_2$ within the range from 0.08 to 30 mass %.

The easily soluble silica-containing layer can act to enhance cohesion of the ceria child particles, and has negative potential on its surface, and is therefore considered to improve stability of the ceria-based composite particle dispersion. In addition, the easily soluble silica-containing layer is considered to exfoliate easily under pressure during polishing, and to adhere onto the positively-charged surface of the ceria child particles having fallen during polishing, to thereby cover ceria. Hence, the fallen ceria will have negative potential, and can act to suppress the abrasive particle residue from residing on the substrate. The fallen ceria child particles can also suppress agglutination of the composite particle, demonstrating an effect of reducing change of particle size distribution between the states before and after polishing, and of stabilizing the polishing performance.

The easily soluble silica-containing layer is a silica-containing film with a $SiO_2$ concentration exceeding 10%, and may contain any other ingredient such as Ce, La, Zr or Al. The $SiO_2$ concentration exceeding 10% will be sufficient to obtain the aforementioned effects.

The first composite particle of this invention, having at least a part of the surface of the child particles covered with the cerium-containing silica layer and the easily soluble silica-containing layer, naturally has —OH groups of silica on its outermost surface (outermost shell). Hence, when used as an abrasive, the first composite particle of this invention is repelled by electric charge of —OH group on the surface of the substrate to be polished, and is thus considered to become less likely to adhere to the surface of the substrate to be polished.

Ceria usually has potential different from those of silica, substrate to be polished or polishing pad, and reduces its negative zeta potential when the pH changes from alkali towards neutral or around, and turns to have positive potential in a weak acidic region. Hence, at acidic pH during polishing, ceria tends to adhere onto the base to be polished or the polishing pad, due to difference of potential level or difference of polarity, and thus tends to remain on the base to be polished or polishing pad. In contrast, the first composite particle of this invention has silica on its outermost shell, and has negative charge attributable to such silica, so that the first composite particle can keep the negative potential over a pH range from alkaline to acidic, and thereby the abrasive particle becomes less likely to remain on the base to be polished or the polishing pad. When the fired product is crushed in Step 2 of the first manufacturing method of this invention while keeping the pH above 9, a part of silica (silica in the cerium-containing silica layer) on the surface of the composite particle can dissolve. When the first dispersion of this invention, manufactured under such conditions, is applied to polishing while adjusting the pH below 7, the thus dissolved silica can deposit on the first composite particle of this invention (abrasive particle) and can form the easily soluble silica-containing layer, thereby the surface of the first composite particle of this invention will have negative potential. If the potential is low, a silica-containing additive may be added so as to moderately reinforce the easily soluble silica-containing layer.

An organic polymer such as polyacrylic acid might be applicable to control the potential of the child particles, whereas this invention employs silica that softly adhered on the surface to control the potential, advantageously reducing the amount of consumption of organic substances, and making it less likely to cause defects derived from the organic substances (residence of organic substances, etc.) on the base.

Modes of existence of silica in the first dispersion of this invention have a wide variety. In some cases, the silica may be partially dispersed or dissolved into solvent rather than composing the first composite particle of this invention, or may adhere on the surface of the first composite particle of this invention.

<Cerium-Containing Silica Layer Contained in Second Composite Particle of this Invention>

The second composite particle of this invention has the cerium-containing silica layer on the surface of the mother particle. The child particles are dispersed in the cerium-containing silica layer.

With such structure, the child particles are less likely to fall under pressure exerted during crushing in the manufacturing process or during polishing. Even if a part of the child particles should fall, most of the child particles remain unloosened in the cerium-containing silica layer, successfully preventing the polishing rate from decreasing.

The cerium-containing silica layer may contain Al, Fe, Co, Ni, Mn, Zr, lanthanide and so forth introduced as the different element.

As described previously, the cerium-containing silica layer is determined by a moiety where the ratio (percentage) of molar concentration of Ce, to the total of molar concentration of Ce and molar concentration of Si (Ce/(Ce+Si)×100) falls within the range from 3 to 50%, when the second composite particle of this invention is analyzed by the STEM-EDS analysis, and the element concentrations of Ce and Si are measured on a cross section of the second composite particle of this invention illustrated in FIG. 2.

In an image (TEM image) of the second composite particle of this invention, obtained by observation under a transmission electron microscope, the child particles look dark on the surface of the mother particle, and a part of the cerium-containing silica layer on the circumference and the outside of the child particles, that is, the surface of the second composite particle of this invention, appears relatively bright. This part, when measured regarding molar concentrations of Si and Ce by the STEM-EDS analysis can be confirmed to have very high molar concentration of Si. More specifically, the ratio (percentage) of molar concentration of Ce, to the total of molar concentration of Ce and molar concentration of Si (Ce/(Ce+Si)×100) falls within the range from 3 to 50%.

The cerium-containing silica layer preferably has an average thickness of 10 to 40 nm, which is more preferably 12 to 30 nm.

Now the average thickness of the cerium-containing silica layer is determined by drawing lines at freely selected 12 positions from the center of the mother particle towards the outermost shell, conducting the STEM-EDS analysis to obtain an element map as described above, determining on the element map lines along which the ratio (percentage) of molar concentration of Ce, to the total of molar concentration of Ce and molar concentration of Si (Ce/(Ce+Si)×100) is found to be 3%, measuring distances from this line to the outermost shell of the second composite particle of this invention (distances measured on the lines that pass through the center of the mother particle), and by finding a simple average of the distances. Note that the center of the mother particle is given by an intersection point of the aforementioned long axis and the short axis.

The cerium-containing silica layer in the second composite particle of this invention is considered to promote bonding force between the child particles (ceria particles mainly composed of crystalline ceria) that are distributed and grown in the cerium-containing silica layer during the firing process, and the mother particle (silica-based particle). The ceria-based composite particle dispersion may be obtained, for example in the step of obtaining the second dispersion of this invention, by subjecting the crushed fired product dispersion obtained after firing to preliminary dry crushing as necessary, followed by wet crushing, and further followed by centrifugation. Now the cerium-containing silica layer is considered to exhibit an effect of preventing falling of the child particles from the mother particle. Local falling of the child particles is now acceptable, so that there is no need of covering the entire surface of the child particles with a part of the cerium-containing silica layer. The cerium-containing silica layer will suffice if it is rigid enough to avoid loosening of the child particles on the mother particle.

The cerium-containing silica layer, having the different element remained therein, may have increased hardness, but may be suppressed from causing hard-to-crush coarse particles if the firing temperature is selected to limit the crystallite size of ceria to 10 to 25 nm or below, while achieving a sufficient effect of improving the hardness.

With such structure, the second dispersion of this invention, when used as an abrasive, is considered to give high polishing rate, less degradation of surface accuracy, and less scratches.

The second composite particle of this invention, having at least a part of the surface of the child particles covered with the cerium-containing silica layer, naturally has —OH groups of silica on its outermost surface (outermost shell). Hence, when used as an abrasive, the second composite particle of this invention is repelled by electric charge of —OH group on the surface of the substrate to be polished, and is thus considered to become less likely to adhere to the surface of the substrate to be polished.

Ceria usually has potential different from those of silica, substrate to be polished or polishing pad, and reduces its negative zeta potential when the pH changes from alkali towards neutral or around, and turns to have positive potential in a weak acidic region. Hence, at acidic pH during polishing, ceria tends to adhere onto the base to be polished or the polishing pad, due to difference of potential level or difference of polarity, and thus tends to remain on the base to be polished or polishing pad. In contrast, the second composite particle of this invention has silica on its outermost shell, and has negative charge attributable to such silica, so that the second composite particle can keep the negative potential over a pH range from alkaline to acidic, and thereby the abrasive particle becomes less likely to remain on the base to be polished or the polishing pad. When the fired product is crushed in Step 5 of the second manufacturing method of this invention while keeping the pH above 9, a part of silica (silica in the cerium-containing silica layer) on the surface of the composite particle can dissolve. When the second dispersion of this invention, manufactured under such conditions, is applied to polishing while adjusting the pH below 7, the thus dissolved silica can deposit on the second composite particle of this invention (abrasive particle), thereby the surface of the second composite particle of this invention will have negative potential. If the potential is low, silicic acid for example may be added so as to moderately reinforce the cerium-containing silica layer.

An organic polymer such as polyacrylic acid might be applicable to control the potential of the child particles, whereas this invention employs silica that softly adhered on the surface to control the potential, advantageously reducing the amount of consumption of organic substances, and making it less likely to cause defects derived from the organic substances (residence of organic substances, etc.) on the base.

Modes of existence of silica in the second dispersion of this invention have a wide variety. In some cases, the silica may be partially dispersed or dissolved into solvent rather than composing the second composite particle of this invention, or may adhere of the surface of the second composite particle of this invention.

<First Composite Particle of this Invention>

The first composite particle of this invention will be explained below.

In the first composite particle of this invention, the ceria-based composite particle has, as described above, the mother particle, the cerium-containing silica layer on the mother particle, the child particle dispersed inside the cerium-containing silica layer, and the easily soluble silica-containing layer as the outermost layer. The mother particle contains amorphous silica as a major ingredient, and the child particle contains crystalline ceria as a major ingredient, and the ratio D of mass $D_1$ of the easily soluble silica-containing layer to mass $D_2$ of the ceria-based composite particle ($D=D_1/D_2 \times 100$) is 0.08 to 30%. The ceria-based composite particle, when analyzed by X-ray diffractometry, shows only a crystal phase of ceria, and has an average crystallite size of the crystalline ceria, when analyzed by X-ray diffractometry, of 10 to 25 nm The first composite particle of this invention is the ceria-based composite particle that has an average particle size of 50 to 350 nm, and is further unique in that the ceria-based composite particle has a mass ratio of silica and ceria of 100:11 to 316.

In the first composite particle of this invention, the mass ratio of silica ($SiO_2$) and ceria ($CeO_2$) is 100:11 to 316, preferably 100:30 to 230, more preferably 100:30 to 150, and even more preferably 100:60 to 120. The mass ratio of silica and ceria is considered to be almost equivalent to the mass ratio of mother particle and child particle. Too small amount of the child particle relative to the mother particle may result in bonding among the mother particles to produce coarse particles. In such case, the abrasive (polishing slurry) containing the first dispersion of this invention may cause defects (increased scratches and degraded surface accuracy) on the surface of the base to be polished. On the contrary, too excessive amount of ceria over silica not only increases the cost but also increases resource risk. In addition, the particles become more likely to fuse with each other. This consequently increases surface roughness of the substrate (worsening of surface roughness Ra), increases scratches, and makes the freed ceria more likely to reside on the substrate, or to adhere for example onto a drain pipe of a polishing apparatus.

Note that silica, for which the mass ratio of silica ($SiO_2$) and ceria ($CeO_2$) is calculated, means the whole silica ($SiO_2$) contained in the first composite particle of this invention. Hence, silica means the total of silica component composing the mother particle, silica component contained in the cerium-containing silica layer disposed on the mother particle, and silica component possibly contained in the child particle.

Content rations (mass %) of silica ($SiO_2$) and ceria ($CeO_2$) in the first composite particle of this invention are determined first by precisely weighing the solid matter concentration of the first dispersion of this invention by the ignition loss test at 1000° C.

Then the content ratio (mass %) of cerium (Ce) contained in a predetermined amount of the first composite particle of this invention is determined by ICP atomic emission spectrometry, and converted to the mass percentage of oxide (mass % of $CeO_2$, etc.). For the first composite particle of this invention having a primer layer, also the content ratio (mass %) of an ingredient that composes the primer layer is determined in the same way by ICP atomic emission spectrometry, and is then converted to the mass percentage of oxide (mass % of $CeO_2$, etc.). The mass percentage of $SiO_2$ can be calculated while assuming the ingredient, other than $CeO_2$ composing the first composite particle of this invention and the ingredient of the primer layer, to be $SiO_2$.

Note that, in the first manufacturing method of this invention, the mass ratios of silica and ceria may alternatively be calculated from the amounts of consumption of a silica source material and a ceria source material that were input when preparing the first dispersion of this invention. This is applicable to a process by which none of ceria and silica are removed by dissolution. Such case will give good coincidence between the amounts of consumption and analytical values of ceria and silica.

The first composite particle of this invention has the cerium-containing silica layer formed on, and tightly bound to, the surface of the silica-based particle (mother particle), and has granular crystalline ceria (child particles) dispersed in such cerium-containing silica layer, thus having an irregular surface profile.

The particles composing the first composite particle of this invention may be of "particle-linked type" or "monodisperse type".

The particle-linked type is preferred for the case in need of high polishing rate, since this type can keep large contact area with the substrate and can rapidly polish it. The particle-linked type means two or more mother particles mutually linked at local points thereof, and the number of linked particles is preferably three or less. The mother particles are considered to form the tight bonding in which at least one (preferably both) of mother particles fuses at the contact point, or has a historical solidification mediated by ceria. The particle-linked type is now understood to include not only the case where the mother particles are mutually bound, and the cerium-containing silica layer is then formed thereon, but also the case where the cerium-containing silica layer is formed on the mother particle, and the resultant particle is bound to such other particle.

The particle-linked type can keep large contact area with the substrate, and can efficiently transfer polishing energy to the substrate. Thus the polishing rate becomes high.

<Second Composite Particle of this Invention>

The second composite particle of this invention will be explained below.

The second composite particle of this invention has the mother particle, the child particle, and the ceria-containing silica layer.

In the second composite particle of this invention, the individual ingredients satisfy a relation given by $(Ce+M)/Si=0.038$ to 1.11, where M means a total mole number of one or more different atoms, and Ce and Si mean mole numbers of cerium atom and silicon atom, respectively;

(Ce+M)/Si has a value of 0.038 to 1.11, which is preferably 0.0388 to 1.0475, more preferably 0.0873 to 0.8147, and even more preferably 0.2328 to 0.6484.

The value of (Ce+M)/Si is considered to be almost equivalent to the molar ratio of atoms composing the mother particle and the child particle (ratio represented by mole number of child particle/mole number of mother particle).

Too small amount of the child particle relative to the mother particle may result in bonding among the mother particles to produce coarse particles. In such case, the abrasive (polishing slurry) containing the second dispersion of this invention may cause defects (degraded surface accuracy such as increased scratches) on the surface of the base to be polished. On the contrary, too excessive amount of ceria and the different atom, over silica, not only increases the cost but also increases resource risk. In addition, the particles become more likely to fuse with each other. This consequently increases surface roughness of the substrate (worsening of surface roughness Ra), increases scratches, and makes the freed ceria more likely to reside on the substrate, or to adhere for example onto a drain pipe of a polishing apparatus.

Now the silicon, for which the individual contents (mole quantities) of silica in the second composite particle of this invention are calculated, is applicable to at least one of (I), (II), and (III), below:

(I) silicon component composing the mother particle;
(II) silicon component contained in the cerium-containing silica layer that covers the composite particle having the mother particle and the child particle (ceria component) bound thereon; and
(III) silicon component solid-solubilized in ceria crystal.

The second composite particle of this invention preferably has the content of different atom, in terms of oxide, within the range from 0.01 ppm to 20 mass %. This is because the different atom will no longer be solid-solubilized in the ceria crystal if the content thereof, in terms of oxide, were larger than 20 mass %, and will be more likely to form oxide of the different atom. On the contrary, with the content of different atom below 0.01 ppm, the amount of solid-solubilization is too small to create the oxygen defect, making it difficult to improve the polishing rate. The content of different atom, in terms of oxide, in the second composite particle of this invention is preferably 0.01 ppm to 20 mass %, more preferably 0.01 ppm to 15 mass %, and even more preferably 0.01 ppm to 10 mass %.

Paragraphs below will describe methods for measuring mole numbers of silicon (Si), cerium (Ce) and the different atom (M) in the second composite particle of this invention, and content ratios (if there are two or more different atoms, M represents a total mole number and a total content ratio of such two or more different atoms).

First, the solid matter concentration of the second dispersion of this invention is determined by the ignition loss test 1000° C. and precise weighing.

Next, the content ratios (mass %) of cerium (Ce) and one or more different atoms contained in a predetermined amount of the second composite particle of this invention are determined typically by ICP atomic emission spectrometry, and converted to the mass percentage of $CeO_2$ and mass percentage of $MO_X$. The mass percentage of $SiO_2$ can be calculated while assuming the ingredient, other than $CeO_2$ and $MO_X$ composing the second composite particle of this invention, to be $SiO_2$. The content ratios may be calculated using these values in mass % after converted into mole ratios.

Note that, in the second manufacturing method of this invention, (Ce+M)/Si may alternatively be calculated from the amounts of consumption of a silica source material, a ceria source material and the different atoms that were input when preparing the second dispersion of this invention. This is applicable to a process by which none of ceria, silica and different atom are removed after dissolution. Such case will give good coincidence between the amounts of consumption and analytical values of ceria, silica, and different atom.

The second composite particle of this invention may have an irregular surface profile. The child particles are dispersed in the cerium-containing silica layer, in which a part of the child particles may be bonded by sintering with at least either one (preferably both) of the mother particle or the child particle, so as to form tight bonding at the contact point.

The ceria particle, when employed as an abrasive particle for polishing a substrate with silica film or a glass substrate, has been known to demonstrate specifically high polishing rate, as compared with the cases where other inorganic oxide particles are employed. One of the reasons for such especially high polishing rate of the ceria particle on the substrate with silica film has been ascribed to high chemical reactivity of the ceria particle against the silica film on the substrate to be polished.

In the child particles (ceria particles) which reside on the outer surface of the second composite particle of this invention, Si atom is considered to be interstitially solid-solubilized in $CeO_2$ crystal. Meanwhile, the different atom is considered to be solid solubilized in an interstitial or substitutional manner. Solid solubilization of Si atom causes crystal strain of the $CeO_2$ crystal, and this promotes chemical reactivity of $CeO_2$, seemingly demonstrating such high polishing rate. The present inventors found that higher polishing rate can be demonstrated when the crystalline ceria has Si atom interstitially solid-solubilized therein, and additionally has the different atom solid-solubilized therein. The present inventors further found that very high polishing rate can be obtained when the different atom is Al, Fe, Co, Ni, Mn, Zr or lanthanide, and such atom is solid-solubilized into the crystalline ceria in a substitutional manner.

Note that the aforementioned interatomic distances regarding cerium atom and silicon atom, represented by $R_1$, $R_2$ and so forth, are defined to be average interatomic distances measured by the methods described later in Examples.

Although the second composite particle of this invention may have any shape without special limitation, particle-linked type is preferred from a practical viewpoint. The particle-linked type means two or more mother particles mutually linked at local points thereof. The mother particles are considered to be tightly bound with each other, as a result of fusion of at least one (preferably both) of them at the contact point, and preferably as a result of cohesion of both of them. The particle-linked type is now understood to include not only the case where the mother particles are mutually bound, and the child particles are bound on the surface thereof, but also the case where the child particles are bound on the surface of the mother particle, and the resultant particle is bound to such other particle.

The particle-linked type can keep large contact area with the substrate, and can efficiently transfer polishing energy to the substrate. Thus the polishing rate becomes high. Since polishing pressure per particle becomes smaller than that of an independent particle, so that the scratches may be reduced.

<Composite Particle of this Invention>

The composite particle of this invention is preferably of the particle-linked type, in which the number ratio of particle, found in image analysis to have a value of short diameter/long diameter of smaller than 0.7 (preferably 0.67 or smaller), is preferably 45% or larger.

Now the particle, found in image analysis to have a value of short diameter/long diameter of smaller than 0.7, is considered to be of particle-linked type.

The composite particle of this invention may have any shape without special limitation and may be of particle-linked type or of independent particle type (non-linking particle), which is usually a mixture of both types.

Now for an exemplary case where the composite particle dispersion containing the composite particle of this invention (the dispersion of this invention) is intended for polishing in which improvement of the polishing rate is given a high priority, the number ratio of particle, found in image analysis to have a value of short diameter/long diameter of smaller than 0.7 (preferably 0.67 or smaller), is preferably 45% or larger (more preferably 51% or larger).

Meanwhile, in the same case and in which smallness of the surface roughness on the target substrate to be polished, being kept at a low level, is given a high priority, the number ratio of particle, found in image analysis to have a value of short diameter/long diameter of 0.7 or larger (preferably 0.9 or larger), is preferably 40% or larger, which is more preferably 51% or larger.

Note that the particle-linked type particles mean those (particle aggregate) linked by a chemical bond which is strong enough to forbid the particles to re-disperse. Meanwhile, independent particle type particles mean those remain non-aggregated irrespective of their morphology, unlike a plurality of particles linked to each other.

For the case where improvement of the polishing rate on the target substrate to be polished is given a high priority, Mode 1 below is exemplified as a preferred composite particle dispersion of this invention.

[Mode 1] the dispersion of this invention in which the composite particle of this invention is further featured by the number ratio of particles, found in image analysis to have a value of short diameter/long diameter of smaller than 0.7, is 45% or larger.

Meanwhile, for the case where smallness of the surface roughness on the target substrate to be polished, being kept at a low level, is given a high priority, Mode 2 below is exemplified as a preferred composite particle dispersion of this invention.

[Mode 2] the dispersion of this invention in which the composite particle of this invention is further featured by the number ratio of particles, found in image analysis to have a value of short diameter/long diameter of 0.7 or larger, is 40% or larger.

Method for measuring a ratio represented by short diameter/long diameter, based on image analysis, will be explained. The composite particle of this invention is photographed under a transmission electron microscope at 300,000× magnification (or 500,000× magnification) to obtain a photoprojection, on which the maximum diameter of the particle is assumed as the long axis, and the length thereof is determined to be long diameter (DL). On the other hand, a bisection point is found on the long axis, then two points where a line orthogonal to the long axis at the bisection point crosses the outer edge of the particle are found, and the distance between such two points is determined to be short diameter (DS). Using these values, the ratio (DS/DL) is determined. The percentages of abundance (%) of particles with a short diameter/long diameter value of smaller than 0.70, and those with a value of 0.70 or larger, are determined for each of freely selected 50 particles observed in the photoprojection.

In the first composite particle of this invention, the percentage of abundance of particles with a short diameter/long diameter value of smaller than 0.70 (preferably 0.67 or smaller) is preferably 45% or larger, and more preferably 51% or larger. The first composite particle of this invention controlled within these ranges advantageously shows high polishing rate, when used as an abrasive.

The composite particle of this invention, although preferably being of the particle-linked type, may alternatively contain a particle with other morphology, such as spherical particle.

Number of coarse particles of 0.51 µm or larger, possibly contained in the first dispersion of this invention, is preferably 100 million particles/cc or less in terms of dry particle. The number of coarse particles is preferably 100 million particles/cc or less, and more preferably 80 million particles/cc or less. Particles of 0.51 µm or larger cause polishing scratches, and further may worsen the surface roughness of the target substrate to be polished. In most cases with high polishing rate, the polishing might proceed at high rate, but tends to frequently produce polishing scratches and to worsen the surface roughness of the substrate. In contrast, the first composite particle of this invention, if being of the particle-linked type, can achieve high polishing rate, meanwhile can suppress the polishing scratches and can reduce the surface roughness if the number of coarse particles of 0.51 µm or larger is 100 million particles/cc or less.

The number of coarse particles possibly contained in the first dispersion of this invention is measured as described below.

A sample is diluted with pure water down to 0.1 mass %, from which a 5 ml portion of the solution is drawn out, and injected into a known coarse particle counter, to find the number of coarse particles of 0.51 µm or larger. The measurement is repeated three times, a simple average of measurement values is found, and then multiplied by 1000, to determine the number of coarse particles of 0.51 µm or larger.

The composite particle of this invention preferably has a specific surface area of 4 to 100 $m^2/g$, which is more preferably 10 to 70 $m^2/g$.

Now, method for measuring the specific surface area (BET specific surface area) will be explained.

First, a dried sample (0.2 g) is placed in a measurement cell, and degassed under a nitrogen gas flow at 250° C. for 40 minutes, then kept under a flow of mixed gas composed of 30 vol % of nitrogen and 70 vol % of helium at the liquid nitrogen temperature, so as to allow the sample to adsorb nitrogen under equilibrium. Next, the sample, kept under a flow of the aforementioned mixed gas, is gradually heated to room temperature, during which the amount of released nitrogen is detected, and the specific surface area of the sample is determined using a preliminarily prepared analytical curve.

Such method for measuring BET specific surface area (nitrogen adsorption method) may be conducted using a known surface area measuring instrument.

The specific surface area in the context of this invention is defined to mean values obtained by such method, unless otherwise specifically noted.

The composite particle of this invention preferably has an average particle size of 50 to 350 nm, which is more preferably 100 to 300 nm. With the average particle size fallen within the range from 50 to 350 nm, the composite particle of this invention when applied as an abrasive can advantageously increase the polishing rate.

The average particle size of the composite particle of this invention means number average value of average particle size determined by the image analysis.

Method for measuring an average particle size of the composite particle of this invention, based on the image analysis, will be explained. The composite particle of this invention is photographed under a transmission electron microscope at 300,000× magnification (or 500,000× magnification) to obtain a photoprojection, on which the maximum diameter of the particle is assumed as the long axis, and the length thereof is determined to be long diameter (DL). On the other hand, a bisection point is found on the long axis, then two points where a line orthogonal to the long axis at the bisection point crosses the outer edge of the particle are found, and the distance between such two points is determined to be short diameter (DS). Geometric mean of the long diameter (DL) and the short diameter (DS) is determined to be a particle size of the particle.

Such particle size is measured for each of 50 particles, and a number average of the obtained particle sizes is defined to be the average particle size of the composite particle of this invention.

In the composite particle of this invention, content ratio of each element in the specific impurity group 1 is preferably 100 ppm or below, more preferably 50 ppm or below, even more preferably 25 ppm or below, yet more preferably 5 ppm or below, and furthermore preferably 1 ppm or below.

Meanwhile in the composite particle of this invention, content ratio of each element in the specific impurity group 2 is preferably 5 ppm or below. Methods for reducing, in the composite particle of this invention, the content ratios of each element in the specific impurity group 1 and the specific impurity group 2 are same as those described previously.

Note that content ratios, in the composite particle of this invention, of each element in the specific impurity group 1 and in the specific impurity group 2 may be measured using methods same as those by which the specific impurity group 1 and the specific impurity group 2 contained in the mother particle are measured.

<Dispersion of this Invention>

The dispersion of this invention will be explained below.

The dispersion of this invention has the aforementioned composite particle of this invention dispersed in a dispersion solvent.

The dispersion of this invention contains water and/or organic solvent as the dispersion solvent. The dispersion solvent preferably employable are, for example, water such as pure water, ultrapure water and deionized water. The abrasive particle dispersion of this invention can be made more suitable as a polishing slurry, by adding thereto at least one additive for controlling the polishing performances, selected from the group consisting of polishing accelerator, surfactant, pH adjuster and pH buffer.

The dispersion solvent employable in the dispersion of this invention is exemplified by organic solvents including alcohols such as methanol, ethanol, isopropanol, n-butanol and methylisocarbinol; ketones such as acetone, 2-butanone, ethyl amyl ketone, diacetone alcohol, isophorone and cyclohexanone; amides such as N,N-dimethylformamide and N,N-dimethylacetamide; ethers such as diethyl ether, isopropyl ether, tetrahydrofuran, 1,4-dioxane and 3,4-dihydro-2H-pyran; glycol ethers such as 2-methoxyethanol, 2-ethoxyethanol, 2-butoxyethanol and ethylene glycol dimethyl ether; glycol ether acetates such as 2-methoxyethyl acetate, 2-ethoxyethyl acetate and 2-butoxyethyl acetate; esters such as methyl acetate, ethyl acetate, isobutyl acetate, amyl acetate, ethyl lactate and ethylene carbonate; aromatic hydrocarbons such as benzene, toluene and xylene; aliphatic hydrocarbons such as hexane, heptane, isooctane and cyclohexane; halogenated hydrocarbons such as methylene chloride, 1,2-dichloroethane, dichloropropane and chlorobenzene; sulfoxides such as dimethyl sulfoxide; and pyrrolidones such as N-methyl-2-pyrrolidone and N-octyl-2-pyrrolidone. These organic solvents may be used after mixing with water.

Solid content concentration of the dispersion of this invention preferably falls within the range from 0.3 to 50 mass %.

The dispersion of this invention preferably demonstrate, when subjected to the cation colloidal titration, a streaming potential curve indicating a ratio ($\Delta PCD/V$) given by formula (1) below of −110.0 to −15.0, where $\Delta PCD$ denotes amount of change of streaming potential, and V denotes amount of addition of a cation colloidal titrant (V) at a knick:

$$\Delta PCD/V = (I-C)/V \qquad \text{Formula (1)}$$

C: streaming potential (mV) at the knick;
I: streaming potential (mV) at the start point of the streaming potential curve; and
V: amount of addition of the cation colloidal titrant (ml) at the knick.

Now the cation colloidal titration is conducted by dropping a cation colloidal titrant, to 80 g of the dispersion of this invention with the solid matter concentration adjusted to 1 mass %. The cation colloidal titrant used here is a 0.001 N poly(diallydimethylammonium chloride) solution.

The streaming potential curve obtainable by the cation colloidal titration is a graph plotting the amount of addition (ml) of the cation titrant on the X-axis, and plotting the streaming potential (mV) of the dispersion of this invention on the Y-axis.

The knick is a point (inflection point) on the streaming potential curve obtained by the cation colloidal titration, at which the streaming potential abruptly changes. The streaming potential at the inflection point is denoted as C (mV), and the amount of addition of the cation colloidal titrant at the inflection point is denoted as V (ml).

The start point of the streaming potential curve corresponds to the streaming potential of the dispersion of this invention before being titrated, and is more specifically a point at which the amount of addition of the cation colloidal titrant is zero. The streaming potential at the start point is denoted as I (mV).

With a value of $\Delta PCD/V$ within the range from −110.0 to −5.0, the dispersion of this invention when used as an abrasive will further improve the polishing rate of the abrasive. $\Delta PCD/V$ is considered to be correlated to the degree of coverage of the composite particle by the easily soluble silica-containing layer on the surface of the first composite particle of this invention, and/or, the degree of exposure of the child particle on the surface of the second composite particle of this invention. The present inventors presume that, with a value of $\Delta PCD/V$ controlled within the aforementioned range, the child particle is less likely to fall, and the polishing rate is kept high. Conversely, with an absolute value of $\Delta PCD/V$ larger than −110.0, the child particle would be less likely to fall, since the first composite particle of this invention in the first composite particle of this invention is entirely covered on its surface with the easily soluble silica-containing layer, or since the second composite particle of this invention of the second composite particle of this invention exposes not so much to the surface, but this would make the easily soluble silica-containing layer less likely to exfoliate during polishing, and thereby the polishing rate would decrease. Conversely with an absolute value smaller than −5.0, the child particle is considered to be less likely to fall. The present inventors presume that, within the aforementioned range, the child particle would moderately expose to the surface and would be less likely to fall, and thereby the polishing rate would improve. ΔPCD/V is preferably −100.0 to −5.0, and more preferably −100.0 to −10.0.

The dispersion of this invention, with the pH value adjusted to 3 to 8, preferably has a negative streaming potential, before being subjected to the cation colloidal titration, that is, when the amount of titration is zero. This is because, with the streaming potential kept at a negative potential, the abrasive particle (ceria-based composite particle) is less likely to reside on the target base to be polished having a negative surface potential likewise.

<First Manufacturing Method of this Invention>

The first manufacturing method of this invention will be explained.

The first manufacturing method of this invention has Steps 1 to 3, described below.

<Step 1>

In Step 1, a silica particle dispersion having a silica-based particle dispersed in the solvent is prepared.

Note that, in the first manufacturing method of this invention, "Step 1" may occasionally be referred to as "mixing step".

The silica-based particle, although the mode thereof is not specifically limited, preferably has average particle size and morphology similar to those of the mother particle. The silica-based particle contains amorphous silica as a major ingredient, like the aforementioned mother particle. Now the definition of major ingredient is same as that of the mother particle.

The average particle size of the silica-based particle is to be measured by image analysis described next.

The silica-based particle is photographed under a transmission electron microscope at 300,000× magnification (or 500,000× magnification) to obtain a photoprojection, on which the maximum diameter of the particle is assumed as the long axis, and the length thereof is determined to be long diameter (DL). On the other hand, a bisection point is found on the long axis, then two points where a line orthogonal to the long axis at the bisection point crosses the outer edge of the particle are found, and the distance between such two points is determined to be short diameter (DS). Geometric mean of the long diameter (DL) and the short diameter (DS) is determined to be a particle size of the particle.

Such particle size is measured for each of 50 particles, and a number average of the obtained particle sizes is determined to be the average particle size of the silica-based particle.

In a case where the first manufacturing method of this invention is aimed to prepare the first dispersion of this invention to be applied to polishing of semiconductor devices, the silica-based particle dispersion employable here preferably contains the silica-based particle, manufactured by hydrolyzing alkoxysilane, dispersed in a solvent. Meanwhile, in a case where any of known silica-based particle dispersions other than the aforementioned one (silica-based particle dispersion prepared from water glass, for example) is used as a starting material, such silica-based particle dispersion is preferably treated with acid, and then deionized. This is because, in this case, the content ratios of Na, Ag, Al, Ca, Cr, Cu, Fe, K, Mg, Ni, Ti, Zn, U, Th, Cl, $NO_3$, $SO_4$ and F contained in the silica-based particle may be reduced, and more specifically, may be reduced down to 100 ppm or below.

More specifically, the silica-based particle, as a starting material of the silica-based particle dispersion, preferably satisfies conditions (a) and (b) below:

(a) content ratio of each of Na, Ag, Al, Ca, Cr, Cu, Fe, K, Mg, Ni, Ti and Zn is 100 ppm or below; and (b) content ratio of each of U, Th, Cl, $NO_3$, $SO_4$ and F is 5 ppm or below.

In Step 1, the silica-based particle dispersion, having the silica-based particle dispersed in the solvent, is kept stirred at a temperature of 0 to 20° C., at a pH of 7.0 to 9.0, and at a redox potential of 50 to 500 mV, to which a metal salt of cerium is added continuously or intermittently so as to neutralize the metal salt of cerium, to thereby obtain a precursor particle dispersion that contains a precursor particle.

The dispersion medium of the silica-based particle dispersion preferably contains water, and therefore a water-based, silica-based particle dispersion (hydrosol) is preferably used.

The solid matter concentration of the silica-based particle dispersion is preferably 1 to 40 mass % in terms of $SiO_2$. If the solid matter concentration is too low, the silica concentration in the manufacturing process becomes low, possibly degrading the productivity.

When, in Step 1 of the first manufacturing method of this invention, the temperature of reaction between the silica-based particle and the salt of cerium is set to 50° C., the crystalline ceria particle (child particle) in the precursor particle, obtainable after drying in the middle stage of Step 2, is found to have a particle size of smaller than 2.5 nm. This indicates that, during the reaction between silica and ceria in a liquid phase at such high temperatures, silica inhibits crystal growth of ceria, so as to give ceria, after dried, with a small average crystallite size smaller than 2.5 nm.

Although such precursor particle might have the ceria child particle with an average crystallite size of 10 nm or larger, by adjusting the firing temperature at 1200° C. or above, this strengthens bonding among the composite particles, unfortunately making the crushing difficult. Hence, the reaction temperature is kept at 0 to 20° C. to moderately suppress the reaction between silica and ceria in liquid phase, so that ceria in the precursor particle, after dried, will have a large average crystallite size of 2.5 nm or larger. This can lower the firing temperature which is necessary to increase the average crystallite size of the ceria child particle to 10 nm or larger, can prevent the cerium-containing silica layer, obtainable after firing, from becoming excessively thick, and can make the crushing easier.

The silica-based particle dispersion may be subjected to extraction of impurities, and optionally to deionization, using cation exchange resin, anion exchange resin, mineral acid, organic acid, and ultrafiltration membrane. The silica-based particle dispersion freed from impurity ions by deionization is preferred since the surface will have silicon-containing hydroxide easily formed thereon. Methods of deionization are not limited thereto.

In Step 1, such silica-based particle dispersion is kept stirred at a temperature of 0 to 20° C., at a pH of 7.0 to 9.0, and at a redox potential of 50 to 500 mV, to which a metal salt of cerium is added continuously or intermittently. Low redox potential may make the crystal rod-like, which is less likely to deposit on the mother particle.

Types of metal salt of cerium are exemplified by, but not limited to, chloride, nitrate, sulfate, acetate, carbonate, and metal alkoxide of cerium, and are more specifically exemplified by cerium(III) nitrate, cerium carbonate, cerium (III) sulfate, and cerium(III) chloride. Among them, cerium(III) nitrate and cerium(III) chloride are preferred, since they can be produced in the form of crystalline cerium oxide from a solution having been supersaturated upon being neutralized, which can then rapidly coagulate and deposit on the silica-based particle (mother particle), to finally form monodisperse ceria in a successful manner. However, sulfate ion, chloride ion and nitrate ion contained in these metal salts are corrosive. Hence, after the mixing step, the mixture is preferably washed in a post process as needed, to thereby reduce contents of the ions down to 5 ppm or below. Meanwhile, carbonate salt and alkoxide are preferably used, since the former is released in the form of carbon dioxide gas during mixing, and the latter decomposes to produce alcohol.

The amount of addition of the metal salt of cerium, relative to the silica-based particle dispersion is preferably determined so that the ceria-based composite particle, contained in the obtainable dispersion, will have a mass ratio of silica and ceria of 100:11 to 316, as described previously.

The temperature at which the silica-based particle dispersion, after addition of the metal salt of cerium, is kept stirred is preferably 0 to 20° C., and more preferably 3 to 18° C. If the temperature is too low, ceria and silica will become less reactive with each other, silica will have considerably reduced solubility, and thereby the ceria will become uncontrolled regarding crystallization. As a consequence, coarse crystalline oxide of ceria will be produced, and the ceria child particle will abnormally grow on the surface of the mother particle, making the crushing after firing difficult. In addition, decrease of the amount of dissolution of silica by cerium compound consequently reduces the amount of silica fed to the cerium-containing silica layer. Silica that serves as a binder between the silica mother particle and the ceria child particle runs short (shortage of silica stacked on the mother particle), and this is considered to make the ceria child particle difficult to be immobilized on the silica mother particle. Conversely, too high temperature would considerably increase the solubility of silica, and would suppress production of the crystalline cerium oxide, but on the other hand would require high temperature for firing, would promote binding among particles, and would make the composite particle uncrushable. This also unfortunately causes scales on the wall of a reaction vessel. The silica mother particle is preferably less likely to be dissolved by the cerium compound (neutralized product of cerium salt). If the silica mother particle is likely to be dissolved, silica will suppress crystal growth of ceria, and will reduce the particle size of the ceria child particle to smaller than 2.5 nm in the mixing step.

The child particle (ceria), with a particle size in the mixing step of smaller than 2.5 nm, requires higher temperature for firing in order to grow the particle size of ceria particle after fired up to 10 nm or larger. This may, however, allow the cerium-containing silica layer to tightly cover the mother particle, and may make the crushing difficult. Highly soluble silica mother particle is suitably used as the starting material, after dried at 100° C. or above to suppress the solubility.

Time over which the silica-based particle dispersion is kept stirred is preferably 0.5 to 24 hours, and more preferably 0.5 to 18 hours. Too short time unfortunately tends to cause coagulation of the crystalline cerium oxide, making it less reactive with silica on the surface of the mother particle, and making the resultant composite particle less crushable. Conversely, too long time will no longer allow the reaction to proceed and will be uneconomical. The silica-based particle dispersion, after addition of the metal salt of cerium, may optionally ripened at 0 to 80° C. This is because the ripening can enhance the reaction of the cerium compound, and can allow freed cerium particles, kept floated rather than being attached to the mother particle, to deposit on the mother particle.

The pH of the silica-based particle dispersion, to which the metal salt of cerium is added and kept stirred, is adjusted to 7.0 to 9.0, and preferably to 7.6 to 8.6. The pH is preferably adjusted by using an alkali or the like. Such alkali is exemplified by known alkalis, and more specifically by, but not limited to, aqueous ammonia solution, and aqueous solutions of alkali hydroxide, alkali earth metals and amines.

The redox potential of the silica-based particle dispersion, to which the metal salt of cerium is added and kept stirred, is adjusted to 50 to 500 mV. The redox potential is preferably adjusted to 100 to 300 mV. Under a negative redox potential, plate-like or rod-like independent cerium particles would be produced, rather than that the cerium compound could attach to the surface of the silica-based particle. Method for keeping the redox potential within the aforementioned range is exemplified by addition of an oxidant such as hydrogen peroxide, or aeration or ozone blowing.

Through such Step 1, a dispersion (precursor particle dispersion) that contains a particle (precursor particle), which is a precursor of the first composite particle of this invention, is obtained. With such Step, it now becomes possible to obtain the crystalline ceria particle (child particle) contained in the precursor particle, with an average crystallite size of 2.5 to 9.5 nm. Under too large reactivity between silica and ceria, the crystalline ceria particle contained in the precursor particle will have an average crystallite size of smaller than 2.5 nm, and this needs firing in Step 2 at an excessively high temperature in order to grow the ceria particle up to 10 nm or larger. This would strengthen cohesion among the composite particles, and would make the crushing difficult.

As described above, in Step 1, such silica-based particle dispersion is kept stirred at a temperature of 0 to 20° C., at a pH of 7.0 to 9.0, and at a redox potential of 50 to 500 mV, to which the metal salt of cerium is added continuously or intermittently, which is preferably followed by keeping the dispersion at a temperature above 20° C. and not higher than 98° C., at a pH of 7.0 to 9.0, and at a redox potential of 50 to 500 mV, to which the metal salt of cerium is added continuously or intermittently, to thereby obtain the precursor particle dispersion.

In other words, it is preferable in Step 1 to conduct the process at a temperature of 0 to 20° C., and then to change the temperature above 20° C. and not higher than 98° C., to thereby obtain the precursor particle dispersion.

This is because, with such way of conducting Step 1, it becomes easier to obtain the dispersion of this invention that contains the first composite particle of this invention, in which the child particle demonstrates a particle size distribution with an appropriate value of coefficient of variation.

Note that preferred values for pH and redox potential, and method of adjustment or the like, in the process conducted at a temperature above 20° C. and not higher than 98° C., are same as those in the process conducted at a temperature of 0 to 20° C.

Conversely, it is preferable to conduct the process at a temperature above 20° C. and not higher than 98° C., prior to the process conducted at a temperature of 0 to 20° C., to thereby obtain the precursor particle dispersion. More specifically, the silica-based particle dispersion is preferably kept stirred at a temperature above 20° C. and not higher than 98° C., at a pH of 7.0 to 9.0, and a redox potential of 50 to 500 mV, to which the metal salt of cerium is preferably added continuously or intermittently, and then the mixture is preferably kept at a temperature of 0 to 20° C., a pH of 7.0 to 9.0, and a redox potential of 50 to 500 mV, to which the metal salt of cerium is preferably added continuously or intermittently, to thereby obtain the precursor particle dispersion.

This is because, with such way of conducting Step 1, it becomes easier to obtain the dispersion of this invention that contains the first composite particle of this invention, in which the child particle, after fired, demonstrates a particle size distribution with an appropriate value of coefficient of variation.

Note that preferred values for pH and redox potential, and method of adjustment or the like, in the process conducted at a temperature above 20° C. and not higher than 98° C., are same as those in the process conducted at a temperature of 0 to 20° C.

Reaction within the range from 0 to 20° C. can produce large-sized ceria child particles due to suppressed reactivity of cerium against silica, whereas subsequent addition of the metal salt of cerium, while keeping the mixing temperature above 20° C. and not hither than 98° C. enhances the reactivity of cerium against silica and accelerates dissolution of silica, thereby silica inhibits the crystal growth of ceria to produce small-sized ceria child particle. Such way of adding the metal salt of cerium in the mixing step (Step 1), essentially at a reaction temperature of 0 to 20° C., and then changed to above 20° C. and not hither than 98° C., can widen the particle size distribution of the ceria child particle. Given that the step of adding the metal salt of cerium at a mixing temperature of 0 to 20° C. is essentially employed, the reaction at the temperature above 20° C. and not higher than 98° C. may precede or succeed the reaction at 0 to 20° C. The temperature may even be changed three or more times.

In a case where the reaction temperature is changed in two or more steps, the amount of addition of the metal salt of cerium during the reaction at 0 to 20° C. is preferably 10 to 90 mass % of the total amount of addition of the metal salt of cerium. This is because, beyond this range, ratio of large-sized (or small-sized) ceria child particle will decrease, and the particle size distribution is widened not so much.

The precursor particle dispersion obtained in Step 1 may further be diluted with pure water or deionized water, or may be condensed, before being subjected to Step 2.

The precursor particle dispersion preferably has a solid matter concentration of 1 to 27 mass %.

The precursor particle dispersion may optionally be deionized using cation exchange resin, anion exchange resin, ultrafiltration membrane, ion exchange membrane, centrifugation and so forth.

<Step 2>

In Step 2, the precursor particle dispersion is dried, and then fired at 800 to 1,200° C. (preferably 950 to 1,200° C.).

Method for drying is not specifically limited, for which any of known dryers may be used. More specifically, box dryer, band dryer, spray dryer and so forth are employable.

More preferably, the precursor particle dispersion before being dried is recommended to have a pH of 6.0 to 7.0. This is because, the precursor particle dispersion before being dried, with the pH adjusted to 6.0 to 7.0, may suppress the surface activity.

The firing temperature after drying is 800 to 1,200° C., preferably 950 to 1200° C., even more preferably 1000 to 1100° C., and yet more preferably 1000 to 1090° C. Firing within these temperature ranges allows ceria to fully crystallize, and the cerium-containing silica layer in which ceria particles are dispersed will have an appropriate thickness, the cerium-containing silica layer will be bound tightly on the mother particle, and the child particle dispersed in the cerium-containing silica layer will be less likely to fall. If the temperature is too high, the ceria crystal would abnormally grow, the cerium-containing silica layer would be excessively thick, amorphous silica composing the mother particle would crystallize, or the particles would be brought into cohesion in an accelerated manner.

Firing within such temperature ranges also causes solid solubilization of silicon atom into the crystalline ceria which is a major ingredient of the child particle. Now cerium atom and silicon atom contained in the child particle can satisfy a relation given by $R_1 < R_2$, where $R_1$ represents cerium-silicon interatomic distance, and $R_2$ represents cerium-cerium interatomic distance.

In Step 2, the obtained fired product is brought into contact with a solvent, and wet crushed within the pH range from 8.6 to 11.5, to obtain a crushed fired product dispersion.

Now the fired product and the solvent may be brought into contact by immersing the fired product in the solvent and then put into a crusher; or by feeding the fired product and the solvent together into the crusher. Crushing is then allowed to proceed while controlling pH of the solvent. The pH may be 8.6 to 11.5, and is preferably 10.9 to 11.5, since higher pH can help the easily-soluble silica layer to be formed with an appropriate thickness.

The wet crusher may be any of known apparatuses, which are exemplified by wet medium agitating mill (wet crusher) including batch-type bead mill such as basket mill; horizontal/vertical/annular-type continuous bead mill, sand grinder mill and ball mill; rotor-stator homogenizer; ultrasonic dispersion homogenizer, and impact crusher based on collision of particles in the dispersion. Bead used for the wet medium agitating mill is exemplified by those made of glass, alumina, zirconia, steel, flint and so forth.

The solvent used for wet grinding is water and/or organic solvent. Water is preferably pure water, ultrapure water or deionized water. Solid content concentration of the crushed fired product dispersion preferably, but not restrictively, falls in the range from 0.3 to 50 mass %.

Alternatively, the fired product obtained after firing may be dry-crushed, and then wet-crushed with a solvent added thereto, within the pH range from 8.6 to 10.8.

Dry crusher may be any of known apparatuses, which are exemplified by attritor, ball mill, vibrating mill, vibration ball mill and so forth.

The wet crushing is conducted while keeping pH of the solvent at 8.6 to 11.5. This is because, with the pH kept within this range, silica can dissolve from a part of the hard cerium-containing silica layer produced in the firing step, and is equilibrated between dissolution and deposition during crushing, and can form the easily soluble silica-containing layer with softness and low density. In addition, it now becomes possible to finally, and more easily, obtain the ceria-based composite particle dispersion which demonstrates, when subjected to the cation colloidal titration, a streaming potential curve indicating a ratio (ΔPCD/V), given by formula (1) above, of −110.0 to −15.0, where ΔPCD denotes amount of change of streaming potential, and V denotes amount of addition of a cation colloidal titrant (V) at a knick.

That is, the crushing is preferably conducted only to a degree where the first dispersion of this invention according to a preferred mode is obtainable. This is because the polishing rate may be improved by using the first dispersion of this invention, according to a preferred mode, as an abrasive as described above. The present inventors presume that the polishing rate may further be improved and the child particle may be prevented from falling, as a result of appropriate thinning of the cerium-containing silica layer and the easily soluble silica-containing layer on the surface of the first composite particle of this invention, and/or, appropriate exposure of the child particle to a part of the surface of the composite particle. The present inventors also presume that the cerium-containing silica layer and the easily soluble silica-containing layer are thin or partially lost, so that the child particle is releasable to a certain degree during polishing. ΔPCD/V is preferably −100.0 to −5.0, and more preferably −100.0 to −20.0.

In such Step 2 as described above, it is preferable to dry the precursor particle dispersion, then to fire the precursor particle at 800 to 1,200° C. (preferably 950 to 1,200° C.), to bring the obtained fired product into contact with a solvent, to wet crush the fired product within the pH range from 8.6 to 11.5 (preferably 10.9 to 11.5), to which a silica-containing additive is added, and to heat the mixture at 10 to 98° C. for ripening, to thereby obtain the crushed fired product dispersion.

Now, the amount of addition of the silica-containing additive, in terms of ratio relative to the mass (on dry basis) of the crushed particle, is preferably 50 ppm to 30 mass %, more preferably 100 ppm to 20 mass %, and even more preferably 300 ppm to 10 mass %. With the amount of addition below these ranges, the easily soluble silica-containing layer would not fully be formed. Meanwhile, the amount of addition above these ranges, the silica-containing layer would excessively be thickened, or components not depositable on the composite particle would occur.

The silica content in the silica-containing additive may be 10 mass % or more on the dry basis. Other substances such as Ce, Zr, La, Al or the like may additionally be contained.

The heating for ripening, after adding the silica-containing additive as described above, can promote deposition onto the surface of the composite particle. The temperature of heating for ripening is preferably 10 to 98° C., and more preferably 20 to 80° C. With the temperature below these ranges, the deposition would not occur on the surface of the particle. Meanwhile, the temperature above the ranges, the composite particles would coagulate. By going through such step, easily soluble silica-containing layer with a relatively large thickness may be formed on the surface of the composite particle.

Note that the thus processed silica-containing additive may entirely be deposited on the surface of the composite particle, or may partially be freed in the solvent, because the freed portion may deposit on the surface of the particles when pH is adjusted to 3 to 8 during polishing, and also because, even if the freed portion should remain in the solvent, the silica-containing additive can cover polishing debris that occurs during polishing, or the child particle fallen from the composite particle, to thereby prevent scratches.

<Step 3>

In Step 3, the crushed fired product dispersion obtained in Step 2 is centrifuged at a relative centrifugal acceleration of 300 G or larger, and then a sediment fraction is removed, to thereby obtain the ceria-based composite particle dispersion.

More specifically, the crushed fired product dispersion is classified by centrifugation. The relative centrifugal acceleration in the centrifugation is set to 300 G or larger. After the centrifugation, the sediment fraction is removed, and thereby the ceria-based composite particle dispersion may be obtained. The upper limit of the relative centrifugal acceleration is practically, but not specifically limited to, 10,000 G or below.

Step 3 necessarily employs the centrifugation that satisfies the aforementioned conditions. With the centrifugal acceleration failed to satisfy the conditions, coarse particle will remain in the ceria-based composite particle dispersion, possibly causing scratching when such ceria-based composite particle dispersion is used as an abrasive and is applied to polishing.

According to the first manufacturing method of this invention, the ceria-based composite particle dispersion manufactured by the method described above may further be dried, to obtain the ceria-based composite particle. Method of drying is not specifically limited, and allows use of any of known dryers.

In such Step 3 as described above, it is preferable to conduct centrifugation at a relative centrifugal acceleration of 300 G or larger, then to remove the sediment fraction, to which a silica-containing additive is added, and to heat the mixture to 10 to 98° C. for ripening, to thereby obtain the ceria-based composite particle dispersion.

Now, the amount of addition of the silica-containing additive, in terms of ratio relative to the mass (on dry basis) of the crushed particle, is preferably 50 ppm to 30 mass %, more preferably 100 ppm to 20 mass %, and even more preferably 300 ppm to 10 mass %. With the amount of addition below these ranges, the easily soluble silica-containing layer would not fully be formed. Meanwhile, the amount of addition above these ranges, the silica-containing layer would excessively be thickened, or components not depositable on the composite particle would occur.

The silica content in the silica-containing additive may be 10 mass % or more on the dry basis. Other substances such as Ce, Zr, La, Al or the like may additionally be contained.

The heating for ripening, after adding the silica-containing additive as described above, can promote deposition onto the surface of the composite particle. The temperature of heating for ripening is preferably 10 to 98° C., and more preferably 20 to 80° C. With the temperature below these ranges, the deposition would not occur on the surface of the particle. Meanwhile, the temperature above the ranges, the composite particles would coagulate. By going through such step, easily soluble silica-containing layer with a relatively large thickness may be formed on the surface of the composite particle.

By such first manufacturing method of this invention, the first dispersion of this invention is obtainable.

<Second Manufacturing Method of this Invention>

The second manufacturing method of this invention will be explained.

The second manufacturing method of this invention has Steps 4 to 6, explained below.

<Step 4>

In Step 4, a silica particle dispersion having a silica-based particle dispersed in the solvent is prepared.

The silica-based particle, although the mode thereof is not specifically limited, preferably has average particle size and morphology similar to those of the mother particle. The silica-based particle contains amorphous silica as a major ingredient, like the aforementioned mother particle. Now the definition of major ingredient is same as that of the mother particle.

The average particle size of the silica-based particle is measured as described below. The silica-based particle is photographed under a transmission electron microscope at 300,000× magnification (or 500,000× magnification) to obtain a photoprojection, on which the maximum diameter of the particle is assumed as the long axis, and the length thereof is determined to be long diameter (DL). On the other hand, a bisection point is found on the long axis, then two points where a line orthogonal to the long axis at the bisection point crosses the outer edge of the particle are found, and the distance between such two points is determined to be short diameter (DS). Geometric mean of the long diameter (DL) and the short diameter (DS) is determined to be the average particle size of the silica-based particle.

Such average particle size is measured for each of 50 particles, and a number average of the obtained particle sizes is calculated.

In a case where the second manufacturing method of this invention is aimed to prepare the ceria-based composite particle dispersion to be applied to polishing of semiconductor devices, the silica-based particle dispersion employable here preferably contains the silica particle, manufactured by hydrolyzing alkoxysilane, dispersed in a solvent. Meanwhile, in a case where any of known silica-based particle dispersions (silica particle dispersion prepared from water glass, for example) is used as a starting material, such silica particle dispersion is preferably treated with acid, and then deionized. This is because, in this case, the content ratios of Na, Ag, Ca, Cr, Cu, K, Mg, Ti, Zn, U, Th, Cl, $NO_3$, $SO_4$ and F contained in the silica particle may be reduced, and more specifically, may be reduced down to 100 ppm or below.

More specifically, the silica particle, as a starting material of the silica-based particle dispersion used in Step 4, preferably satisfies conditions (a) and (b) below:

(a) content ratio of each of Na, Ag, Ca, Cr, Cu, K, Mg, Ti and Zn is 100 ppm or below; and (b) content ratio of each of U, Th, Cl, $NO_3$, $SO_4$ and F is 5 ppm or below.

In Step 4, the silica-based particle dispersion, having the silica-based particle dispersed in the solvent is kept stirred at a temperature of 0 to 20° C., at a pH of 7.0 to 9.0, and at a redox potential of 50 to 500 mV, to which a metal salt of cerium and a salt containing different atom are added independently or in a premixed manner, continuously or intermittently, to thereby obtain the precursor particle dispersion that contains the precursor particle.

Now, the precursor particle dispersion that contains the precursor particle may alternatively be obtained by adding the metal salt of cerium, the salt containing different atom, as well as a silica source, independently or in a mixed manner, into the silica-based particle dispersion.

The dispersion medium of the silica-based particle dispersion preferably contains water, and therefore a water-based silica-based particle dispersion (hydrosol) is preferably used.

The solid matter concentration of the silica-based particle dispersion is preferably 1 to 40 mass %. If the solid matter concentration is too low, the silica concentration in the manufacturing process becomes low, possibly degrading the productivity.

The silica particle dispersion may be subjected to extraction of impurities, and optionally to deionization, using cation exchange resin, anion exchange resin, mineral acid, organic acid, and ultrafiltration membrane. The silica-based particle dispersion freed from impurity ions and so forth by deionization is preferred since the surface will have silicon-containing hydroxide easily formed thereon. Methods of deionization are not limited thereto.

When, in Step 4 of the second manufacturing method of this invention, the temperature of reaction between the silica-based particle, and the metal salt of cerium and the salt containing different atom, is set to 50° C., the crystalline ceria particle (child particle) in the precursor particle, obtainable after drying in the middle stage of Step 5, is found to have a particle size of smaller than 2.5 nm. This indicates that, during the reaction between silica and ceria in a liquid phase at such high temperatures, silica inhibits crystal growth of ceria, so as to give ceria, after dried, with a small average crystallite size smaller than 2.5 nm.

Although such precursor particle might have the ceria child particle with an average crystallite size of 10 nm or larger, by adjusting the firing temperature at 1200° C. or above, then the cerium-containing silica layer becomes more likely to tightly cover the ceria child particle, unfortunately making the crushing difficult. Hence, the reaction temperature is kept at 0 to 20° C. to moderately suppress the reaction between silica and ceria in liquid phase, so that ceria in the precursor particle, after dried, will have a large average crystallite size of 2.5 nm or larger and will be easily crushable. In addition, since the average crystallite size after dried is large, so that the firing temperature which is necessary to increase the average crystallite size of the ceria child particle to 10 nm or larger may be lowered, thereby the cerium-containing silica layer, obtainable after firing, is prevented from becoming excessively thick, and is made easily crushable.

In Step 4, such silica-based particle dispersion is kept stirred at a temperature of 0 to 20° C., at a pH of 7.0 to 9.0, and at a redox potential of 50 to 500 mV, to which the metal salt of cerium and the salt containing different atom are added continuously or intermittently. Low redox potential may make the crystal rod-like, which is less likely to deposit on the mother particle.

Types of metal salt of cerium and the salt containing different atom are exemplified by, but not limited to, chloride, nitrate, sulfate, acetate, carbonate, and metal alkoxide. More specifically, the metal salt of cerium is exemplified by cerium(III) nitrate, cerium carbonate, cerium (III) sulfate, and cerium(III) chloride. Among them, cerium(III) nitrate and cerium(III) chloride are preferred, since they can be produced in the form of crystalline ceria, hydroxide of cerium, and cerium silicate, from a solution having been supersaturated upon being neutralized, which can then rapidly coagulate and deposit on the silica-based particle (mother particle), to finally form monodisperse ceria in a successful manner. However, sulfate ion, chloride ion and nitrate ion contained in these metal salts are corrosive. Hence, after the mixing step, the mixture is preferably washed in a post process as needed, to thereby reduce contents of the ions down to 5 ppm or below. Meanwhile, carbonate salt and alkoxide are preferably used, since the former is released in the form of carbon dioxide gas during mixing, and the latter decomposes to produce alcohol.

The amounts of addition of the salts of cerium and different atom, relative to the silica particle dispersion, are determined so that the individual contents of silica, ceria and one or more different atoms, in the obtainable second composite particle of this invention, satisfy the relation given by (Ce+M)/Si=0.038 to 1.11.

Meanwhile, the amounts of addition of the salts of cerium and different atom, relative to the silica particle dispersion, are determined so that the content of the different atom, in terms of oxide, in the obtainable second composite particle of this invention falls in the range from 0.01 ppm to 20 mass %. The content ratio in terms of oxide is more preferably 0.01 ppm to 15 mass %, and most preferably 0.01 ppm to 10 mass %.

The temperature at which the silica-based particle dispersion, after addition of the metal salt of cerium and the salt of different atom, is kept stirred is preferably 0 to 20° C., and more preferably 3 to 18° C. If the temperature is too low, ceria and silica will become less reactive with each other, silica will have considerably reduced solubility, and thereby the ceria will become uncontrolled regarding crystallization. As a consequence, coarse crystalline oxide of ceria will be produced, and the ceria child particle will abnormally grow on the surface of the mother particle, making the crushing after firing difficult. In addition, decrease of the amount of dissolution of silica by cerium compound consequently reduces the amount of silica fed to the cerium-containing silica layer. Silica that serves as a binder between the silica mother particle and the ceria child particle runs short (shortage of silica stacked on the mother particle), and this is considered to make the ceria child particle difficult to be immobilized on the silica mother particle. Conversely, too high temperature would considerably increase the solubility of silica, and would suppress production of the crystalline cerium oxide, but on the other hand would require high temperature for firing, would promote binding among particles, and would make the composite particle uncrushable. This also unfortunately causes scales on the wall of a reaction vessel. The silica mother particle is preferably less likely to be dissolved by the cerium compound (neutralized product of cerium salt). If the silica mother particle is likely to be dissolved, silica will suppress crystal growth of ceria, and will reduce the particle size of the ceria child particle to smaller than 2.5 nm in the mixing step.

The child particle (ceria), with a particle size in the mixing step of smaller than 2.5 nm, requires higher temperature for firing in order to grow the particle size of ceria particle after fired up to 10 nm or larger. This may, however, allow the cerium-containing silica layer to tightly cover the mother particle, and may make the crushing difficult. Highly soluble silica mother particle is suitably used as the starting material, after dried at 100° C. or above to suppress the solubility.

Time over which the silica-based particle dispersion is kept stirred is preferably 0.5 to 24 hours, and more preferably 0.5 to 18 hours. Too short time unfortunately tends to cause coagulation of the crystalline cerium oxide, making it less reactive with silica on the surface of the mother particle, and making the resultant composite particle less crushable. Conversely, too long time will no longer allow the reaction to proceed and will be uneconomical. The silica-based particle dispersion, after addition of the metal salt of cerium, may optionally ripened at 0 to 98° C. This is because the ripening can enhance the reaction of the cerium compound, and can allow freed cerium particles, kept floated rather than being attached to the mother particle, to deposit on the mother particle.

The pH of the silica-based particle dispersion, to which the metal salt of cerium and the salt of different atom are added and kept stirred, is adjusted to 7.0 to 9.0, and preferably to 7.6 to 8.9. The pH is preferably adjusted by using an alkali or the like. Such alkali is exemplified by known alkalis, and more specifically by, but not limited to, aqueous ammonia solution, and aqueous solutions of alkali hydroxide, alkali earth metals and amines.

The redox potential of the silica-based particle dispersion, to which the metal salt of cerium and the salt of different atom are added and kept stirred, is adjusted to 50 to 500 mV. The redox potential is preferably adjusted to 100 to 300 mV. Under a negative redox potential, plate-like or rod-like independent cerium particles would be produced, rather than that the cerium compound could attach to the surface of the silica-based particle. Method for keeping the redox potential within the aforementioned range is exemplified by addition of an oxidant such as hydrogen peroxide, or aeration or ozone blowing.

Through such Step 4, a dispersion (precursor particle dispersion) that contains a particle (precursor particle), which is a precursor of the second composite particle of this invention, is obtained. With such Step, it now becomes possible to obtain the crystalline ceria particle (child particle) contained in the precursor particle, with an average crystallite size of 2.5 to 9.5 nm. Under too large reactivity between silica and ceria, the crystalline ceria particle contained in the precursor particle will have an average crystallite size of smaller than 2.5 nm, and this needs firing in Step 5 at an excessively high temperature in order to grow the ceria particle up to 10 nm or larger. This would strengthen cohesion among the composite particles, and would make the crushing difficult.

As described above, in Step 4, such silica-based particle dispersion is kept stirred at a temperature of 0 to 20° C., at a pH of 7.0 to 9.0, and at a redox potential of 50 to 500 mV, to which the metal salt of cerium and the salt of different atom are added continuously or intermittently, which is preferably followed by keeping the dispersion at a temperature above 20° C. and not higher than 98° C., at a pH of 7.0 to 9.0, and at a redox potential of 50 to 500 mV, to which the metal salt of cerium is added continuously or intermittently, to thereby obtain the precursor particle dispersion.

In other words, it is preferable in Step 4 to conduct the process at a temperature of 0 to 20° C., and then to change the temperature above 20° C. and not higher than 98° C., to thereby obtain the precursor particle dispersion.

This is because, with such way of conducting Step 4, it becomes easier to obtain the second dispersion of this invention that contains the second composite particle of this invention, in which the child particle has a broad particle size distribution, and thereby the polishing rate increases.

Note that preferred values for pH and redox potential, and method of adjustment or the like, in the process conducted at a temperature above 20° C. and not higher than 98° C., are same as those in the process conducted at a temperature of 0 to 20° C.

Conversely, it is preferable to conduct the process at a temperature above 20° C. and not higher than 98° C., prior to the process conducted at a temperature of 0 to 20° C., to thereby obtain the precursor particle dispersion. More specifically, the silica-based particle dispersion is preferably kept stirred at a temperature above 20° C. and not higher than 98° C., at a pH of 7.0 to 9.0, and a redox potential of 50 to 500 mV, to which the metal salt of cerium and the salt of different atom are preferably added continuously or intermittently, and then the mixture is preferably kept at a temperature of 0 to 20° C., a pH of 7.0 to 9.0, and a redox potential of 50 to 500 mV, to which the metal salt of cerium is preferably added continuously or intermittently, to thereby obtain the precursor particle dispersion.

This is because, with such way of conducting Step 4, it becomes easier to obtain the second dispersion of this invention that contains the second composite particle of this invention, in which the child particle demonstrates a particle size distribution with an appropriate value of coefficient of variation.

Note that preferred values for pH and redox potential, and method of adjustment or the like, in the process conducted at a temperature above 20° C. and not higher than 98° C., are same as those in the process conducted at a temperature of 0 to 20° C.

Reaction within the range from 0 to 20° C. can produce large-sized ceria child particles due to suppressed reactivity of cerium against silica, whereas subsequent addition of the metal salt of cerium, while keeping the mixing temperature above 20° C. and not hither than 98° C. enhances the reactivity of cerium against silica and accelerates dissolution of silica, thereby silica inhibits the crystal growth of ceria to produce small-sized ceria child particle. Such way of adding the metal salt of cerium in the mixing step (Step 4), essentially at a reaction temperature of 0 to 20° C., and then changed to above 20° C. and not hither than 98° C., can widen the particle size distribution of the ceria child particle. Given that the step of adding the metal salt of cerium at a mixing temperature of 0 to 20° C. is essentially employed, the reaction at the temperature above 20° C. and not higher than 98° C. may precede or succeed the reaction at 0 to 20° C. The temperature may even be changed three or more times.

In a case where the reaction temperature is changed in two or more steps, the amount of addition of the metal salt of cerium during the reaction at 0 to 20° C. is preferably 10 to 90 mass % of the total amount of addition of the metal salt of cerium. This is because, beyond this range, ratio of large-sized (or small-sized) ceria child particle will decrease, and the particle size distribution is widened not so much.

Types of salt of a different atom is exemplified by, but not limited to, chloride, nitrate, sulfate, acetate, carbonate, and metal alkoxide of different atom. However, sulfate ion, chloride ion and nitrate ion contained in these metal salts are corrosive. Hence, after the mixing step, the mixture is preferably washed in a post process as needed, to thereby reduce contents of the ions down to 5 ppm or below. Meanwhile, carbonate salt and alkoxide are preferably used, since the former is released in the form of carbon dioxide gas during mixing, and the latter decomposes to produce alcohol.

The different atom is entirely or partially solid-solubilized into the crystalline ceria that coagulates on the surface of the silica particle.

The amounts of addition of the salts of cerium and the salt of a different atom, relative to the silica particle dispersion, are determined so that the individual contents of silica, ceria and one or more different atoms, in the obtainable composite particle of this invention, satisfy the relation given by (Ce+M)/Si=0.038 to 1.11.

The silica source is exemplified by alkoxysilane, acidic silicic acid solution, sodium silicate and silicon tetrachloride.

Through such Step 4, a dispersion (precursor particle dispersion) that contains the particle (precursor particle), which is a precursor of the second composite particle of this invention, is obtained.

The precursor particle dispersion obtained in Step 4 may further be diluted with pure water or deionized water, or may be condensed, before being subjected to Step 5.

The precursor particle dispersion preferably has a solid matter concentration of 1 to 27 mass %.

The precursor particle dispersion may optionally be deionized using cation exchange resin, anion exchange resin, ultrafiltration membrane, ion exchange membrane, centrifugation and so forth.

<Step 5>

In Step 5, the precursor particle dispersion is dried, and then fired at 800 to 1,200° C., preferably at 950 to 1,200° C.

Method for drying is not specifically limited, for which any of known dryers may be used. More specifically, box dryer, band dryer, spray dryer and so forth are employable.

More preferably, the precursor particle dispersion before being dried is recommended to have a pH of 6.0 to 7.0. This is because, the precursor particle dispersion before being dried, with the pH adjusted to 6.0 to 7.0, may suppress the surface activity.

The firing temperature after drying is 800 to 1,200° C., preferably 950 to 1200° C., even more preferably 1000 to 1180° C., and yet more preferably 1000 to 1150° C. Firing within these temperature ranges allows ceria to fully crystallize, and allows Si and different atom to be fully solid-solubilized in the ceria crystal, and the cerium-containing silica layer that resides on the surface of the child particle will be moderately thickened, the cerium-containing silica layer will be bound tightly on the mother particle, and the child particle dispersed in the cerium-containing silica layer will be less likely to fall. If the temperature is too high, the ceria crystal would abnormally grow, the cerium-containing silica layer would be excessively thick, amorphous silica composing the mother particle would crystallize, or the particles would be brought into cohesion in an accelerated manner.

In Step 5, the obtained fired product is brought into contact with a solvent, and wet crushed within the pH range from 8.6 to 10.8, to obtain a crushed fired product dispersion.

Now the fired product and the solvent may be brought into contact by immersing the fired product in the solvent and then put into a crusher; or by feeding the fired product and the solvent together into the crusher. Crushing is then allowed to proceed while controlling pH of the solvent. The pH may be 8.6 to 10.8. Higher pH can help the easily-soluble silica layer to be formed with an appropriate thickness.

The wet crusher may be any of known apparatuses, which are exemplified by wet medium agitating mill (wet crusher) including batch-type bead mill such as basket mill; horizontal/vertical/annular-type continuous bead mill, sand grinder mill and ball mill; rotor-stator homogenizer; ultrasonic dispersion homogenizer, and impact crusher based on collision of particles in the dispersion. Bead used for the wet medium agitating mill is exemplified by those made of glass, alumina, zirconia, steel, flint and so forth.

The solvent used for wet grinding is water and/or organic solvent. Water is preferably pure water, ultrapure water or deionized water. Solid content concentration of the crushed fired product dispersion preferably, but not restrictively, falls in the range from 0.3 to 50 mass %.

Alternatively, the fired product obtained after firing may be dry-crushed, and then wet-crushed with a solvent added thereto, within the pH range from 8.6 to 10.8.

Dry crusher may be any of known apparatuses, which are exemplified by attritor, ball mill, vibrating mill, vibration ball mill and so forth.

The wet crushing is thereafter conducted while keeping pH of the solvent at 8.6 to 10.8. This is because, with the pH kept within this range, it becomes possible to finally, and more easily, obtain the ceria-based composite particle dispersion which demonstrates, when subjected to the cation colloidal titration, a streaming potential curve indicating a ratio ($\Delta PCD/V$), given by formula (1) above, of −110.0 to −15.0, where $\Delta PCD$ denotes amount of change of streaming potential, and V denotes amount of addition of a cation colloidal titrant (V) at a knick.

That is, the crushing is preferably conducted only to a degree where the second dispersion of this invention according to a preferred mode is obtainable. This is because the polishing rate may be improved by using the second dispersion of this invention, according to a preferred mode, as an abrasive as described above. The present inventors presume that the polishing rate may further be improved and the child particle may be prevented from falling, as a result of appropriate thinning of the cerium-containing silica layer on the surface of the second composite particle of this invention, and/or, appropriate exposure of the child particle to a part of the surface of the composite particle. The present inventors also presume that the cerium-containing silica layer is thin or partially lost, so that the child particle is releasable to a certain degree during polishing. $\Delta PCD/V$ is preferably −100.0 to −5.0, and more preferably −100.0 to −20.0.

<Step 6>

In Step 6, the crushed fired product dispersion obtained in Step 5 is centrifuged at a relative centrifugal acceleration of 300 G or larger, and then a sediment fraction is removed, to thereby obtain the ceria-based composite particle dispersion.

More specifically, the crushed fired product dispersion is classified by centrifugation. The relative centrifugal acceleration in the centrifugation is set to 300 G or larger. After the centrifugation, the sediment fraction is removed, and thereby the ceria-based composite particle dispersion may be obtained. The upper limit of the relative centrifugal acceleration is practically, but not specifically limited to, 10,000 G or below.

Step 6 necessarily employs the centrifugation that satisfies the aforementioned conditions. With the centrifugal acceleration failed to satisfy the conditions, coarse particle will remain in the ceria-based composite particle dispersion, possibly causing scratching when such ceria-based composite particle dispersion is used as an abrasive and is applied to polishing.

According to the second manufacturing method of this invention, the ceria-based composite particle dispersion manufactured by the method described above may further be dried, to obtain the ceria-based composite particle. Method of drying is not specifically limited, and allows use of any of known dryers.

As a result of such second manufacturing method of this invention, the second dispersion of this invention is obtainable.

The mixed liquid, obtained by adding the salts of cerium and different atom (and silica, more preferably) to the silica particle dispersion, preferably demonstrates a positive redox potential. This is because, under a negative redox potential, plate-like or rod-like independent cerium particles would be produced, rather than that the cerium compound could attach to the surface of the silica-based particle. Method for keeping positive redox potential is exemplified by, but not limited to, addition of an oxidant such as hydrogen peroxide, or aeration or ozone blowing.

<Polishing Abrasive Particle Dispersion>

Liquid containing the dispersion of this invention is suitably applicable as the polishing abrasive particle dispersion (also referred to as "the polishing abrasive particle dispersion of this invention", hereinafter). The dispersion is suitably used as a polishing abrasive particle dispersion, particularly for planarizing a substrate having a $SiO_2$ insulating film formed thereon. The dispersion, to which a chemical ingredient is added to control the polishing performance, is also suitably used as a polishing slurry.

The polishing abrasive particle dispersion of this invention excels in polishing rate when applied to polish a semiconductor substrate or the like, causes less defects (scratches) on a polished surface during polishing, and causes less residence of abrasive particle on the substrate.

The polishing abrasive particle dispersion of this invention contains water and/or organic solvent as a dispersion solvent. For the dispersion solvent, preferably used is water such as pure water, ultrapure water or deionized water. The polishing abrasive particle dispersion of this invention is also suitably used as a polishing slurry after adding an additive for controlling the polishing performances, which is at least one substance selected from the group consisting of polishing accelerator, surfactant, heterocyclic compound, pH adjuster and pH buffer.

<Polishing Accelerator>

The polishing abrasive particle dispersion of this invention is employable as a polishing slurry, by optionally adding a known polishing accelerator, although depending on types of target material to be polished. The polishing accelerator is exemplified by hydrogen peroxide, peracetic acid, urea peracetate, and mixtures of these compounds. Such abrasive composition containing the polishing accelerator, such as hydrogen peroxide, can effectively increase the polishing rate, when used on a target material to be polished composed of metal.

Other examples of the polishing accelerator include inorganic acids such as sulfuric acid, nitric acid, phosphoric acid, oxalic acid and hydrofluoric acid; organic acids such as acetic acid; sodium salts, potassium salts, ammonium salts, and amine salts of these acids; and mixtures of these substances. In a case where the polishing composition containing such polishing accelerator is applied to polishing of a target material to be polished made of a composite ingredient, a finally flat polished surface is obtainable by accelerating the polishing rate regarding a specific ingredient in the target material to be polished.

For the polishing abrasive particle dispersion of this invention containing the polishing accelerator, the content is preferably 0.1 to 10 mass %, and more preferably 0.5 to 5 mass %.

<Surfactant and/or Hydrophilic Compound>

Aiming at improving the dispersibility or stability of the polishing abrasive particle dispersion of this invention, it is acceptable to add cationic, anionic, nonionic or ampholytic surfactant, or hydrophilic compound. Both of surfactant and hydrophilic compound act to reduce a contact angle of the dispersion on a target surface to be polished, successfully promoting uniform polishing. The surfactant and/or hydrophilic compound are exemplified by those selected from the groups below.

The anionic surfactant is exemplified by carboxylic salt, sulfonic salt, sulfuric ester salt and phosphoric ester salt. The carboxylic salt is exemplified by soap and N-acylamino acid salt; the sulfonic salt is exemplified by alkylsulfonic acid salt; the sulfuric ester salt is exemplified by sulfonated oil; and the phosphoric ester salt is exemplified by alkylphosphate salt.

The cationic surfactant is exemplified by aliphatic amine salts.

The nonionic surfactant is exemplified by those of ether type, ether ester type, ester type, and nitrogen-containing type. The ether type is exemplified by polyoxyethylene alkyl ether and alkyl phenyl ether; the ether ester type is exemplified by polyoxyethylene ether of glycerin ester; the ester type is exemplified by aliphatic acid ester of polyethylene glycol; and the nitrogen-containing type is exemplified by aliphatic alkanol amide. Other examples include fluorine-containing surfactant.

The surfactant is preferably anionic surfactant or nonionic surfactant. The salt is exemplified by ammonium salt, potassium salt, and sodium salt. Ammonium salt and potassium salt are particularly preferable.

The other surfactant, hydrophilic compound and so forth are exemplified by esters such as glycerin ester; ethers such as polyethylene glycol; polysaccharides such as alginic acid; amino acid salts such as ammonium glycinate and sodium glycinate; polycarboxylic acid such as polyaspartic acid and salt thereof; vinyl polymers such as polyvinyl alcohol; taurate such as ammonium methyltaurate; sulfate such as sodium methylsulfate; sulfonic acid and salt thereof such as sodium vinylsulfonate; and amide such as propionamide.

Any of the surfactants is suitably applicable to the target base to be polished such as glass substrate. Meanwhile, acidic surfactant, or ammonium salt thereof is preferably used for silicon substrate used for semiconductor integrated circuit, which needs to be strictly protected from contamination with alkali metal, alkali earth metal or halide.

For the polishing abrasive particle dispersion of this invention containing the surfactant and/or hydrophilic compound, the content thereof is preferably 0.001 to 10 g in total in one liter of the polishing abrasive particle dispersion, which is more preferably 0.01 to 5 g, and particularly 0.1 to 3 g.

In view of obtaining a sufficient level of effect, the content of the surfactant and/or hydrophilic compound is preferably 0.001 g or more per one liter of the polishing abrasive particle dispersion, meanwhile in view of avoiding decrease of the polishing rate, the content is preferably 10 g or less.

Only one type of the surfactant of the hydrophilic compound may be used independently, or two or more types may be used in a combined manner.

<Heterocyclic Compound>

In a case where metal is contained in the target base to be polished using the polishing abrasive particle dispersion of this invention, a heterocyclic compound may be added to the polishing abrasive particle dispersion of this invention, aiming at forming a passive layer or a dissolution suppressive layer on such metal so as to suppress the target base to be polished from being corroded. Now, the "heterocyclic compound" means a compound that has a heterocycle containing one or more heteroatoms. The heteroatom is preferably exemplified by, but not limited to, nitrogen atom, sulfur atom, oxygen atom, selenium atom, tellurium atom, phosphorus atom, silicon atom, and boron atom. The heterocyclic compound is exemplified by, but not limited to, imidazole and benztriazole.

For the polishing abrasive particle dispersion of this invention containing the heterocyclic compound, the content thereof is preferably 0.001 to 1.0 mass %, more preferably 0.001 to 0.7 mass %, and even more preferably 0.002 to 0.4 mass %.

<pH Adjuster>

Typically aiming at enhancing the effects of the aforementioned additives, it is acceptable to optionally add an acid, a base, or a salt of these substances, to the polishing composition to control the pH.

An alkaline pH adjuster is used, when the polishing abrasive particle dispersion of this invention is adjusted to pH7 or above. Examples of the alkaline pH adjuster include sodium hydroxide, ammonia water, ammonia carbonate, and amines such as ethylamine, methylamine, triethylamine and tetramethylamine.

An acidic pH adjuster is used, when the polishing abrasive particle dispersion of this invention is adjusted below pH7. Examples of the acidic pH adjuster include acetic acid; hydroxy acids such as lactic acid, citric acid, malic acid, tartaric acid and glyceric acid; and mineral acids such as hydrochloric acid and nitric acid.

<pH Buffer>

It is also acceptable to use a pH buffer, in order to keep the pH of the polishing abrasive particle dispersion of this invention at a constant value. For example, phosphate salt and borate salt, such as ammonium dihydrogen phosphate, diammonium hydrogen phosphate and ammonium tetraborate tetrahydrate; and organic acid salt are employable as the pH buffer.

Known solvent are employable as the dispersion solvent of the polishing abrasive particle dispersion of this invention. Examples of employable organic solvent include alcohols such as methanol, ethanol and isopropanol; ketones such as acetone; amides such as N,N-dimethylformamide; ethers such as diethyl ether; glycol ethers such as 2-methoxyethanol; glycol ether acetates such as 2-methoxyethyl acetate; esters such as methyl acetate, ethyl acetate and isobutyl acetate; aromatic hydrocarbons such as benzene, toluene and xylene; aliphatic hydrocarbons such as hexane; halogenated hydrocarbons such as methylene chloride; sulfoxides such as methyl sulfoxide; and pyrrolidones such as N-methyl-2-pyrrolidone and N-octyl-2-pyrrolidone. They may be mixed with water before use.

The polishing abrasive particle dispersion of this invention preferably has the solid matter concentration within the range from 0.3 to 50 mass %. Too low solid matter concentration may reduce the polishing rate, whereas too high solid matter concentration will no longer increase the polishing rate and will be uneconomical.

EXAMPLES

This invention will be explained referring to Examples, without being limited to Examples.

Experiment 1

First, the individual measurement methods and test methods in Examples and Comparative Examples will be detailed. Results of the individual measurements and tests for the individual Examples and Comparative Examples are summarized in Tables 1 to 3 below.

[Analyses of Ingredients]
[Measurement of $SiO_2$ Content]

When measuring $SiO_2$ content of the silica-based particle dispersion, $SiO_2$ derived from sodium silicate was measured by subjecting the silica-based particle dispersion to ignition loss test at 1000° C., then weighing the residue, and calculating the content while assuming the whole residue to be $SiO_2$. On the other hand, $SiO_2$ derived from alkoxysilane was measured by drying the silica-based particle dispersion at 150° C. for one hour, then weighing the residue, and calculating the content while assuming the whole residue to be $SiO_2$. Note that also the solid matter concentration of the silica-based particle dispersion can be determined in this process.

On the other hand, the $SiO_2$ content in the ceria-based composite particle was measured by subjecting the ceria-based composite particle dispersion to ignition loss test at 1000° C., finding the mass of solid matter, measuring content ratio of Ce and content ratio of different atom using an ICP atomic emission spectrometer (for example, SPS5520 from SII Inc.) and the standard addition method to find $CeO_2$ mass % and $MO_X$ mass %, in the same way as for Al to Th described later, and then by calculating the $SiO_2$ content while assuming the balance of the solid matter other than $CeO_2$ and $MO_X$ to be $SiO_2$. For the ceria-based composite particle free of the different atom, the $SiO_2$ content was calculated while regarding $MO_X$ mass % to be zero.

Note that the content ratio of $SiO_2$ and the content ratio of $CeO_2$ in the ceria-based composite particle, and parts by mass of ceria per 100 parts by mass of silica were calculated using the $CeO_2$ content and the $SiO_2$ content determined in this process. Also the solid matter concentration of the ceria-based composite particle dispersion can be determined in this process.

In the measurement of content ratios of the specific impurity group 1 and the specific impurity group 2 described below, the content ratios of the individual ingredient relative to the dry weight of silica were determined, using the thus determined mass of $SiO_2$.

[Analyses of Ingredients in Ceria-Based Composite Particle or Silica-Based Particle]

Content ratios of the individual elements were measured according to the methods below.

First, approximately 1 g of a sample (with the solid content adjusted to 20 mass %) composed of the ceria-based composite particle or the ceria-based composite particle dispersion was placed on a platinum dish. Three ml of phosphoric acid, 5 ml of nitric acid, and 10 ml hydrofluoric acid were added, and the content was heated on a sand bath. After dried up, a small amount of water and 50 ml of nitric acid were added to dissolve the residue, the content was placed in a 100 ml volumetric flask, and diluted with water up to 100 ml. Na and K were measured in this solution using an atomic absorption spectrophotometer (for example, Z-2310 from Hitachi, Ltd.). Next, from the solution thus diluted up to 100 ml, a 10 ml fraction was transferred into a 20 ml volumetric flask. The operation was repeated five times to obtain five 10 ml fractions. Al, Ag, Ca, Cr, Cu, Fe, Mg, Ni, Ti, Zn, U and Th were measured in these fractions using an ICP atomic emission spectrometer (for example, SPS5520 from SII Inc.) and the standard addition method. Also a blank solution was measured in the same way, and the measured values for the individual elements were corrected by subtracting such blank value.

Then using the mass of $SiO_2$ determined by the aforementioned method, the content ratios of the individual ingredients relative to the dry weight of silica were determined.

The content ratios of the individual anions were measured according the methods below.

<Cl>

Acetone was added to 20 g of a sample (with the solid content adjusted to 20 mass %) composed of the ceria-based composite particle or the ceria-based composite particle dispersion up to a volume of 100 ml, then 5 ml of acetic acid and 4 ml of a 0.001 mol sodium chloride solution were added, and the solution was analyzed by potentiometric titration (potentiometric titrator AT-610, from Kyoto Electronics Manufacturing Co., Ltd.) using a 0.002 mol silver nitrate solution.

Besides this, a blank solution composed of 100 ml of acetone, 5 ml of acetic acid and 4 ml of a 0.001 mol sodium chloride solution was titrated with the 0.002 mol silver nitrate solution to obtain a blank titration volume. The titration volume of the sample was determined after subtraction of such blank titration volume.

Then using the mass of $SiO_2$ determined by the aforementioned method, the content ratios of the individual ingredients relative to the dry weight of silica were determined.

<$NO_3$, $SO_4$, F>

Five grams of a sample (with the solid content adjusted to 20 mass %) composed of the ceria-based composite particle or the ceria-based composite particle dispersion was diluted with water up to 100 ml, the solution was centrifuged using a centrifugal machine (HIMAC CT06E, from Hitachi, Ltd.) at 4000 rpm for 20 minutes, and the supernatant remained after removing a sediment fraction was analyzed by ion chromatography (DIONEX ICS-1100).

Then using the mass of $SiO_2$ determined by the aforementioned method, the content ratios of the individual ingredients relative to the dry weight of silica were determined.

Note that the content ratios of the individual elements or the individual anions in the silica particle (mother particle) were determined in the same way as in the analytical method for the ceria-based composite particle, except that a silica particle dispersion was used as a sample, in place of the ceria-based composite particle dispersion.

[X-Ray Diffractometry, Measurement of Average Crystallite Size]

The ceria-based composite particle dispersion or the silica-based composite particle obtained in Examples and Comparative Examples was dried using a known dryer, the obtained powder was ground using a mortar for 10 minutes, and analyzed using an X-ray diffractometer (RINT1400 from Rigaku Corporation) to obtain an X-ray diffraction pattern, from which a crystal type was specified.

Also the full width at half maximum of a peak that appeared in the thus obtained X-ray diffraction pattern at around $2\theta=28°$, assignable to the (111) plane (at around $2\theta=28°$) was measured, and the average crystallite size was determined using the Scherrer equation.

<Average Particle Size>

The silica-based particle dispersion and ceria-based composite particle dispersion obtained in Examples and Comparative Examples was measured regarding the average particle size of the particle contained therein, according to the aforementioned image analysis.

<Short Diameter/Long Diameter>

The individual particles contained in the silica particle dispersion and the ceria-based composite particle dispersion obtained in Examples and Comparative Examples were photographed under a transmission electron microscope (S-5500 from Hitachi, Ltd.) at 250,000× magnification (or 500,000× magnification) to obtain a photoprojection, on which the maximum diameter of the particle was assumed as the long axis, and the length thereof was determined to be long diameter (DL). On the other hand, a bisection point was found on the long axis, then two points where a line orthogonal to the long axis at the bisection point crosses the outer edge of the particle were found, and the distance between such two points was determined to be short diameter (DS). The ratio (DS/DL) was determined. The percentage of abundance of independent particles with a short diameter/long diameter value of 0.8 or smaller was determined, by measuring freely selected 50 particles.

<Number of Coarse Particles>

The number of coarse particles in the composite particle was measured using Accusizer 780APS, from Particle Sizing System Inc. A sample was diluted with pure water down to 0.1 mass %, from which a 5 ml portion of the solution was injected into the measuring instrument, and measured under conditions below. The measurement was repeated three times, and the obtained measurement data regarding the number of coarse particles of 0.51 μm or larger were averaged. The average value was further multiplied by 1000, to determine the number of coarse particles of the ceria-based composite particle, in terms of dry particles. The measurement conditions are as follows.

<System Setup>
Stir Speed Control/Low Speed Factor 1500/High Speed Factor 2500

<System Menu>
Data Collection Time 60 Sec.
Syringe Volume 2.5 ml
Sample Line Number: Sum Mode
Initial $2^{nd}$-Stage Dilution Factor 350
Vessel Fast Flush Time 35 Sec.
System Flush Time/Before Measurement 60 Sec./After Measurement 60 Sec.
Sample Equilibration Time 30 Sec./Sample Flow Time 30 Sec.

[Method of Polishing Test]
<Polishing of $SiO_2$ Film>

Polishing abrasive particle dispersions that contain the ceria-based composite particle dispersions obtained in the individual Examples and Comparative Examples were prepared. The solid matter concentration was adjusted to 0.6 mass %, and the pH was adjusted to 5.0 with nitric acid.

Next, substrates having thereon a $SiO_2$ insulating film formed by deposition, or a thermal oxide film formed by thermal oxidization (1 μm thick for both of them) were prepared as target substrates to be polished.

Each substrate was set on a lapping machine (NF300, from Nanofactor Co., Ltd.), and polished using a polishing pad (IC-1000/SUBA400, concentric type, from Nitta Haas Inc.), at a substrate load of 0.5 MPa, and at a rotating speed of table of 90 rpm, while feeding the polishing abrasive particle dispersion at a rate of 50 ml/min for one minute.

Change of mass of each target substrate to be polished, between before and after the polishing was measured, and polishing rate was determined.

Also the smoothness (surface roughness Ra) of the surface of each target substrate to be polished was measured under an atomic force microscope (AFM, from Hitachi High-Tech Science Corporation). Since the smoothness and the surface roughness are almost proportional, so that the surface roughness was listed in Tables 3 and 8.

Polishing scratches were observed on the insulating film, under an optical microscope.

<Polishing of Aluminum Hard Disk>

Polishing abrasive particle dispersions that contain the ceria-based composite particle dispersions obtained in the individual Examples and Comparative Examples were prepared. The solid matter concentration was adjusted to 9 mass %, and the pH was adjusted to 2.0 with nitric acid.

An aluminum hard disk substrate was set on a lapping machine (NF300, from Nanofactor Co., Ltd.), and polished using a polishing pad ("Polytex φ12", from Nitta Haas Inc.), at a substrate load of 0.05 MPa, and at a rotating speed of table of 30 rpm, while feeding the polishing abrasive particle dispersion at a rate of 20 ml/min for 5 minutes. The entire surface was observed using a ultrafine defect visualization/macro inspection device (Micro-MAX, from Vision Psytec) at Zoom 15, and the number of scratches (linear streaks) found on the polished surface assumed to have an area of 65.97 $cm^2$ was counted up, and evaluated according to the criteria below.

| Number of linear streaks | Judgement |
|---|---|
| less than 50 | "very few" |
| 50 or more, less than 80 | "few" |
| 80 or more | "much" |
| * at least 80 or more, the total uncountable | "x" |

Examples will be described below. Note that simple notation of "solid matter concentration" means concentration of particles, irrespective of their chemical species, dispersed in solvents.

[Preparatory Step 1]
<Preparation of High-Purity 113 nm Silica Particle Dispersion>
«Preparation of Silica Particle Dispersion (Average Particle Size of Silica Particle: 63 nm)»

Mixed were 12,090 g of ethanol and 6,363.9 g of ethyl orthosilicate, to prepare mixed solution $a_1$.

Next, 6,120 g of ultrapure water and 444.9 g of 29% ammonia water were mixed to prepare mixed solution $b_1$.

Next, 192.9 g of ultrapure water and 444.9 g of ethanol were mixed to prepare pre-pouring solution.

The pre-pouring solution was kept stirred, adjusted to 75° C., and thereto, the mixed solution $a_1$ and the mixed solution $b_1$ were added concurrently so that the addition of each solution completes within 10 hours. After completion of addition, the mixture was kept at 75° C. for 3 hours for ripening, then the solid matter concentration was adjusted, to thereby obtain 9,646.3 g of a silica sol with a $SiO_2$ solid matter concentration of 19 mass %, having silica particle, whose average particle size was determined to be 63 nm by image analysis, dispersed in the solvent. Now, the image analysis means the aforementioned image analysis having been applied to determine the average particle size of the silica-based particle. The same meaning of the image analysis shall apply to Preparatory Steps described below.

«Preparation of Silica Particle Dispersion (Average Particle Size of Silica Particle: 113 nm)»

Mixed were 2,733.3 g of methanol and 1,822.2 g of ethyl orthosilicate to prepare mixed solution $a_2$.

Next, 1,860.7 g of ultrapure water and 40.6 g of 29% ammonia water were mixed to prepare mixed solution $b_2$.

Next, 59 g of ultrapure water and 1,208.9 g of methanol were mixed to prepare pre-pouring solution, and added thereto was 922.1 g of silica sol having the silica particle obtained in the preceding step, with an average particle size of 63 nm dispersed in the solvent.

The pre-pouring solution containing the silica sol was kept stirred, adjusted to 65° C., and thereto, the mixed solution $a_2$ and the mixed solution $b_2$ were added concurrently so that the addition of each solution completes within 18 hours. After completion of addition, the mixture was kept at 65° C. for 3 hours for ripening, condensed using a ultrafiltration membrane and a rotary evaporator so as to adjust the solid matter concentration ($SiO_2$ solid matter concentration) to 19 mass %, to thereby obtain 3,600 g of a high-purity silica particle dispersion.

The particle contained in the high-purity silica particle dispersion was found to have an average particle size of 113 nm. The content ratio of each of Na, Ag, Al, Ca, Cr, Cu, Fe, K, Mg, Ni, Ti, Zn, Zr, U, Th, Cl, $NO_3$, $SO_4$ and F was found to be 1 ppm or below.

Next, to 1,053 g of such high-purity silica particle dispersion, 114 g of a cation exchange resin (SK-1BH, from Mitsubishi Chemical Corporation) was gradually added, the mixture was stirred for 30 minutes, and the resin was then separated. The pH at this point of time was found to be 5.1.

Ultrapure water was then added to the thus obtained silica particle dispersion, to thereby obtain 5,994 g of liquid A (179.8 g in terms of dry $SiO_2$) with a $SiO_2$ solid matter concentration of 3 mass %.

[Preparatory Step 2]
<Preparation of High-Purity Silicic Acid Solution>

To an aqueous sodium silicate solution (silica concentration: 24.06 mass %, $Na_2O$ concentration: 7.97 mass %), pure water was added to obtain aqueous sodium silicate solution (silica concentration: 5 mass %).

Eighteen kilograms of the thus obtained aqueous sodium silicate solution was allowed to pass through 6 L of a strongly acidic cation exchange resin (SK1BH, from Mitsubishi Chemical Corporation) at a space velocity of 3.0 $h^{-1}$, to thereby obtain 18 kg of acidic silicic acid solution (silica concentration: 4.6 mass %, pH2.7). Next, 18 kg of the thus obtained acidic silicic acid solution was allowed to pass through 6 L of a chelating ion exchange resin (CR-11, from Mitsubishi Chemical Corporation) at a space velocity of 3.0 $h^{-1}$, to thereby obtain 18 kg of high-purity silicic acid solution (silica concentration: 4.5 mass %, pH2.7).

[Preparatory Step 3]
«Preparation of Silica Particle Dispersion (Average Particle Size Silica Particle: 25 nm)»

To 42 g of pure water, 514.5 g of the high-purity silicic acid solution was added under stirring, 1,584.6 g of 15% ammonia water was then added, the mixture was then heated up to 83° C., and kept for 30 minutes.

Next, 13,700 g of the high-purity silicic acid solution was added over 18 hours, and the mixture after completion of addition was kept at 83° C. for ripening, to thereby obtain a silica particle dispersion, which was found, by image analysis, to have an average particle size of 25 nm.

The obtained silica particle dispersion was cooled down to 40° C., and condensed using a ultrafiltration membrane (SIP1013, from Asahi Kasei Corporation) up to a $SiO_2$ concentration of 12 mass %.

«Preparation of Silica Particle Dispersion (Average Particle Size of Silica Particle: 45 nm)»

To 991 g of pure water, 963 g of 12 mass % dispersion of 25 nm silica particle was added under stirring. Next, 1,414 g of 15% ammonia water was added, the mixture was then heated up to 87° C., and kept for 30 minutes.

Next, 12,812 g of the high-purity silicic acid solution was added over 18 hours, and the mixture after completion of addition was kept at 87° C. for ripening, to thereby obtain a silica particle dispersion, which was found, by image analysis, to have an average particle size of 45 nm.

The obtained silica particle dispersion was cooled down to 40° C., and condensed using a ultrafiltration membrane (SIP1013, from Asahi Kasei Corporation) up to a $SiO_2$ concentration of 12 mass %.

«Preparation of Silica Particle Dispersion (Average Particle Size of Silica Particle: 70 nm)»

To 705 g of pure water kept stirred, added was 705 g of silica particle dispersion ($SiO_2$ concentration: 12 mass %) in which silica particle, whose average particle size was found by image analysis to be 45 nm, is dispersed in a solvent. Next, 50 g of 15% ammonia water was added, and the mixture was then heated up to 87° C., and kept for 30 minutes.

Next, 7,168 g of the high-purity silicic acid solution was added over 18 hours, and the mixture after completion of addition was kept at 87° C. for ripening, to thereby obtain a silica particle dispersion, in which silica particle, whose average particle size was found by image analysis to be 70 nm, is dispersed in a solvent.

The obtained silica particle dispersion was cooled down to 40° C., and condensed using a ultrafiltration membrane (SIP1013, from Asahi Kasei Corporation) up to a $SiO_2$ concentration of 12 mass %.

«Preparation of Silica Particle Dispersion (Average Particle Size of Silica Particle: 96 nm)»

To 1,081 g of pure water kept stirred, added was 1,081 g of silica particle dispersion ($SiO_2$ concentration: 12 mass %) in which silica particle, whose average particle size was found by image analysis to be 70 nm, is dispersed in a solvent. Next, 50 g of 15% ammonia water was added, the mixture was then heated up to 87° C., and kept for 30 minutes.

Next, 6,143 g of the high-purity silicic acid solution was added over 18 hours, and the mixture after completion of addition was kept at 87° C. for ripening, to thereby obtain a silica particle dispersion, in which silica particle, whose average particle size was found by image analysis to be 96 nm, is dispersed in a solvent.

The obtained silica particle dispersion was cooled down to 40° C., and condensed using a ultrafiltration membrane (SIP1013, from Asahi Kasei Corporation) up to a $SiO_2$ concentration of 12 mass %. To the thus condensed silica particle dispersion, an anion exchange resin SANUP B, from Mitsubishi Chemical Corporation, was added to remove anion.

[Preparatory Step 4]

Ultrapure water was added to the high-purity 113 nm silica particle dispersion obtained in Preparatory Step 1, to obtain 6,000 g of liquid A-1 with a $SiO_2$ solid matter concentration of 3 mass %.

Next, deionized water was added to cerium(III) nitrate hexahydrate (grade 4N high-purity reagent, from Kanto Chemical Co., Inc.), to obtain liquid B-1 with a concentration of 2.5 mass % in terms of $CeO_2$.

Next, liquid A-1 (6,000 g) was adjusted to 10° C. and kept stirred, to which liquid B-1 (8,453 g, equivalent to 117.4 parts by mass $CeO_2$ per 100 parts by mass of $SiO_2$) was added over 18 hours. During the process, the liquid temperature was kept at 10° C., and pH was kept at 8.7 to 8.8 using 3% ammonia water as necessary. The mixed liquid was kept aerated during addition of liquid B-1 and during ripening, so as to keep the redox potential to 50 to 500 mV.

After completion of addition of liquid B-1, the mixed liquid was ripened for 4 hours, while keeping the liquid temperature at 10° C. After the ripening, the mixed liquid was washed using an ultrafiltration membrane while feeding deionized water. A precursor particle dispersion obtained after washing was found to have a solid matter concentration of 4.9 mass %, a pH of 6.3 (at 25° C.), and a conductivity of 70 μs/cm (at 25° C.).

Next, a 5 mass % aqueous acetic acid solution was added to the thus obtained precursor particle dispersion so as to adjust pH to 6.5, the mixture was dried in a drying oven at 100° C. for 16 hours, and then fired in a muffle furnace at 1021° C. for 2 hours, to thereby obtain a powdery fired product.

Preparatory Step 5

Ultrapure water was added to the silica particle dispersion (average particle size of silica particle: 96 nm) obtained in Preparatory Step 3, to thereby obtain liquid A-2 with a $SiO_2$ solid matter concentration of 3 mass %.

Next, deionized water was added to cerium(III) nitrate hexahydrate (grade 4N high-purity reagent, from Kanto Chemical Co., Inc.), to obtain liquid B-2 with a concentration of 3.0 mass % in terms of $CeO_2$.

Next, 6,000 g of liquid A-2 (180 g, on dry basis) was adjusted to 10° C. and kept stirred, to which 7186.7 g of liquid B-2 (215.6 g, on dry basis) was added over 18 hours. During the process, the liquid temperature was kept at 10° C., and pH was kept at 7.6 using 3% ammonia water as necessary. After completion of addition, the mixed liquid was ripened for 4 hours, while keeping the liquid temperature at 10° C. The mixed liquid was kept aerated during addition of liquid B-2 and during ripening, so as to keep the redox potential to 100 to 200 mV. After completion of ripening, the mixed liquid was allowed to cool at room temperature, and after being cooled down to room temperature, washed using an ultrafiltration membrane while feeding deionized water, to thereby obtain a washed dispersion (precursor particle dispersion).

Next, a 5 mass % aqueous acetic acid solution was added to the washed dispersion (precursor particle dispersion) so as to adjust pH to 6.5, the mixture was dried in a drying oven at 100° C. for 16 hours, and then fired in a muffle furnace at 1042° C. for 2 hours, to thereby obtain a powdery fired product.

Example 1

In a 1 L side-arm beaker, 310 g of the fired product obtained in Preparatory Step 4, and 430 g of deionized water were placed, to which 3% ammonia water was added, kept stirred, and sonicated in a ultrasonic bath for 10 minutes, to thereby obtain a suspension with pH10 (at 25° C.).

Next, into a crusher (LMZ06, from Ashizawa Finetech Ltd.) preliminarily cleaned and flushed with water, 595 g of 0.25 mm diameter quartz bead was placed, and the suspension was filled in a charge tank of the crusher (ratio of filling: 85%). Taking deionized water that remains in a crushing chamber and piping of the crusher into account, the concentration during crushing is estimated to be 25 mass %. Wet crushing was then conducted under conditions including a peripheral speed of disk of the crusher of 12 m/sec, the number of times of passes of 25 times, and a residence time per pass of 0.43 minutes. For every pass, 3% ammonia water was added to keep pH of the suspension during crushing to 10. A crushed fired product dispersion with a solid matter concentration of 22 mass % was thus obtained.

Next, 29 mass % ammonia water (first grade, from Kanto Chemical Co., Inc.) was diluted with deionized water, to thereby prepare 1 mass % ammonia water. Meanwhile, the high-purity silicic acid solution obtained in Preparatory Step 2 was diluted with deionized water, to thereby obtain 0.2 mass % diluted high-purity silicic acid solution.

Next, deionized water was added to the crushed fired product dispersion with a solid matter concentration of 22 mass %, to thereby obtain a 0.5 mass % diluted solution (also referred to as liquid C-1, hereinafter). While stirring 10,000 g (50 g, on the dry basis) of liquid C-1 at room temperature, 15 g (0.03 g, on dry basis) of the 0.2 mass % diluted high-purity silicic acid solution was added, and after completion of addition, the mixture was further kept stirred for 10 minutes. Thereafter, 1 mass % ammonia water was added so as to adjust pH to 9.5, the mixture was then heated to 50° C., and kept stirred at this temperature for 24 hours. The mixture was then cooled down to room temperature, and condensed to 3.0 mass % using a rotary evaporator.

The thus obtained particle dispersion was centrifuged using a centrifugal machine (Model "CR21G", from Koki Holdings Co., Ltd.) at a relative centrifugal acceleration of 675 G for one minute so as to remove a sediment fraction, to thereby obtain a ceria-based composite particle dispersion.

Next, polishing test was conducted using the thus obtained ceria-based composite particle dispersion.

Average particle size of silica-based particle (mother particle) contained in the silica-based particle dispersion used as a starting material, and content ratios of impurities are summarized in Table 1. Content ratios of impurities contained in the ceria-based composite particle dispersion (content ratios of impurities relative to ceria-based composite particle on dry basis) are summarized in Table 2. Content ratio of silica and content ratio of ceria contained in the ceria-based composite particle dispersion (content in parts by mass of ceria, per 100 parts by mass of silica), firing temperature, average crystallite size of ceria-based composite particle, crystal type, specific surface area, average particle size of ceria-based composite particle, ratio of easily-soluble layer in composite particle (ratio of dissolution per unit dry weight of composite particle), and measurement results of polishing performance are summarized in Table 3. The same will apply to Examples and Comparative Examples described below.

Example 2

In a 1 L side-arm beaker, 310 g of the fired product obtained in Preparatory Step 4 and 430 g of deionized water were placed, to which 3% ammonia water was added, kept stirred, and sonicated in a ultrasonic bath for 10 minutes, to thereby obtain a suspension with pH10.5.

Next, into a crusher (LMZ06, from Ashizawa Finetech Ltd.) preliminarily cleaned and flushed with water, 595 g of 0.25 mm diameter quartz bead was placed, and the suspension was filled in a charge tank of the crusher (ratio of filling: 85%). Taking deionized water that remains in a crushing chamber and piping of the crusher into account, the concentration during crushing is estimated to be 25 mass %. Wet crushing was then conducted under conditions including a peripheral speed of disk of the crusher of 10 m/sec, and the number of times of passes of 69 times. For every pass, 3% ammonia water was added to keep pH of the suspension during crushing to 10.5. A crushed fired product dispersion with a solid matter concentration of 22 mass % was thus obtained.

Next, deionized water was added to the crushed fired product dispersion with a solid matter concentration of 22 mass %, to thereby obtain a 0.5 mass % diluted solution (also referred to as liquid C-2, hereinafter). While stirring 10,000 g (50 g, on dry basis) of liquid C-2 at room temperature, 100 g (0.2 g, on dry basis) of the 0.2 mass % diluted high-purity silicic acid solution, obtained by diluting the high-purity silicic acid solution obtained in Preparatory Step 2 with deionized water, was added as the silica-containing additive, and after completion of addition, the mixture was further kept stirred for 10 minutes. Thereafter, 1 mass % ammonia water was added so as to adjust pH to 9.5, the mixture was then heated to 50° C., and kept stirred at this temperature for 24 hours. The mixture was then cooled down to room temperature, and condensed to 3.0 mass % using a rotary evaporator, to thereby obtain a crushed fired product dispersion.

The thus obtained condensed liquid (crushed fired product dispersion) was centrifuged using a centrifugal machine (Model "CR21G", from Koki Holdings Co., Ltd.) at a relative centrifugal acceleration of 675 G for one minute so as to remove a sediment fraction, to thereby obtain a ceria-based composite particle dispersion.

Example 3

Ultrapure water was added to liquid A (silica-based particle dispersion) obtained in Preparatory Step 1, to thereby prepare 5,994 g (179.8 g of dry $SiO_2$) of a dispersion with a $SiO_2$ solid matter concentration of 3 mass %. The liquid A will be referred to as liquid A-1 in Example 3.

Next, deionized water was added to cerium(III) nitrate hexahydrate (grade 4N high-purity reagent, from Kanto Chemical Co., Inc.), to thereby obtain an aqueous cerium nitrate solution (liquid B-2) with a concentration of 3.0 mass % in terms of $CeO_2$.

Next, liquid A-1 (6,000 g) was kept at 10° C. under stirring, to which liquid B-2 (7,186.7 g, corresponding to 215.6 g of dry $CeO_2$) was added over 18 hours. During the process, the liquid temperature was kept at 10° C., and pH was kept at 8.6 to 8.8 using 3% ammonia water as necessary. After completion of addition, the mixed liquid was ripened for 4 hours, while keeping the liquid temperature at 10° C. The mixed liquid was kept aerated during addition of liquid B-2 and during ripening, so as to keep the redox potential to 100 to 200 mV.

Thereafter the mixed liquid was washed using an ultrafiltration membrane, while feeding deionized water. The precursor particle dispersion obtained after washing was found to have a solid matter concentration of 4.7 mass %, a pH of 8.8 (at 25° C.), and a conductivity of 44 μs/cm (at 25° C.).

Next, the thus obtained precursor particle dispersion was dried in a drying oven at 120° C. for 16 hours, and then fired in a muffle furnace at 1107° C. for 2 hours, to thereby obtain a powder (fired product).

To 100 g of the powder (fired product) thus obtained after firing, 300 g of deionized water was added, further 3% ammonia water was added so as to adjust pH to 9.0, and the mixture was then subjected to wet crushing (batch type desk-top sand mill, from Kanpe Co., Ltd.) with 0.25 mm diameter quartz bead (from Daiken Chemical Co., Ltd.) for 120 minutes.

After the crushing, the bead was removed using a 44 mesh metal screen. The obtained dispersion X was found to have a solid matter concentration of 9.3 mass % and weighed 937 g. During crushing, pH of the dispersion was kept to 8.8 to 9.0, by adding ammonia water.

Next, deionized water was added to cerium(III) nitrate hexahydrate (from Chikamochi Pure Chemical Co., Ltd.), to prepare 70 g of a solution with a $CeO_2$ concentration of 0.2 mass %, and then 30 g of the 0.2 mass % high-purity silicic acid solution was added, to thereby obtain 100 g of a mixed liquid (liquid D-1) containing $CeO_2$ and $SiO_2$.

Then 10,000 g (50 g, on dry basis) of a dispersion, prepared by adding deionized water to dispersion X so as to adjust the concentration to 0.5 mass %, was kept stirred at room temperature, to which 100 g of 0.2 mass % liquid D-1 (0.2 g, on dry basis) was added, and after completion of addition, the mixture was kept stirred for 10 minutes. Thereafter, 1 mass % ammonia water was added so as to adjust pH to 9.5, the mixture was heated to 50° C. and kept stirred at this temperature for 24 hours. The mixture was then cooled down to room temperature, and condensed to 3.0 mass % using a rotary evaporator.

The thus obtained condensed liquid (crushed fired product dispersion) was centrifuged using a centrifugal machine (Model "CR21G", from Koki Holdings Co., Ltd.) at a relative centrifugal acceleration of 675 G for one minute so as to remove a sediment fraction, to thereby obtain a ceria-based composite particle dispersion.

Example 4

In Example 3, 100 g of liquid D-1 was added to 10,000 g of dispersion X. Now in Example 4, processes were conducted and evaluated in the same way as in Example 3, except that 200 g (0.4 g, on dry basis) of liquid D-1 was added to 10,000 g (50 g, on dry basis) of dispersion X.

Example 5

Deionized water was added to lanthanum chloride heptahydrate (97%), reagent grade from Wako Pure Chemical Industries, Ltd., to thereby prepare 140 g of a 0.2 mass % $La_2O_3$ solution, to which 60 g of the 0.2 mass % high-purity silicic acid solution was added, to thereby obtain 100 g of a mixed liquid (liquid D-2) that contains $La_2O_3$ and $SiO_2$.

In Example 3, 100 g of liquid D-2 was added to 10,000 g of dispersion X. Now in Example 5, processes were conducted and evaluated in the same way as in Example 3, except that 200 g (0.4 g, on dry basis) of liquid D-2 was added to 10,000 g of dispersion X.

Example 6

Deionized water was added to zirconium oxychloride octahydrate (industrial grade, from Taiyo Koko Co., Ltd., $ZrO_2$: 36%), to thereby prepare 70 g of a 0.2 mass % diluted $ZrO_2$ solution, to which 30 g of the 0.2 mass % high-purity silicic acid solution was added, to thereby obtain 100 g of a mixed liquid (liquid D-3) that contains $ZrO_2$ and $SiO_2$.

In a 1 L side-arm beaker, 310 g of the fired product obtained in Preparatory Step 4 and 430 g of deionized water were placed, to which 3% ammonia water was added, kept stirred, and sonicated in a ultrasonic bath for 10 minutes, to thereby obtain a suspension with pH10 (at 25° C.).

Next, into a crusher (LMZ06, from Ashizawa Finetech Ltd.) preliminarily cleaned and flushed with water, 595 g of 0.25 mm diameter quartz bead was placed, and the suspension was filled in a charge tank of the crusher (ratio of filling: 85%). Taking deionized water that remains in a crushing chamber and piping of the crusher into account, the concentration during crushing is estimated to be 25 mass %. Wet crushing was then conducted under conditions including a peripheral speed of disk of the crusher of 12 m/sec, the number of times of passes of 25 times, and a residence time per pass of 0.43 minutes. For every pass, 3% ammonia water was added to keep pH of the suspension during crushing to 10. A crushed fired product dispersion Y with a solid matter concentration of 22 mass % was thus obtained.

Then 10,000 g (50 g, on dry basis) of a dispersion, prepared by adding deionized water to the obtained dispersion Y so as to adjust the concentration to 0.5 mass %, was kept stirred at room temperature, to which 50 g of 0.2 mass % liquid D-3 (0.1 g, on dry basis) was added, and after completion of addition, the mixture was kept stirred for 10 minutes. Thereafter, 1 mass % ammonia water was added so as to adjust pH to 9.5, the mixture was heated to 50° C. and kept stirred at this temperature for 24 hours. The mixture was then cooled down to room temperature, and condensed to 3.0 mass % using a rotary evaporator.

The thus obtained condensed liquid (crushed fired product dispersion) was centrifuged using a centrifugal machine (Model "CR21G", from Koki Holdings Co., Ltd.) at a relative centrifugal acceleration of 675 G for one minute so as to remove a sediment fraction, to thereby obtain a ceria-based composite particle dispersion.

Example 7

In a 1 L side-arm beaker, 310 g of the fired product obtained in Preparatory Step 5 and 430 g of deionized water were placed, to which 3% ammonia water was added, kept stirred, and sonicated in a ultrasonic bath for 10 minutes, to thereby obtain a suspension with pH10.5 (at 25° C.).

Next, into a crusher (LMZ06, from Ashizawa Finetech Ltd.) preliminarily cleaned and flushed with water, 595 g of 0.25 mm diameter quartz bead was placed, and the suspension was filled in a charge tank of the crusher (ratio of filling: 85%). Taking deionized water that remains in a crushing chamber and piping of the crusher into account, the concentration during crushing is estimated to be 25 mass %. Wet crushing was then conducted under conditions including a peripheral speed of disk of the crusher of 12 m/sec, the number of times of passes of 25 times, and a residence time per pass of 0.43 minutes. For every pass, 3% ammonia water was added to keep pH of the suspension during crushing to 10.5. A crushed fired product dispersion with a solid matter concentration of 22 mass % was thus obtained.

The thus obtained condensed liquid (crushed fired product dispersion) was centrifuged using a centrifugal machine (Model "CR21G", from Koki Holdings Co., Ltd.) at a relative centrifugal acceleration of 675 G for one minute so as to remove a sediment fraction, to thereby obtain a ceria-based composite particle dispersion.

The ceria-based composite particle contained in the ceria-based composite particle dispersion obtained in Example 7 was observed under a SEM and a TEM. FIG. 3(a) shows an SEM image, and FIG. 3(b) shows a TEM image. As seen in FIG. 3, a thin silica film (cerium-containing silica layer) was observed to cover the topmost surface of a ceria-based composite particle. From the SEM image, the cerium-containing silica layer was observed to cover the surface of silica, and the layer was observed to have the child particles dispersed therein.

The ceria-based composite particle contained in the ceria-based composite particle dispersion obtained in Example 7 was analyzed by X-ray diffractometry to obtain an X-ray diffraction pattern. The obtained X-ray diffraction pattern is shown in FIG. 4. As seen in FIG. 4, a considerably sharp crystal pattern of cerianite was observed in the X-ray diffraction pattern.

Example 8

The processes were conducted in the same way as in Example 1, except that a polishing slurry with a solid matter concentration of 1.0 mass % and an ammonium nitrate concentration of 1000 ppm was prepared by adding ammonium and deionized water to the ceria-based composite particle obtained in Example 1 (solid matter concentration: 3.0 mass %).

Example 9

The processes were conducted in the same way as in Example 8, except that ammonium acetate was used in Example 9, in place of ammonium nitrate used in Example 8.

Example 10

Ammonium polyacrylate (first grade, from Wako Pure Chemical Industries, Ltd., average molecular weight: ca. 5,000) and deionized water were added to the ceria-based composite particle obtained in Example 1 (solid matter concentration: 3.0 mass %), so as to adjust the solid matter concentration to 1.0 mass % and the ammonium polyacrylate concentration to 500 ppm, followed by sonication for dispersion. Using the thus obtained the polishing slurry, the processes were conducted in the same way as in Example 1.

Comparative Example 1

Ultrapure water was added to the 113 nm high-purity silica particle dispersion obtained in Preparatory Step 1, to thereby obtain 6,000 g of liquid A-1 with a $SiO_2$ solid matter concentration of 3 mass %.

Next, deionized water was added to cerium(III) nitrate hexahydrate (grade 4N high-purity reagent, from Kanto Chemical Co., Inc.), to obtain liquid B-1 with a concentration of 2.5 mass % in terms of $CeO_2$.

Next, liquid A-1 (6,000 g) was heated to 50° C. and kept stirred, to which liquid B-1 (8,453 g, corresponding to 117.4 parts by mass of $CeO_2$ per 100 parts by mass of $SiO_2$) was added over 18 hours. During the process, the liquid temperature was kept at 50° C., and pH was kept at 7.8 using 3% ammonia water as necessary. The mixed liquid was kept aerated during addition of liquid B-1 and during ripening, so as to keep the redox potential at a positive value.

After completion of addition of liquid B-1, the liquid temperature was elevated to 93° C., and the mixed liquid was ripened for 4 hours. After completion of the ripening, the mixed liquid was allowed to stand in a room so as to be cooled down to room temperature, and then washed using an ultrafiltration membrane, while feeding deionized water. The precursor particle dispersion obtained after washing was found to have a solid matter concentration of 7 mass %.

Next, the thus obtained precursor particle dispersion was adjusted to pH6.5 using a 5 mass % aqueous acetic acid solution, dried in a drying oven at 100° C. for 16 hours, and then fired in a muffle furnace at 1090° C. for 2 hours, to thereby obtain a powdery fired product.

In a 1 L side-arm beaker, 310 g of the fired product and 430 g of deionized water were placed, to which 3% ammonia water was added, kept stirred, and sonicated in a ultrasonic bath for 10 minutes, to thereby obtain a suspension with pH8.4 (at 25° C.).

Next, into a crusher (LMZ06, from Ashizawa Finetech Ltd.) preliminarily cleaned and flushed with water, 595 g of 0.25 mm diameter quartz bead was placed, and the suspension was filled in a charge tank of the crusher (ratio of filling: 85%). Taking deionized water that remains in a crushing chamber and piping of the crusher into account, the concentration during crushing is estimated to be 25 mass %. Wet crushing was then conducted under conditions including a peripheral speed of disk of the crusher of 12 m/sec, the number of times of passes of 25 times, and a residence time per pass of 0.43 minutes. For every pass, 3% ammonia water was added to keep pH of the suspension during crushing to 8.4. A crushed fired product dispersion with a solid matter concentration of 22 mass % was thus obtained.

The thus obtained condensed liquid (crushed fired product dispersion) was centrifuged using a centrifugal machine (Model "CR21G", from Koki Holdings Co., Ltd.) at a relative centrifugal acceleration of 675 G for one minute so as to remove a sediment fraction, to thereby obtain a ceria-based composite particle dispersion.

Comparative Example 2

In a 1 L side-arm beaker, 310 g of the fired product obtained in Preparatory Step 4 and 430 g of deionized water were placed, to which 3% ammonia water was added, kept stirred, and sonicated in a ultrasonic bath for 10 minutes, to thereby obtain a suspension with pH10.5.

Next, into a crusher (LMZ06, from Ashizawa Finetech Ltd.) preliminarily cleaned and flushed with water, 595 g of 0.25 mm diameter quartz bead was placed, and the suspension was filled in a charge tank of the crusher (ratio of filling: 85%). Taking deionized water that remains in a crushing chamber and piping of the crusher into account, the concentration during crushing is estimated to be 25 mass %. Wet crushing was then conducted under conditions including a peripheral speed of disk of the crusher of 10 m/sec, and the number of times of passes of 69 times. For every pass, 3% ammonia water was added to keep pH of the suspension during crushing to 10.5. A crushed fired product dispersion with a solid matter concentration of 22 mass % was thus obtained.

Next, deionized water was added to the crushed fired product dispersion so as to adjust the concentration to 3.0 mass %, then centrifuged using a centrifugal machine at 24000 G for 3 minutes, to thereby collect a sediment fraction while discarding a silica-containing supernatant.

Deionized water was then added to the sediment fraction so as to adjust the concentration to 10 mass %, the sediment fraction was broken up with a spatula, and sonicated in a ultrasonic bath for 20 minutes, to thereby obtain a sediment fraction dispersion (sediment fraction dispersion ($\alpha$)). The sediment fraction dispersion ($\alpha$) was regarded as the ceria-based composite particle, and evaluated.

Comparative Example 3

The fired powder obtained in Preparatory Step 5, amounting 134 g, was subjected to dry crushing using Nano Jetmizer JF-50 from Aishin Nano Technologies Co., Ltd., at a throughput of 2 g/min, a pushing pressure of 1.5 MPa, and a crushing pressure of 0.4 MPa, to thereby obtain 121 g of a powder. The powder was regarded as the ceria-based composite particle, and evaluated.

The composite particle contained in the composite particle dispersion obtained in Comparative Example 3 was observed under a SEM and a TEM. FIG. 5($a$) shows an SEM image, and FIG. 5($b$) shows a TEM image.

The composite particle contained in the composite particle dispersion obtained in Comparative Example 3 was analyzed by X-ray diffractometry to obtain an X-ray diffraction pattern. The obtained X-ray diffraction pattern is shown in FIG. 6.

Comparative Example 4

Prepared was 3.63 kg of a 0.7 mass % ammonia water, and was heated to 93° C. (liquid A). Next, prepared was 5.21 kg of cerium nitrate solution (liquid B) with a concentration of 1.6 mass % in terms of $CeO_2$. Liquid B was added to liquid A over one hour. After completion of addition, the mixture was kept at 93° C. and ripened for 3 hours. The liquid after being ripened was found to have a pH of 8.4. The ripened liquid was cooled, centrifuged at a relative centrifugal acceleration of 5000 G, and the supernatant was discarded. Deionized water was added to the sediment cake and stirred for re-slurrying, and again the slurry was centrifuged at a relative centrifugal acceleration of 5000 G. These processes were repeated until the conductivity of slurry is reduced down to 100 µS/cm or below. The slurry with the conductivity reduced down to 100 µS/cm or below was then adjusted to have a solid matter concentration of 6.0 mass %, and then sonicated, to thereby obtain a ceria particle dispersion.

The obtained ceria particle dispersion was found to have an average particle size of 117 nm.

X-ray analysis of crystallite size and crystal type revealed that the crystallite size was 18 nm, and the crystal type was that of cerianite.

The ceria particle dispersion was adjusted to pH5.0 with nitric acid, to thereby prepare a polishing abrasive particle dispersion with a solid matter concentration of 0.6 mass %. The polishing abrasive particle dispersion was used for polishing of a thermal oxide film. Results are summarized in Tables 1 to 3.

Experiment 2

[Quantification of Easily Soluble Silica-Containing Layer]

To each of the ceria-based composite particles obtained in the individual Examples and Comparative Examples, deionized water was added to adjust the concentration to 3.3 mass %, and 81.8 g (2.7 g, on dry basis) of each mixture was kept stirred, pH was adjusted to 9.0 using a 0.1 mass % diluted aqueous sodium hydroxide solution or 6% nitric acid, to which deionized water was further added, to a total weight of 90 g (2.7 g, on dry basis).

The mixture was kept stirred for 15 minutes, then 20 g of the mixture was placed in a centrifugal tube with an ultrafiltration membrane, Vivaspin 20 from Sartorius AG, and centrifuged using a centrifugal machine (H-38F, from Kokusan Co., Ltd.) at 1820 G for 30 minutes. After centrifugation, the liquid separated through the ultrafiltration membrane was collected, and the concentration of $SiO_2$ in the separated liquid was measured. Ratio of the easily-soluble layer (ratio of dissolution per unit dry weight of composite particle) was determined from the equation below.

Ratio of easily-soluble layer (%)=$SiO_2$ concentration (ppm)÷1,000,000×87.3 g÷2.7 g×100

Results are summarized in Table 3.

TABLE 1

| | Object to be measured | | Unit | Example 1 | Example 2 | Example 3 | Example 4 | Example 5 | Example 6 | Example 7 |
|---|---|---|---|---|---|---|---|---|---|---|
| Silica-based particle (mother particle) | Average particle size of silica particle (mother particle) | | nm | 113 | 113 | 113 | 113 | 113 | 113 | 96 |
| | Percentage of abundance of silica particle (mother particle) with SD/LD ≤0.8 | | % | 0 | 0 | 0 | 0 | 0 | 0 | 0 |
| | Impurity content of silica-based particle (mother particle) (dry basis) | Na | ppm | ≤1 ppm | ≤1 ppm | ≤1 ppm | ≤1 ppm | ≤1 ppm | ≤1 ppm | 42 |
| | | Ag | ppm | ≤1 ppm | ≤1 ppm | ≤1 ppm | ≤1 ppm | ≤1 ppm | ≤1 ppm | ≤1 ppm |
| | | Al | ppm | ≤1 ppm | ≤1 ppm | ≤1 ppm | ≤1 ppm | ≤1 ppm | ≤1 ppm | 83 |
| | | Ca | ppm | ≤1 ppm | ≤1 ppm | ≤1 ppm | ≤1 ppm | ≤1 ppm | ≤1 ppm | 17 |
| | | Cr | ppm | ≤1 ppm | ≤1 ppm | ≤1 ppm | ≤1 ppm | ≤1 ppm | ≤1 ppm | ≤1 ppm |
| | | Cu | ppm | ≤1 ppm | ≤1 ppm | ≤1 ppm | ≤1 ppm | ≤1 ppm | ≤1 ppm | ≤1 ppm |
| | | Fe | ppm | ≤1 ppm | ≤1 ppm | ≤1 ppm | ≤1 ppm | ≤1 ppm | ≤1 ppm | 17 |
| | | K | ppm | ≤1 ppm | ≤1 ppm | ≤1 ppm | ≤1 ppm | ≤1 ppm | ≤1 ppm | ≤1 ppm |
| | | Mg | ppm | ≤1 ppm | ≤1 ppm | ≤1 ppm | ≤1 ppm | ≤1 ppm | ≤1 ppm | ≤1 ppm |
| | | Ni | ppm | ≤1 ppm | ≤1 ppm | ≤1 ppm | ≤1 ppm | ≤1 ppm | ≤1 ppm | ≤1 ppm |
| | | Ti | ppm | ≤1 ppm | ≤1 ppm | ≤1 ppm | ≤1 ppm | ≤1 ppm | ≤1 ppm | 75 |
| | | Zn | ppm | ≤1 ppm | ≤1 ppm | ≤1 ppm | ≤1 ppm | ≤1 ppm | ≤1 ppm | ≤1 ppm |
| | | U | ppm | ≤1 ppm | ≤1 ppm | ≤1 ppm | ≤1 ppm | ≤1 ppm | ≤1 ppm | ≤1 ppm |
| | | Th | ppm | ≤1 ppm | ≤1 ppm | ≤1 ppm | ≤1 ppm | ≤1 ppm | ≤1 ppm | ≤1 ppm |
| | | $SO_4$ | ppm | ≤1 ppm | ≤1 ppm | ≤1 ppm | ≤1 ppm | ≤1 ppm | ≤1 ppm | ≤1 ppm |
| | | $NO_3$ | ppm | ≤1 ppm | ≤1 ppm | ≤1 ppm | ≤1 ppm | ≤1 ppm | ≤1 ppm | ≤1 ppm |
| | | Cl | ppm | ≤1 ppm | ≤1 ppm | ≤1 ppm | ≤1 ppm | ≤1 ppm | ≤1 ppm | ≤1 ppm |
| | | F | ppm | ≤1 ppm | ≤1 ppm | ≤1 ppm | ≤1 ppm | ≤1 ppm | ≤1 ppm | ≤1 ppm |

| | Object to be measured | | Unit | Example 8 | Example 9 | Example 10 | Comparative Example 1 | Comparative Example 2 | Comparative Example 3 | Comparative Example 4 |
|---|---|---|---|---|---|---|---|---|---|---|
| Silica-based particle (mother particle) | Average particle size of silica particle (mother particle) | | nm | 113 | 113 | 113 | 113 | 113 | 96 | — |
| | Percentage of abundance of silica particle (mother particle) with SD/LD ≤0.8 | | % | 0 | 0 | 0 | 0 | 0 | 0 | — |
| | Impurity content of silica-based particle (mother particle) (dry basis) | Na | ppm | ≤1 ppm | ≤1 ppm | ≤1 ppm | ≤1 ppm | ≤1 ppm | 42 | — |
| | | Ag | ppm | ≤1 ppm | ≤1 ppm | ≤1 ppm | ≤1 ppm | ≤1 ppm | ≤1 ppm | — |
| | | Al | ppm | ≤1 ppm | ≤1 ppm | ≤1 ppm | ≤1 ppm | ≤1 ppm | 83 | — |
| | | Ca | ppm | ≤1 ppm | ≤1 ppm | ≤1 ppm | ≤1 ppm | ≤1 ppm | 17 | — |
| | | Cr | ppm | ≤1 ppm | ≤1 ppm | ≤1 ppm | ≤1 ppm | ≤1 ppm | ≤1 ppm | — |
| | | Cu | ppm | ≤1 ppm | ≤1 ppm | ≤1 ppm | ≤1 ppm | ≤1 ppm | ≤1 ppm | — |
| | | Fe | ppm | ≤1 ppm | ≤1 ppm | ≤1 ppm | ≤1 ppm | ≤1 ppm | 17 | — |
| | | K | ppm | ≤1 ppm | ≤1 ppm | ≤1 ppm | ≤1 ppm | ≤1 ppm | ≤1 ppm | — |
| | | Mg | ppm | ≤1 ppm | ≤1 ppm | ≤1 ppm | ≤1 ppm | ≤1 ppm | ≤1 ppm | — |
| | | Ni | ppm | ≤1 ppm | ≤1 ppm | ≤1 ppm | ≤1 ppm | ≤1 ppm | ≤1 ppm | — |
| | | Ti | ppm | ≤1 ppm | ≤1 ppm | ≤1 ppm | ≤1 ppm | ≤1 ppm | 75 | — |
| | | Zn | ppm | ≤1 ppm | ≤1 ppm | ≤1 ppm | ≤1 ppm | ≤1 ppm | ≤1 ppm | — |
| | | U | ppm | ≤1 ppm | ≤1 ppm | ≤1 ppm | ≤1 ppm | ≤1 ppm | ≤1 ppm | — |
| | | Th | ppm | ≤1 ppm | ≤1 ppm | ≤1 ppm | ≤1 ppm | ≤1 ppm | ≤1 ppm | — |
| | | $SO_4$ | ppm | ≤1 ppm | ≤1 ppm | ≤1 ppm | ≤1 ppm | ≤1 ppm | ≤1 ppm | — |
| | | $NO_3$ | ppm | ≤1 ppm | ≤1 ppm | ≤1 ppm | ≤1 ppm | ≤1 ppm | ≤1 ppm | — |
| | | Cl | ppm | ≤1 ppm | ≤1 ppm | ≤1 ppm | ≤1 ppm | ≤1 ppm | ≤1 ppm | — |
| | | F | ppm | ≤1 ppm | ≤1 ppm | ≤1 ppm | ≤1 ppm | ≤1 ppm | ≤1 ppm | — |

TABLE 2

| | Object to be measured | | Unit | Example 1 | Example 2 | Example 3 | Example 4 | Example 5 | Example 6 | Example 7 |
|---|---|---|---|---|---|---|---|---|---|---|
| Ceria-based composite particle | Impurity content of ceria-based composite particle (dry basis) | Na | ppm | ≤1 ppm | ≤1 ppm | ≤1 ppm | ≤1 ppm | ≤1 ppm | ≤1 ppm | 19 |
| | | Ag | ppm | ≤1 ppm | ≤1 ppm | ≤1 ppm | ≤1 ppm | ≤1 ppm | ≤1 ppm | ≤1 ppm |
| | | Al | ppm | ≤1 ppm | ≤1 ppm | ≤1 ppm | ≤1 ppm | ≤1 ppm | ≤1 ppm | 38 |
| | | Ca | ppm | ≤1 ppm | ≤1 ppm | ≤1 ppm | ≤1 ppm | ≤1 ppm | ≤1 ppm | 8 |
| | | Cr | ppm | ≤1 ppm | ≤1 ppm | ≤1 ppm | ≤1 ppm | ≤1 ppm | ≤1 ppm | ≤1 ppm |
| | | Cu | ppm | ≤1 ppm | ≤1 ppm | ≤1 ppm | ≤1 ppm | ≤1 ppm | ≤1 ppm | ≤1 ppm |
| | | Fe | ppm | ≤1 ppm | ≤1 ppm | ≤1 ppm | ≤1 ppm | ≤1 ppm | ≤1 ppm | 8 |
| | | K | ppm | ≤1 ppm | ≤1 ppm | ≤1 ppm | ≤1 ppm | ≤1 ppm | ≤1 ppm | ≤1 ppm |
| | | Mg | ppm | ≤1 ppm | ≤1 ppm | ≤1 ppm | ≤1 ppm | ≤1 ppm | ≤1 ppm | ≤1 ppm |
| | | Ni | ppm | ≤1 ppm | ≤1 ppm | ≤1 ppm | ≤1 ppm | ≤1 ppm | ≤1 ppm | ≤1 ppm |
| | | Ti | ppm | ≤1 ppm | ≤1 ppm | ≤1 ppm | ≤1 ppm | ≤1 ppm | ≤1 ppm | 35 |
| | | Zn | ppm | ≤1 ppm | ≤1 ppm | ≤1 ppm | ≤1 ppm | ≤1 ppm | ≤1 ppm | ≤1 ppm |
| | | U | ppm | ≤1 ppm | ≤1 ppm | ≤1 ppm | ≤1 ppm | ≤1 ppm | ≤1 ppm | ≤1 ppm |
| | | Th | ppm | ≤1 ppm | ≤1 ppm | ≤1 ppm | ≤1 ppm | ≤1 ppm | ≤1 ppm | ≤1 ppm |
| | | $SO_4$ | ppm | ≤1 ppm | ≤1 ppm | ≤1 ppm | ≤1 ppm | ≤1 ppm | ≤1 ppm | ≤1 ppm |
| | | $NO_3$ | ppm | ≤1 ppm | ≤1 ppm | ≤1 ppm | ≤1 ppm | ≤1 ppm | ≤1 ppm | ≤1 ppm |
| | | Cl | ppm | ≤1 ppm | ≤1 ppm | ≤1 ppm | ≤1 ppm | ≤1 ppm | ≤1 ppm | ≤1 ppm |
| | | F | ppm | ≤1 ppm | ≤1 ppm | ≤1 ppm | ≤1 ppm | ≤1 ppm | ≤1 ppm | ≤1 ppm |

| | Object to be measured | | Unit | Example 8 | Example 9 | Example 10 | Comparative Example 1 | Comparative Example 2 | Comparative Example 3 | Comparative Example 4 |
|---|---|---|---|---|---|---|---|---|---|---|
| Ceria-based composite particle | Impurity content of ceria-based composite particle (dry basis) | Na | ppm | ≤1 ppm | ≤1 ppm | ≤1 ppm | ≤1 ppm | ≤1 ppm | 19 | ≤1 ppm |
| | | Ag | ppm | ≤1 ppm | ≤1 ppm | ≤1 ppm | ≤1 ppm | ≤1 ppm | ≤1 ppm | ≤1 ppm |
| | | Al | ppm | ≤1 ppm | ≤1 ppm | ≤1 ppm | ≤1 ppm | ≤1 ppm | 38 | ≤1 ppm |
| | | Ca | ppm | ≤1 ppm | ≤1 ppm | ≤1 ppm | ≤1 ppm | ≤1 ppm | 8 | ≤1 ppm |
| | | Cr | ppm | ≤1 ppm | ≤1 ppm | ≤1 ppm | ≤1 ppm | ≤1 ppm | ≤1 ppm | ≤1 ppm |
| | | Cu | ppm | ≤1 ppm | ≤1 ppm | ≤1 ppm | ≤1 ppm | ≤1 ppm | ≤1 ppm | ≤1 ppm |
| | | Fe | ppm | ≤1 ppm | ≤1 ppm | ≤1 ppm | ≤1 ppm | ≤1 ppm | 8 | ≤1 ppm |
| | | K | ppm | ≤1 ppm | ≤1 ppm | ≤1 ppm | ≤1 ppm | ≤1 ppm | ≤1 ppm | ≤1 ppm |
| | | Mg | ppm | ≤1 ppm | ≤1 ppm | ≤1 ppm | ≤1 ppm | ≤1 ppm | ≤1 ppm | ≤1 ppm |
| | | Ni | ppm | ≤1 ppm | ≤1 ppm | ≤1 ppm | ≤1 ppm | ≤1 ppm | ≤1 ppm | ≤1 ppm |
| | | Ti | ppm | ≤1 ppm | ≤1 ppm | ≤1 ppm | ≤1 ppm | ≤1 ppm | 35 | ≤1 ppm |
| | | Zn | ppm | ≤1 ppm | ≤1 ppm | ≤1 ppm | ≤1 ppm | ≤1 ppm | ≤1 ppm | ≤1 ppm |
| | | U | ppm | ≤1 ppm | ≤1 ppm | ≤1 ppm | ≤1 ppm | ≤1 ppm | ≤1 ppm | ≤1 ppm |
| | | Th | ppm | ≤1 ppm | ≤1 ppm | ≤1 ppm | ≤1 ppm | ≤1 ppm | ≤1 ppm | ≤1 ppm |
| | | $SO_4$ | ppm | ≤1 ppm | ≤1 ppm | ≤1 ppm | ≤1 ppm | ≤1 ppm | ≤1 ppm | ≤1 ppm |
| | | $NO_3$ | ppm | ≤1 ppm | ≤1 ppm | ≤1 ppm | ≤1 ppm | ≤1 ppm | ≤1 ppm | ≤1 ppm |
| | | Cl | ppm | ≤1 ppm | ≤1 ppm | ≤1 ppm | ≤1 ppm | ≤1 ppm | ≤1 ppm | ≤1 ppm |
| | | F | ppm | ≤1 ppm | ≤1 ppm | ≤1 ppm | ≤1 ppm | ≤1 ppm | ≤1 ppm | ≤1 ppm |

TABLE 3

| | Object to be measured | Unit | Example 1 | Example 2 | Example 3 | Example 4 | Example 5 | Example 6 | Example 7 |
|---|---|---|---|---|---|---|---|---|---|
| Ceria-based composite particle | $SiO_2$ content ratio in ceria-based composite particle (mass %) | % | 46.03 | 46.22 | 45.44 | 45.38 | 45.63 | 46.03 | 45.50 |
| | $CeO_2$ content ratio in ceria-based composite particle (mass %) | % | 53.97 | 53.78 | 54.56 | 54.62 | 54.37 | 53.97 | 54.50 |
| | Mass (parts) of ceria per 100 parts by mass of silica | | 117.2 | 116.5 | 120.1 | 120.4 | 119.2 | 117.2 | 119.8 |

TABLE 3-continued

|  |  | | | | | | | | |
|---|---|---|---|---|---|---|---|---|---|
|  | Firing temperature | — | 1021 | 1021 | 1107 | 1107 | 1107 | 1021 | 1042 |
|  | Crystallite size | nm | 15.0 | 15 | 20.8 | 20.8 | 20.8 | 15.0 | 14.4 |
|  | Geometric mean particle size of child particle | nm | 15.3 | 15.3 | 24.6 | 24.6 | 24.6 | 15.3 | 16.2 |
|  | Standard deviation of ceria child particle size | nm | 2.7 | 2.7 | 5.3 | 5.3 | 5.3 | 2.7 | 3.4 |
|  | Coefficient of variation of ceria child particle size | % | 17.6 | 17.6 | 21.5 | 21.5 | 21.5 | 17.6 | 21.0 |
|  | Specific surface area of ceria-based composite particle | $m^2/s$ | 28 | 28 | 27 | 27 | 27 | 28 | 31 |
|  | Crystal type | — | Cerianite | Cerianite | Cerianite | Cerianite | Cerianite | Cerianite | Cerianite |
|  | Average particle size of ceria-based composite particle ($O_2$) | nm | 135 | 135 | 166 | 166 | 166 | 135 | 130 |
|  | Ratio of easily-soluble layer (D) (ratio of dissolution per unit dry weight of composite particle) | % | 0.165 | 0.517 | 0.236 | 0.388 | 0.356 | 0.158 | 0.268 |
| Polishing slurry | Additive | — | — | — | — | — | — | — | — |
|  | Amount of addition (to slurry) | ppm | — | — | — | — | — | — | — |
|  | Abrasive particle concentration | % | 0.6 | 0.6 | 0.6 | 0.6 | 0.6 | 0.6 | 0.6 |
|  | pH | — | 5 | 5 | 5 | 5 | 5 | 5 | 5 |
| Evaluation of polishing | $SiO_2$ insulating film — Polishing rate | nm/min | 551 | 531 | 794 | 818 | 640 | 523 | 547 |
|  | Surface roughness | nm | 0.11 | 0.11 | 0.12 | 0.12 | 0.12 | 0.11 | 0.11 |
|  | Polishing scratch | — | Polishing scratches not clearly observed | Polishing scratches not clearly observed | Polishing scratches not clearly observed | Polishing scratches not clearly observed | Polishing scratches not clearly observed | Polishing scratches not clearly observed | Polishing scratches not clearly observed |
|  | Aluminum hard disk | — | Very few | Very few | Very few | Very few | Very few | Very few | Very few |

| | Object to be measured | Unit | Example 8 | Example 9 | Example 10 | Comparative Example 1 | Comparative Example 2 | Comparative Example 3 | Comparative Example 4 |
|---|---|---|---|---|---|---|---|---|---|
| Ceria-based composite particle | $SiO_2$ content ratio in ceria-based composite particle (mass %) | % | 46.03 | 46.03 | 46.03 | 45.96 | 45.50 | 45.50 | 0.00 |
|  | $CaO_2$ content ratio in ceria-based composite particle (mass %) | % | 53.97 | 53.97 | 53.97 | 54.04 | 54.50 | 54.50 | 100.00 |

TABLE 3-continued

| | | | | | | | | |
|---|---|---|---|---|---|---|---|---|
| | Mass (parts) of ceria per 100 parts by mass of silica | | 117.2 | 117.2 | 117.2 | 117.6 | 119.8 | 119.8 | — |
| | Firing temperature | | — | 1021 | 1021 | 1021 | 1090 | 1021 | 1042 | — |
| | Crystallite size | nm | 15 | 15 | 15 | 15.0 | 15 | 14.4 | 18 |
| | Geometric mean particle size of child particle | nm | 15.3 | 15.3 | 15.3 | 15.3 | 15.3 | 16.2 | — |
| | Standard deviation of ceria child particle size | nm | 2.7 | 2.7 | 2.7 | 2.1 | 2.7 | 3.4 | — |
| | Coefficient of variation of ceria child particle size | % | 17.6 | 17.6 | 17.6 | 13.7 | 17.6 | 21.0 | — |
| | Specific surface area of ceria-based composite particle | $m^2/s$ | 28 | 28 | 28 | 37 | 28 | 31 | 47 |
| | Crystal type | — | Cerianite | Cerianite | Cerianite | Cerianite | Cerianite | Cerianite | Cerianite |
| | Average particle size of ceria-based composite particle ($O_2$) | nm | 135 | 135 | 135 | 142 | 135 | 259 | 117 |
| | Ratio of easily-soluble layer (D) (ratio of dissolution per unit dry weight of composite particle) | % | 0.165 | 0.165 | 0.165 | 0.052 | 0.061 | 0.026 | 0.000 |
| Polishing slurry | Additive | — | Ammonium nitrate | Ammonium acetate | Ammonium polyacrylate | — | — | — | — |
| | Amount of addition (to slurry) | ppm | 1000 | 500 | 500 | — | — | — | — |
| | Abrasive particle concentration | % | 0.6 | 0.6 | 0.6 | 0.6 | 0.6 | 0.6 | 0.6 |
| | pH | — | 5 | 5 | 5 | 5 | 5 | 5 | 5 |
| Evaluation of polishing | $SiO_2$ insulating film — Polishing rate | nm/min | 743 | 718 | 554 | 300 | 417 | 61 | 25 |
| | Surface roughness | nm | 0.11 | 0.11 | 0.11 | 0.11 | 0.11 | Polishing scratches numerous and uncountable | 0.14 |
| | Polishing scratch | — | Polishing scratches not clearly observed | Polishing scratches not clearly observed | Polishing scratches not clearly observed | Polishing scratches not clearly observed | Polishing scratches not clearly observed | Polishing scratches numerous | Observed |
| | Aluminum hard disk | — | Very few | Very few | Very few | Few | Few | Numerous | Few |

Experiment 3

Each of the ceria-based composite particle dispersions obtained in the individual Examples 1, 3, 5, 6 and Comparative Examples 3, 4 were measured regarding streaming potential, and were also subjected to cation colloidal titration. A titrator used here was an automatic titrator AT-510 (from Kyoto Electronics Manufacturing Co., Ltd.) equipped with a streaming potential titration unit (PCD-500).

First, to the ceria-based composite particle dispersion with the solid matter concentration preliminarily adjusted to 1 mass %, a 0.05% aqueous hydrochloric acid solution was added to adjust the pH to 6. Next, a volume of the mixture that corresponds to 0.8 g of solid content was placed in a 100 ml tall beaker, and the streaming potential was measured. The mixture was then titrated with a cation colloidal titrant (0.001N poly(diallyl dimethyl ammonium chloride) solution) at 5 second intervals, with an amount of injection per time of 0.2 ml, an injection rate of 2 seconds/ml, up to 20 ml in total. The amount of addition (ml) of the cation colloidal titrant was plotted on the X-axis, and the streaming potential (mV) of the ceria-based composite particle dispersion was plotted on the Y-axis, so as to determine streaming potential I (mV) at the start point of streaming potential curve, streaming potential C (mV) at a knick, and amount of addition V (ml) of the cation colloidal titrant at the knick, to thereby calculate $\Delta PCD/V=(I-C)/V$. Results are summarized in Table 4. The streaming potential curve was shown in FIG. 7.

TABLE 4

| | Example 1 | Example 3 | Example 5 | Example 6 | Comparative Example 3 | Comparative Example 4 |
|---|---|---|---|---|---|---|
| Streaming potential before measurement @pH6 (mV) | −333 | −386 | −218 | −416 | −295 | 261 |
| ΔPCD/V (mV/mL) | −48 | −31 | −34 | −59 | −508 | No knick |

Experiment 4

[Measurement of Solid-Solubilized State of Si]

The ceria-based composite particle dispersion and the ceria particle dispersions prepared in Example 2 and Comparative Example 4, respectively, were analyzed using an X-ray absorption spectrometer (R-XAS Looper, from Rigaku Corporation) to obtain X-ray absorption spectra at the Ce L3-edge (at around 5727 eV), and EXAFS oscillations that appeared in the X-ray absorption spectra were determined. The spectra were analyzed using software REX-2000 from Rigaku Corporation, to determine average coordination numbers N of oxygen and cerium atoms around a cerium atom, and average interatomic distances R. Results are summarized in Table 5. Note that in this patent specification, a simple notation of "interatomic distance" is defined to mean the "average interatomic distance" determined as described above.

It was confirmed from the results summarized in Table 5 that Example 2 showed presence of oxygen, silicon and cerium atoms around a cerium atom, with a cerium-oxygen interatomic distance of 2.5 Å, and a cerium-cerium interatomic distance of 3.9 Å, meanwhile a cerium-silicon interatomic distance of 3.2 Å. From the analytical result of XRD teaching that cerium has a cerianite crystal type and exists in the form of $CeO_2$, cerium oxide was considered to have Si solid-solubilized therein. In contrast, Comparative Example 4 did not show coordination of Si around the center Ce.

TABLE 5

| | Unit | Element | Example 2 | Comparative Example 4 |
|---|---|---|---|---|
| Coordination number around Ce center (N) | — | Ce | 7.9 | 8 |
| | | Si | 1.3 | Below detection limit |
| Distance from Ce (R) | Å | O | 2.5 | 2.3 |
| | | Ce | 3.9 | 3.7 |
| | | Si | 3.2 | — |

Experiment 5

Example 11

Deionized water was added to cerium(III) nitrate hexahydrate (grade 4N high-purity reagent, from Kanto Chemical Co., Inc.), to obtain a ceria solution with a concentration of 3.0 mass % in terms of $CeO_2$.

Meanwhile, deionized water was added to lanthanum chloride heptahydrate (from Wako Pure Chemical Industries, Ltd.), to obtain a lanthanum oxide solution with a concentration of 3.0 mass % in terms of $La_2O_3$.

Next, 363.3 g of the lanthanum oxide solution (10.9 g of $La_2O_3$) was added to 6903.3 g of the ceria solution (207.1 g of dry $CeO_2$), and further 48.4 g of the high-purity silicic acid solution (2.18 g of dry $SiO_2$) obtained in Preparatory Step 2 was added, to thereby obtain 7315 g of liquid B (220.18 g, on dry basis) with a solid content of concentration of 3.0 mass %.

Next, liquid A (5994 g, corresponding to 179.8 g of dry $SiO_2$) obtained in Preparatory Step 1 was cooled down to 10° C., kept stirred, to which liquid B (7315 g) was added over 18 hours. During the process, the liquid temperature was kept at 10° C., and pH was kept at 8.8 to 8.9 using 3% ammonia water as necessary. After completion of addition of liquid B, the mixture was kept at 10° C., and ripened for 4 hours. The mixed liquid was kept aerated during addition of liquid B and during ripening, so as to keep the redox potential at a positive value.

After completion of ripening, the mixed liquid was washed using an ultrafiltration membrane, while feeding deionized water. The precursor particle dispersion obtained after washing was found to have a solid matter concentration of 7 mass %, a pH of 6.5 (at 25° C.), and a conductivity of 120 μs/cm (at 25° C.).

Next, the thus obtained precursor particle dispersion was adjusted to pH6.5 by adding a 5 mass % aqueous acetic acid solution, and dried in a drying oven at 120° C. for 15 hours, to thereby obtain a dry powder. The dry powder was then fired in a muffle furnace at 1105° C. for 2 hours, to thereby obtain a fired product.

To 100 g of the obtained fired product (powder), 300 g of deionized water was added, further 3% ammonia water was added so as to adjust pH to 10.0, and the mixture was then subjected to wet crushing (using a batch type desk-top sand mill, from Kanpe Co., Ltd.) with 0.25 mm diameter quartz bead (from Daiken Chemical Co., Ltd.) for 120 minutes. After the crushing, the bead was removed, and the crushed product was pushed out using deionized water, to thereby obtain 1184 g of a crashed fired product dispersion with a solid matter concentration of 7.2 mass %. During the crushing, the mixture was kept at pH 10.0, by adding ammonia water.

The crushed fired product dispersion was further centrifuged using a centrifugal machine (Model "CR21G", from Koki Holdings Co., Ltd.) at 2000 G for 180 seconds, so as to remove a sediment fraction, and the remained light liquid was collected, and was used as a ceria-based composite particle dispersion.

The ceria-based composite particle contained in the obtained ceria-based composite particle dispersion, when analyzed by X-ray diffractometry in the same way as in Example 15, showed a diffraction pattern attributable to cerianite.

In later-described Examples 11 to 14, and Examples 16 to 20, the ceria-based composite particles contained in the individually obtained ceria-based composite particle dispersions were examined on their SEM images and TEM images in the same way as described later in Example 15, and confirmed that all mother particles were confirmed to have the ceria-containing silica layer on their surfaces, and to have the child particles (ceria crystal particles) dispersed in the layer.

Measured results of properties and impurity content ratios of silica particle (mother particle); content ratios of silica, ceria and different atoms contained in the ceria-based composite particle, and calculated value of mole quantity of (Ce+M)/Si; solid-solubilized element in ceria crystal; firing temperature when preparing ceria-based composite particle; crystallite size of ceria-based composite particle; average particle size of child particle; specific surface area of ceria-based composite particle; crystal type; content ratios of impurities contained in ceria-based composite particle; and average particle size of ceria-based composite particle are summarized in Tables 6, 7 and 8. Note that the different atoms, being solid-solubilized partially or totally into the ceria crystal, were considered to be entirely converted into oxides, and were thus denoted.

Next, polishing test was conducted using the thus obtained ceria-based composite particle dispersion.

Further measured results of polishing performances (polishing rate of thermal oxide film, surface roughness, observation result of polishing scratches on thermal oxide film after polished, number of scratches on polished aluminum hard disk) are summarized in Table 8. The same will apply to Examples and Comparative Examples hereinafter.

Example 12

In the process of preparation of liquid B in Example 11, 1090 g of 3.0 mass % lanthanum oxide solution (32.7 g of dry $La_2O_3$) was added to 6176.7 g of 3.0 mass % ceria solution (185.3 g of dry $CeO_2$), to which 48.4 g of the high-purity silicic acid solution (2.18 g of dry $SiO_2$) was further added, to thereby obtain 7315.1 g (220.18 g, on dry basis) of liquid B with a solid matter concentration of 3.0 mass %.

Next, the processes were conducted in the same as in Example 11, except that 5994 g of liquid A (179.82 g of dry $SiO_2$) obtained in Preparatory Step 1 was cooled down to 10° C., kept stirred, to which liquid B was added, and that the temperature of the muffle furnace, when firing the dried powder, was set to 1135° C. Results are summarized in Table 6 to 8.

Example 13

Deionized water was added to zirconium oxychloride (from Taiyo Koko Co., Ltd.), to obtain a zirconia solution with a concentration of 3.0 mass % in terms of $ZrO_2$.

Next, 363.3 g of the 3.0 mass % zirconia solution (10.9 g of dry $ZrO_2$) was added to 6903.3 g of 3.0 mass % ceria solution (207.1 g of dry $CeO_2$), to which 48.4 g of the high-purity silicic acid solution (2.18 g of dry $SiO_2$) was further added, to thereby obtain 7315 g of liquid B (220.18 g, on dry basis) with a solid matter concentration of 3.0 mass %.

Next, the processes were conducted in the same as in Example 11, except that 5994 g of liquid A (179.82 g of dry $SiO_2$) obtained in Preparatory Step 1 was cooled down to 10° C., kept stirred, to which liquid B was added, and that the temperature of the muffle furnace, when firing the dried powder, was set to 1050° C. Results are summarized in Table 6 to 8.

Example 14

To 6903.3 g of ceria solution (207.1 g of dry $CeO_2$), added was 363.3 g lanthanum oxide solution (10.9 g of dry $La_2O_3$), to obtain 7266.6 g (218 g, on dry basis) of liquid B with a solid matter concentration of 3.0 mass %.

Next, the processes were conducted in the same way as in Example 11, except that 6066.7 g of liquid A (182 g of dry $SiO_2$) obtained in Preparatory Step 1 was cooled down to 10° C., kept stirred, and to which liquid B was added. Results are summarized in Tables 6 to 8.

Example 15

To 6176.7 g of 3.0 mass % ceria solution (185.3 g of dry $CeO_2$), added was 1090 g of the 3.0 mass % zirconia solution (32.7 g of dry $ZrO_2$), to obtain 7266.7 g (218 g, on dry basis) of liquid B with a solid matter concentration 3.0 mass %.

Next, the processes were conducted in the same way as in Example 11, except that liquid B was added to 6066.7 g of liquid A (182 g of dry $SiO_2$) obtained in Preparatory Step 1, and that temperature of the muffle furnace, when firing the dried powder, was set to 1080° C.

The ceria-based composite particle contained in the ceria-based composite particle dispersion obtained in Example 15 was observed under a SEM and a TEM. A SEM image and a TEM image at 300,000× magnification are respectively shown in FIGS. 8 and 9, and a SEM image and a TEM image at 100,000× magnification are respectively shown in FIGS. 10 and 11. Average particle size of the child particle was measured on FIG. 8.

An X-ray diffraction pattern of the ceria-based composite particle contained in the ceria-based composite particle dispersion obtained in Example 15 is shown in FIG. 12.

The X-ray diffraction pattern in FIG. 12 shows a considerably sharp crystal pattern of cerianite. On the TEM images (FIGS. 9 and 11) and the SEM images (FIGS. 8 and 10), the child particles (ceria crystal particles) seemed to be tightly bound to the surface of the mother particles.

From FIG. 8, a thin silica film was confirmed to cover the topmost surface of the ceria-based composite particle, and that the silica film resides on the surface of the child particles.

Example 16

To 6903.3 g of 3.0 mass % ceria solution (207.1 g of dry $CeO_2$), added was 363.3 g of the 3.0 mass % zirconia solution (10.9 g of dry $ZrO_2$), to obtain 7266.6 g of liquid B (218 g, on dry basis) with a solid matter concentration of 3.0 mass %.

The processes were conducted in the same way as in Example 11, except that liquid B was added to 6066.7 g of liquid A (182 g of dry $SiO_2$) obtained in Preparatory Step 1, and that the temperature of the muffle furnace, when firing the dried powder, was set to 1050° C.

Example 17

Deionized water was added to iron(III) chloride hexahydrate (from Kanto Chemical Co., Inc.), to obtain iron oxide solution with a concentration of 3.0 mass % in terms of $Fe_2O_3$.

Next, 1017.3 g of the 3.0 mass % zirconia solution (30.52 g of dry $ZrO_2$) and 72.7 g of the 3.0 mass % iron oxide solution (2.18 g of dry $Fe_2O_3$) were added to 6176.7 g of 3.0 mass % ceria solution (185.3 g of dry $CeO_2$), to thereby obtain 7266.7 g of liquid B (218 g, on dry basis) with a solid matter concentration of 3.0 mass %.

Next, the processes were conducted in the same way as in Example 11, except that 6066.7 g of liquid A (182 g of dry $SiO_2$) obtained by Preparatory Step 1 was cooled down to 10° C., kept stirred, to which liquid B was added, and that the temperature of the muffle furnace, when firing the dried powder, was set to 1080° C. Results are summarized in Tables 6 to 8.

Example 18

Deionized water was added to nickel(II) chloride hexahydrate (from Kanto Chemical Co., Inc.), to obtain nickel oxide solution with a concentration of 3.0 mass % in terms of NiO.

In the process of preparation of liquid B in Example 11, 1017.3 g of 3.0 mass % zirconia solution (30.52 g of dry $ZrO_2$) and 72.7 g of the 3.0 mass % nickel oxide solution (2.18 g of dry NiO) were added to 6176.7 g of 3.0 mass % ceria solution (185.3 g of dry $CeO_2$), to thereby obtain 7266.7 g of liquid B (218 g, on dry basis) with a solid matter concentration of 3.0 mass %.

Next, the processes were conducted in the same way as in Example 11, except that 6066.7 g of liquid A (182 g of dry $SiO_2$) obtained by Preparatory Step 1 was cooled down to 10° C., kept stirred, to which liquid B was added, and that the temperature of the muffle furnace, when firing the dried powder, was set to 1080° C. Results are summarized in Tables 6 to 8.

Example 19

Deionized water was added to cobalt(II) chloride hexahydrate (from Kanto Chemical Co., Inc.), to obtain cobalt oxide solution with a concentration of 3.0 mass % in terms of CoO.

In the process of preparation of liquid B in Example 11, 1017.3 g of the 3.0 mass % zirconia solution (30.52 g of dry $ZrO_2$) and 72.7 g of the 3.0 mass % cobalt oxide solution (2.18 g of dry CoO) were added to 6176.7 g of 3.0 mass % ceria solution (185.3 g of dry $CeO_2$), to thereby obtain 7266.7 g of liquid B (218 g, on dry basis) with a solid matter concentration 3.0 mass %.

Next, the processes were conducted in the same way as in Example 11, except that 6066.7 g of liquid A (182 g of dry $SiO_2$) obtained in Preparatory Step 1 was cooled down to 10° C., kept stirred, to which liquid B was added, and that the temperature of the muffle furnace, when firing the dried powder, was set to 1080° C. Results are summarized in Tables 6 to 8.

Example 20

To 6176.7 g of 3.0 mass % ceria solution (185.3 g of dry $CeO_2$), added were 1017.3 g of the 3.0 mass % zirconia solution (30.52 g of dry $ZrO_2$) and 72.7 g of the 3.0 mass % lanthanum oxide solution (2.18 g of dry $La_2O_3$), to thereby obtain 7266.7 g of liquid B (218 g, on dry basis) with a solid matter concentration of 3.0 mass %.

Next, the processes were conducted in the same way as in Example 11, except that 6066.7 g of liquid A (182 g of dry $SiO_2$) obtained in Preparatory Step 1 was cooled down to 10° C., kept stirred, to which liquid B was added, and that the temperature of the muffle furnace, when firing the dried powder, was set to 1135° C. Results are summarized in Tables 6 to 8.

Example 21

The processes were conducted in the same way as in Example 11, except that ammonium nitrate and deionized water were added to the ceria-based composite particle obtained in Example 11, to thereby prepare a polishing slurry with a solid matter concentration of 1.0 mass % and an ammonium nitrate concentration of 1000 ppm.

Example 22

The processes were conducted in the same way as in Example 21, except that ammonium nitrate used for preparing the polishing slurry in Example 21 was replaced by ammonium acetate in Example 22.

Example 23

Polyacrylic acid (first grade, from Wako Pure Chemical Industries, Ltd., average molecular weight: ca. 5,000) and deionized water were added to the ceria-based composite particle obtained in Example 11, so as to adjust the solid matter concentration to 1.0 mass % and the polyacrylic acid concentration to 500 ppm, followed by sonication for dispersion. Using the thus obtained the polishing slurry, the processes were conducted in the same way as in Example 11.

Comparative Example 5

To 1,053 g of the high-purity silica-based particle dispersion obtained in Preparatory Step 1, 114 g of a cation exchange resin (SK-1BH, from Mitsubishi Chemical Corporation) was gradually added, the mixture was stirred for 30 minutes, and the resin was then separated. The pH at this time was found to be 5.1.

Ultrapure water was then added to the silica particle dispersion, to thereby obtain 6,000 g of dispersion (180 g of dry $SiO_2$) with a $SiO_2$ solid matter concentration of 3 mass % (also referred to as liquid A-3, hereinafter).

Next, deionized water was added to cerium(III) nitrate hexahydrate (4N high-purity reagent, from Kanto Chemical Co., Inc.), to obtain aqueous cerium nitrate solution with a concentration of 2.5 mass % in terms of $CeO_2$ (also referred to as liquid B-1, hereinafter).

Next, liquid A-3 (6,000 g) was heated to 50° C., kept stirred, to which liquid B-1 (8120 g, corresponding to 112.8 parts by mass of $CeO_2$ per 100 parts by mass of $SiO_2$) was added over 18 hours. During the process, the liquid temperature was kept at 50° C., and pH was kept at 7.85 using 3% ammonia water as necessary. The mixed liquid was kept aerated during addition of liquid B-1 and during ripening, so as to keep the redox potential at a positive value.

After completion of addition of liquid B-1, the liquid temperature was elevated to 93° C., and the mixed liquid was ripened for 4 hours. After completion of the ripening, the mixed liquid was allowed to stand in a room so as to be cooled down to room temperature, and then washed using an ultrafiltration membrane while feeding deionized water. The precursor particle dispersion obtained after washing was found to have a solid matter concentration of 7 mass %, a pH of 9.1 (at 25° C.), and a conductivity of 67 μs/cm (at 25° C.).

Next, the thus obtained precursor particle dispersion was adjusted to pH6.5 by adding a 5 mass % aqueous acetic acid solution, dried in a drying oven at 100° C. for 16 hours, and then fired in a muffle furnace at 1088° C. for 2 hours, to thereby obtain a powder.

In a 1 L side-arm beaker, 310 g of the powder obtained after firing and 430 g of deionized water were placed, to which 3% ammonia water was added, kept stirred, and sonicated in a ultrasonic bath for 10 minutes, to thereby obtain a suspension with pH10 (at 25° C.).

Next, into a crusher (LMZ06, from Ashizawa Finetech Ltd.) preliminarily cleaned and flushed with water, 595 g of 0.25 mm diameter quartz bead was placed, and the suspension was filled in a charge tank of the crusher (ratio of filling: 85%). Taking deionized water that remains in a crushing chamber and piping of the crusher into account, the concentration during crushing is estimated to be 25 mass %. Wet crushing was then conducted under conditions including a peripheral speed of disk of the crusher of 12 m/sec, the number of times of passes of 25 times, and a residence time per pass of 0.43 minutes. For every pass, 3% ammonia water was added to keep pH of the suspension during crushing to 10. A crushed fired product dispersion with a solid matter concentration of 22 mass % was thus obtained.

The thus obtained particle dispersion was centrifuged using a centrifugal machine (Model "CR21G", from Koki Holdings Co., Ltd.) at a relative centrifugal acceleration of 675 G for one minute so as to remove a sediment fraction, to thereby obtain a ceria-based composite particle dispersion.

Comparative Example 6

Measurement was made in the same way as in Example 11, using liquid A obtained in Preparatory Step 1.

Results are summarized in Tables 6, 7 and 8.

TABLE 6

| | Object to be measured | Measurement method | Unit | Example 11 | Example 12 | Example 13 | Example 14 | Example 15 | Example 16 | Example 17 |
|---|---|---|---|---|---|---|---|---|---|---|
| Silica-based particle (mother particle) | Average particle size of silica particle (mother particle) | SEM | nm | 113 | 113 | 113 | 113 | 113 | 113 | 96 |
| | Impurity content of silica-based particle (mother particle) (dry basis) | Na | Atomic absorption | ppm | ≤1 ppm | ≤1 ppm | ≤1 ppm | ≤1 ppm | ≤1 ppm | ≤1 ppm | ≤1 ppm |
| | | Ag | ICP | ppm | ≤1 ppm | ≤1 ppm | ≤1 ppm | ≤1 ppm | ≤1 ppm | ≤1 ppm | ≤1 ppm |
| | | Ca | ICP | ppm | ≤1 ppm | ≤1 ppm | ≤1 ppm | ≤1 ppm | ≤1 ppm | ≤1 ppm | ≤1 ppm |
| | | Cr | ICP | ppm | ≤1 ppm | ≤1 ppm | ≤1 ppm | ≤1 ppm | ≤1 ppm | ≤1 ppm | ≤1 ppm |
| | | Cu | ICP | ppm | ≤1 ppm | ≤1 ppm | ≤1 ppm | ≤1 ppm | ≤1 ppm | ≤1 ppm | ≤1 ppm |
| | | K | Atomic absorption | ppm | ≤1 ppm | ≤1 ppm | ≤1 ppm | ≤1 ppm | ≤1 ppm | ≤1 ppm | ≤1 ppm |
| | | Mg | ICP | ppm | ≤1 ppm | ≤1 ppm | ≤1 ppm | ≤1 ppm | ≤1 ppm | ≤1 ppm | ≤1 ppm |
| | | Ti | ICP | ppm | ≤1 ppm | ≤1 ppm | ≤1 ppm | ≤1 ppm | ≤1 ppm | ≤1 ppm | ≤1 ppm |
| | | Zn | ICP | ppm | ≤1 ppm | ≤1 ppm | ≤1 ppm | ≤1 ppm | ≤1 ppm | ≤1 ppm | ≤1 ppm |
| | | U | ICP | ppm | ≤1 ppm | ≤1 ppm | ≤1 ppm | ≤1 ppm | ≤1 ppm | ≤1 ppm | ≤1 ppm |
| | | Th | ICP | ppm | ≤1 ppm | ≤1 ppm | ≤1 ppm | ≤1 ppm | ≤1 ppm | ≤1 ppm | ≤1 ppm |
| | | SO$_4$ | Ion chromatography | ppm | ≤1 ppm | ≤1 ppm | ≤1 ppm | ≤1 ppm | ≤1 ppm | ≤1 ppm | ≤1 ppm |
| | | NO$_3$ | Ion chromatography | ppm | ≤1 ppm | ≤1 ppm | ≤1 ppm | ≤1 ppm | ≤1 ppm | ≤1 ppm | ≤1 ppm |
| | | Cl | Potentiometric titration | ppm | ≤1 ppm | ≤1 ppm | ≤1 ppm | ≤1 ppm | ≤1 ppm | ≤1 ppm | ≤1 ppm |
| | | F | Ion chromatography | ppm | ≤1 ppm | ≤1 ppm | ≤1 ppm | ≤1 ppm | ≤1 ppm | ≤1 ppm | ≤1 ppm |

| | Object to be measured | Measurement method | Unit | Example 18 | Example 19 | Example 20 | Example 21 | Example 22 | Example 23 | Comparative Example 5 | Comparative Example 6 |
|---|---|---|---|---|---|---|---|---|---|---|---|
| Silica-based particle (mother particle) | Average particle size of silica particle (mother particle) | SEM | nm | 113 | 113 | 113 | 113 | 113 | 113 | 113 | 113 |
| | Impurity content of silica-based particle (mother particle) (dry basis) | Na | Atomic absorption | ppm | ≤1 ppm | ≤1 ppm | ≤1 ppm | ≤1 ppm | ≤1 ppm | ≤1 ppm | ≤1 ppm | ≤1 ppm |
| | | Ag | ICP | ppm | ≤1 ppm | ≤1 ppm | ≤1 ppm | ≤1 ppm | ≤1 ppm | ≤1 ppm | ≤1 ppm | ≤1 ppm |
| | | Ca | ICP | ppm | ≤1 ppm | ≤1 ppm | ≤1 ppm | ≤1 ppm | ≤1 ppm | ≤1 ppm | ≤1 ppm | ≤1 ppm |
| | | Cr | ICP | ppm | ≤1 ppm | ≤1 ppm | ≤1 ppm | ≤1 ppm | ≤1 ppm | ≤1 ppm | ≤1 ppm | ≤1 ppm |
| | | Cu | ICP | ppm | ≤1 ppm | ≤1 ppm | ≤1 ppm | ≤1 ppm | ≤1 ppm | ≤1 ppm | ≤1 ppm | ≤1 ppm |
| | | K | Atomic absorption | ppm | ≤1 ppm | ≤1 ppm | ≤1 ppm | ≤1 ppm | ≤1 ppm | ≤1 ppm | ≤1 ppm | ≤1 ppm |

TABLE 6-continued

| | | | | | | | | | | |
|---|---|---|---|---|---|---|---|---|---|---|
| | Mg | ICP | ppm | ≤1 ppm | ≤1 ppm | ≤1 ppm | ≤1 ppm | ≤1 ppm | ≤1 ppm | ≤1 ppm |
| | Ti | ICP | ppm | ≤1 ppm | ≤1 ppm | ≤1 ppm | ≤1 ppm | ≤1 ppm | ≤1 ppm | ≤1 ppm |
| | Zn | ICP | ppm | ≤1 ppm | ≤1 ppm | ≤1 ppm | ≤1 ppm | ≤1 ppm | ≤1 ppm | ≤1 ppm |
| | U | ICP | ppm | ≤1 ppm | ≤1 ppm | ≤1 ppm | ≤1 ppm | ≤1 ppm | ≤1 ppm | ≤1 ppm |
| | Th | ICP | ppm | ≤1 ppm | ≤1 ppm | ≤1 ppm | ≤1 ppm | ≤1 ppm | ≤1 ppm | ≤1 ppm |
| | $SO_4$ | Ion chromatography | ppm | ≤1 ppm | ≤1 ppm | ≤1 ppm | ≤1 ppm | ≤1 ppm | ≤1 ppm | ≤1 ppm |
| | $NO_3$ | Ion chromatography | ppm | ≤1 ppm | ≤1 ppm | ≤1 ppm | ≤1 ppm | ≤1 ppm | ≤1 ppm | ≤1 ppm |
| | Cl | Potentiometric titration | ppm | ≤1 ppm | ≤1 ppm | ≤1 ppm | ≤1 ppm | ≤1 ppm | ≤1 ppm | ≤1 ppm |
| | F | Ion chromatography | ppm | ≤1 ppm | ≤1 ppm | ≤1 ppm | ≤1 ppm | ≤1 ppm | ≤1 ppm | ≤1 ppm |

TABLE 7

| Object to be measured | | | Measurement method | Unit | Example 11 | Example 12 | Example 13 | Example 14 | Example 15 | Example 16 | Example 17 |
|---|---|---|---|---|---|---|---|---|---|---|---|
| Ceria-based composite particle | Impurity content of ceria-based composite particle (relative to dry weight of silica) | Na | Atomic absorption | ppm | ≤1 ppm | ≤1 ppm | ≤1 ppm | ≤1 ppm | ≤1 ppm | ≤1 ppm | ≤1 ppm |
| | | Ag | ICP | ppm | ≤1 ppm | ≤1 ppm | ≤1 ppm | ≤1 ppm | ≤1 ppm | ≤1 ppm | ≤1 ppm |
| | | Ca | ICP | ppm | ≤1 ppm | ≤1 ppm | ≤1 ppm | ≤1 ppm | ≤1 ppm | ≤1 ppm | ≤1 ppm |
| | | Cr | ICP | ppm | ≤1 ppm | ≤1 ppm | ≤1 ppm | ≤1 ppm | ≤1 ppm | ≤1 ppm | ≤1 ppm |
| | | Cu | ICP | ppm | ≤1 ppm | ≤1 ppm | ≤1 ppm | ≤1 ppm | ≤1 ppm | ≤1 ppm | ≤1 ppm |
| | | K | Atomic absorption | ppm | ≤1 ppm | ≤1 ppm | ≤1 ppm | ≤1 ppm | ≤1 ppm | ≤1 ppm | ≤1 ppm |
| | | Mg | ICP | ppm | ≤1 ppm | ≤1 ppm | ≤1 ppm | ≤1 ppm | ≤1 ppm | ≤1 ppm | ≤1 ppm |
| | | Ti | ICP | ppm | ≤1 ppm | ≤1 ppm | ≤1 ppm | ≤1 ppm | ≤1 ppm | ≤1 ppm | ≤1 ppm |
| | | Zn | ICP | ppm | ≤1 ppm | ≤1 ppm | ≤1 ppm | ≤1 ppm | ≤1 ppm | ≤1 ppm | ≤1 ppm |
| | | U | ICP | ppm | ≤1 ppm | ≤1 ppm | ≤1 ppm | ≤1 ppm | ≤1 ppm | ≤1 ppm | ≤1 ppm |
| | | Th | ICP | ppm | ≤1 ppm | ≤1 ppm | ≤1 ppm | ≤1 ppm | ≤1 ppm | ≤1 ppm | ≤1 ppm |
| | | $SO_4$ | Ion chromatography | ppm | ≤1 ppm | ≤1 ppm | ≤1 ppm | ≤1 ppm | ≤1 ppm | ≤1 ppm | ≤1 ppm |
| | | $NO_3$ | Ion chromatography | ppm | ≤1 ppm | ≤1 ppm | ≤1 ppm | ≤1 ppm | ≤1 ppm | ≤1 ppm | ≤1 ppm |
| | | Cl | Potentiometric titration | ppm | ≤1 ppm | ≤1 ppm | ≤1 ppm | ≤1 ppm | ≤1 ppm | ≤1 ppm | ≤1 ppm |
| | | F | Ion chromatography | ppm | ≤1 ppm | ≤1 ppm | ≤1 ppm | ≤1 ppm | ≤1 ppm | ≤1 ppm | ≤1 ppm |

| Object to be measured | | | Measurement method | Unit | Example 18 | Example 19 | Example 20 | Example 21 | Example 22 | Example 23 | Comparative Example 5 | Comparative Example 6 |
|---|---|---|---|---|---|---|---|---|---|---|---|---|
| Ceria-based composite particle | Impurity content of ceria-based composite particle (relative to dry weight of silica) | Na | Atomic absorption | ppm | ≤1 ppm | ≤1 ppm | ≤1 ppm | ≤1 ppm | ≤1 ppm | ≤1 ppm | ≤1 ppm | ≤1 ppm |
| | | Ag | ICP | ppm | ≤1 ppm | ≤1 ppm | ≤1 ppm | ≤1 ppm | ≤1 ppm | ≤1 ppm | ≤1 ppm | ≤1 ppm |
| | | Ca | ICP | ppm | ≤1 ppm | ≤1 ppm | ≤1 ppm | ≤1 ppm | ≤1 ppm | ≤1 ppm | ≤1 ppm | ≤1 ppm |
| | | Cr | ICP | ppm | ≤1 ppm | ≤1 ppm | ≤1 ppm | ≤1 ppm | ≤1 ppm | ≤1 ppm | ≤1 ppm | ≤1 ppm |
| | | Cu | ICP | ppm | ≤1 ppm | ≤1 ppm | ≤1 ppm | ≤1 ppm | ≤1 ppm | ≤1 ppm | ≤1 ppm | ≤1 ppm |
| | | K | Atomic absorption | ppm | ≤1 ppm | ≤1 ppm | ≤1 ppm | ≤1 ppm | ≤1 ppm | ≤1 ppm | ≤1 ppm | ≤1 ppm |
| | | Mg | ICP | ppm | ≤1 ppm | ≤1 ppm | ≤1 ppm | ≤1 ppm | ≤1 ppm | ≤1 ppm | ≤1 ppm | ≤1 ppm |
| | | Ti | ICP | ppm | ≤1 ppm | ≤1 ppm | ≤1 ppm | ≤1 ppm | ≤1 ppm | ≤1 ppm | ≤1 ppm | ≤1 ppm |
| | | Zn | ICP | ppm | ≤1 ppm | ≤1 ppm | ≤1 ppm | ≤1 ppm | ≤1 ppm | ≤1 ppm | ≤1 ppm | ≤1 ppm |
| | | U | ICP | ppm | ≤1 ppm | ≤1 ppm | ≤1 ppm | ≤1 ppm | ≤1 ppm | ≤1 ppm | ≤1 ppm | ≤1 ppm |
| | | Th | ICP | ppm | ≤1 ppm | ≤1 ppm | ≤1 ppm | ≤1 ppm | ≤1 ppm | ≤1 ppm | ≤1 ppm | ≤1 ppm |
| | | $SO_4$ | Ion chromatography | ppm | ≤1 ppm | ≤1 ppm | ≤1 ppm | ≤1 ppm | ≤1 ppm | ≤1 ppm | ≤1 ppm | ≤1 ppm |
| | | $NO_3$ | Ion chromatography | ppm | ≤1 ppm | ≤1 ppm | ≤1 ppm | ≤1 ppm | ≤1 ppm | ≤1 ppm | ≤1 ppm | ≤1 ppm |
| | | Cl | Potentiometric titration | ppm | ≤1 ppm | ≤1 ppm | ≤1 ppm | ≤1 ppm | ≤1 ppm | ≤1 ppm | ≤1 ppm | ≤1 ppm |
| | | F | Ion chromatography | ppm | ≤1 ppm | ≤1 ppm | ≤1 ppm | ≤1 ppm | ≤1 ppm | ≤1 ppm | ≤1 ppm | ≤1 ppm |

TABLE 8

| | Object to be measured | Measurement method | Unit | Example 11 | Example 12 | Example 13 | Example 14 | Example 15 | Example 16 | Example 17 | Example 18 |
|---|---|---|---|---|---|---|---|---|---|---|---|
| Ceria-based composite particle | $SiO_2$ content ratio in ceria-based composite particle (mass %) | | % | 45.50 | 45.50 | 45.50 | 45.50 | 45.50 | 45.50 | 45.50 | 45.50 |
| | $CaO_2$ content ratio in ceria-based composite particle (mass %) | | % | 51.78 | 46.33 | 51.78 | 51.78 | 46.33 | 51.78 | 46.33 | 46.33 |
| | Mass (parts) of ceria per 100 parts by mass of silica | | | 113.8 | 101.8 | 113.8 | 113.8 | 101.8 | 113.8 | 101.8 | 101.8 |
| | Different atom (1) MOx(1) | | — | $La_2O_3$ | $La_2O_3$ | $ZrO_2$ | $La_2O_3$ | $ZrO_2$ | $ZrO_2$ | $ZrO_2$ | $ZrO_2$ |
| | Content of different atom (1) oxide in ceria-based composite particle | | % | 2.73 | 8.18 | 2.73 | 2.73 | 8.18 | 2.73 | 7.63 | 7.63 |
| | Different atom (2) MOx(2) | | — | — | — | — | — | — | — | $Fe_2O_3$ | NiO |
| | Content of different atom (2) oxide in ceria-based composite particle | ICP | — | 0.00 | 0.00 | 0.00 | 0.00 | 0.000 | 0.000 | 0.545 | 0.545 |
| | (Co + M)/Si (mole ratio) | | — | 0.419 | 0.421 | 0.426 | 0.419 | 0.442 | 0.426 | 0.446 | 0.446 |
| | Element solid-solubilized into ceria-based crystal | | — | Si, La | Si, La | Si, Zr | Si, La | Si, Zr | Si, Zr | Si, Zr, Fe | Si, Zr, Ni |
| | Firing temperature | | — | 1105 | 1135 | 1050 | 1105 | 1080 | 1050 | 1080 | 1080 |
| | Crystallite size | X-ray diffractometry | nm | 16 | 18 | 15 | 16 | 15 | 15 | 15 | 15 |
| | Geometric mean particle size of child particle | TEM | nm | 18 | 18 | 23 | 17 | 17 | 16 | 17 | 17 |
| | Specific surface area of ceria-based composite particle | | m²/g | 28 | 27 | 26 | 26 | 28 | 28 | 28 | 28 |
| | Crystal type | X-ray diffractometry | — | Cerianite | Cerianite | Cerianite | Cerianite | Cerianite | Cerianite | Cerianite | Cerianite |
| | Average particle size of ceria-based composite particle | SEM | nm | 144 | 147 | 149 | 143 | 147 | 149 | 149 | 151 |
| Evaluation of polishing | Result of polishing of thermal oxide film | Polishing rate | nm/min | 850 | 670 | 610 | 640 | 610 | 600 | 650 | 660 |
| | | Surface roughness | nm | 0.11 | 0.12 | 0.11 | 0.11 | 0.11 | 0.10 | 0.11 | 0.12 |
| | | Polishing scratch | — | Not clearly observed | Not clearly observed | Not clearly observed | Not clearly observed | Not clearly observed | Not clearly observed | Not clearly observed | Not clearly observed |
| | Result of polishing of aluminum hard | Scratch | — | Very few | Few | Very few | Very few | Very few | Very few | Very few | Very few |

TABLE 8-continued disk

| | Object to be measured | Measurement method | Unit | Example 19 | Example 20 | Example 21 | Example 22 | Example 23 | Comparative Example 5 | Comparative Example 6 |
|---|---|---|---|---|---|---|---|---|---|---|
| Ceria-based composite particle | SiO$_2$ content ratio in ceria-based composite particle (mass %) | | % | 45.50 | 45.50 | 45.50 | 45.50 | 45.50 | 47.00 | 100.00 |
| | CaO$_2$ content ratio in ceria-based composite particle (mass %) | | % | 46.33 | 46.33 | 51.78 | 51.78 | 51.78 | 53.00 | 0.00 |
| | Mass (parts) of ceria per 100 parts by mass of silica | | | 101.8 | 101.8 | 113.8 | 113.8 | 113.8 | 112.8 | — |
| | Different atom (1) MOx(1) | | — | ZrO$_2$ | La$_2$O$_3$ | La$_2$O$_3$ | La$_2$O$_3$ | La$_2$O$_3$ | — | — |
| | Content of different atom (1) oxide in ceria-based composite particle | | % | 7.63 | 7.63 | 2.73 | 2.73 | 2.73 | — | — |
| | Different atom (2) MOx(2) | | — | CoO | ZrO$_2$ | — | — | — | — | — |
| | Content of different atom (2) oxide in ceria-based composite particle | ICP | — | 0.545 | 0.545 | 0.000 | 0.000 | 0.000 | — | — |
| | (Co + M)/Si (mole ratio) | | — | 0.446 | 0.441 | 0.419 | 0.419 | 0.419 | 0.393 | — |
| | Element solid-solubilized into ceria-based crystal | | — | Si, Zr, Co | Si, La, Zr | Si, La | Si, La | Si, La | Below detection limit | — |
| | Firing temperature | | — | 1080 | 1135 | 1105 | 1105 | 1105 | 1205 | — |
| | Crystallite size | X-ray diffractometry | nm | 15 | 15 | 16 | 16 | 16 | 26 | — |
| | Geometric mean particle size of child particle | TEM | nm | 16 | 17 | 18 | 18 | 18 | 28 | — |
| | Specific surface area of ceria-based composite particle | | m$^2$/g | 28 | 30 | 29 | 29 | 28 | 28 | 53 |
| | Crystal type | X-ray diffractometry | — | Cerianite | Cerianite | Cerianite | Cerianite | Cerianite | Cerianite Cristobalite | Amorphous |
| | Average particle size of ceria-based composite particle | SEM | nm | 151 | 150 | 144 | 144 | 144 | 181 | — |
| Evaluation of polishing | Result of polishing of thermal oxide film | Polishing rate | nm/min | 650 | 645 | 876 | 847 | 855 | 361 | 50 |
| | | Surface roughness | nm | 0.12 | 0.11 | 0.11 | 0.11 | 0.11 | Scratches too numerous and not correctly measurable | 0.12 |
| | | Polishing scratch | — | Not clearly observed | Not clearly observed | Not clearly observed | Not clearly observed | Not clearly observed | Polishing scratches numerous | Not clearly observed |

TABLE 8-continued

| | | | | | | | | | |
|---|---|---|---|---|---|---|---|---|---|
| Result of polishing of auminum hard disk | Scratch | — | Very few | Few | Very few | Very few | Very few | Too numerous and uncountable | Very Few |

Experiment 6

[Measurement of Solid-Solubilized States of Si and Different Atoms]

The ceria-based composite particle dispersions prepared in Examples 11, 13 and 20, and Comparative Example 5 were analyzed using an X-ray absorption spectrometer (R-XAS Looper, from Rigaku Corporation) to obtain X-ray absorption spectra at the Ce L3-edge (at around 5727 eV), and EXAFS oscillations that appeared in the X-ray absorption spectra were determined. The spectra were analyzed using software REX-2000 from Rigaku Corporation, to determine average coordination numbers (N) of cerium atom, silicon atom or different atoms around a cerium atom; cerium-silicon interatomic distance ($R_1$); cerium-cerium interatomic distance ($R_2$); and cerium-different atoms interatomic distances ($R_3$). Results are summarized in Table 9.

It is understood from the results summarized in Table 9 that the child particles in the individual Examples have silicon atom and different atoms solid-solubilized in the ceria component. Kinds of the different atoms in the ceria-based composite particles obtained in the individual Examples are as follows [the number of each Example is followed by different atom(s) in parentheses]. Example 11 (La), Example 12 (La), Example 13 (Zr), Example 14 (La), Example 15 (Zr), Example 16 (Zr), Example 17 (Zr and Fe), Example 18 (Zr and Ni), Example 19 (Zr and Co), Example 20 (La and Zr).

TABLE 9

| | Unit | Element | Example 11 | Example 13 | Example 20 | Comparative Example 5 |
|---|---|---|---|---|---|---|
| Coordination number around Ce center (N) | — | Ce | 7.6 | 7.4 | 6.7 | 7.9 |
| | — | Si | 1.2 | 1.1 | 1.2 | Below detection limit |
| | — | La | 0.4 | — | 1.1 | — |
| | — | Zr | — | 0.5 | 0.1 | — |
| Distance from Ce (R) | Å | O | 2.3 | 2.3 | 2.2 | 2.3 |
| | Å | Ce | 3.8 | 3.7 | 3.8 | 3.7 |
| | Å | Si | 3.1 | 3.2 | 3.2 | — |
| | Å | La | 3.8 | — | 3.8 | — |
| | Å | Zr | — | 3.7 | 3.7 | — |

INDUSTRIAL APPLICABILITY

The ceria-based composite particle contained in the dispersion of this invention is free of coarse particle, causes less scratches, and gives high polishing rate. The polishing abrasive particle dispersion containing such dispersion of this invention is suitably applicable to polishing of the surfaces of semiconductor devices on semiconductor substrates, circuit boards and so forth, more specifically to planarization of a semiconductor substrate having a silica film formed thereon.

This application claims priority to Japanese Patent Application No. 2017-109087 filed on Jun. 1, 2017 and Japanese Patent Application No. 2017-118993 filed on Jun. 16, 2017, the entire contents of which are incorporated by reference herein.

The invention claimed is:

1. A ceria-based composite particle dispersion, containing a ceria-based composite particle that has an average particle size of 50 to 350 nm and is featured by [1] to [7] below:
   [1] the ceria-based composite particle has a mother particle, a cerium-containing silica layer on the surface of the mother particle, and a child particle dispersed inside the cerium-containing silica layer;
   [2] the mother particle contains amorphous silica as a major ingredient, and the child particle contains crystalline ceria as a major ingredient;
   [3] the ceria-based composite particle has an average crystallite size of the crystalline ceria, when analyzed by X-ray diffractometry, of 10 to 25 nm;
   [4] the ceria-based composite particle further has an easily soluble silica-containing layer as the outermost layer;
   [5] ratio D of mass $D_1$ of the easily soluble silica-containing layer to mass $D_2$ of the ceria-based composite particle ($D=D_1/D_2 \times 100$) is 0.08 to 30%;
   [6] the ceria-based composite particle has a mass ratio of silica and ceria of 100:11 to 316; and
   [7] the ceria-based composite particle, when analyzed by X-ray diffractometry, shows only a crystal phase of ceria.

2. The ceria-based composite particle dispersion according to claim 1,
   wherein the child particle demonstrates a particle size distribution with a coefficient of variation (CV value) of 10 to 60%.

3. The ceria-based composite particle dispersion according to claim 1, further featured by [8] below:
   [8] the crystalline ceria contained as a major ingredient of the child particle has silicon atom solid-solubilized therein.

4. The ceria-based composite particle dispersion according to claim 1,
   demonstrating a negative streaming potential before being subjected to cation colloidal titration, within the pH range from 3 to 8.

5. The ceria-based composite particle dispersion according to claim 1,
   demonstrating, when subjected to the cation colloidal titration, a streaming potential curve indicating a ratio (ΔPCD/V), given by formula (1) below, of −110.0 to −15.0, where ΔPCD denotes amount of change of streaming potential, and V denotes amount of addition of a cation colloidal titrant (V) at a knick:

ΔPCD/V=(I-C)/V . . . Formula (1)

C: streaming potential (mV) at the knick;
   I: streaming potential (mV) at the start point of the streaming potential curve; and V: amount of addition of the cation colloidal titrant (ml) at the knick.

6. A ceria-based composite particle dispersion, containing a ceria-based composite particle that has an average particle size of 50 to 350 nm and is featured by [1] to [3] and [9] to [11] below:
  [1] the ceria-based composite particle has a mother particle, a cerium-containing silica layer on the surface of the mother particle, and a child particle dispersed inside the cerium-containing silica layer;
  [2] the mother particle contains amorphous silica as a major ingredient, and the child particle contains crystalline ceria as a major ingredient
  [3] the ceria-based composite particle has an average crystallite size of the crystalline ceria, when analyzed by X-ray diffractometry, of 10 to 25 nm;
  [9] the crystalline ceria in the child particle has silicon atom solid-solubilized therein, and additionally has one or more different atoms solid-solubilized therein;
  [10] each of contents of cerium, silicon and the different atom(s) in the ceria-based composite particle satisfies a relation given by (Ce+M)/Si=0.038 to 1.11, where M means a total mole number of one or more different atoms, and Ce and Si mean mole numbers of cerium atom and silicon atom, respectively; and
  [11] the ceria-based composite particle, when analyzed by X-ray diffractometry, shows (i) only a crystal phase of ceria, or (ii) only a crystal phase of ceria and crystal phase(s) of oxide(s) of the different atom(s).

7. The ceria-based composite particle dispersion according to claim 1, wherein cerium atom and silicon atom contained in the child particle satisfy a relation given by $R_1<R_2$, where $R_1$ represents interatomic distance of adjoining cerium and silicon atoms, and $R_2$ represents interatomic distance of adjoining cerium atoms.

8. The ceria-based composite particle dispersion according to claim 1, wherein the child particle has a geometric mean particle size of 10 to 30 nm.

9. A polishing abrasive particle dispersion containing the ceria-based composite particle dispersion described in claim 1.

10. The polishing abrasive particle dispersion according to claim 9, intended to be used for planarizing a semiconductor substrate having a silica film formed thereon.

11. The ceria-based composite particle dispersion according to claim 6, wherein the different atom is a metal atom.

12. The ceria-based composite particle dispersion according to claim 6, wherein cerium atom and silicon atom contained in the child particle satisfy a relation given by $R_1<R_2$, where $R_1$ represents interatomic distance of adjoining cerium and silicon atoms, and $R_2$ represents interatomic distance of adjoining cerium atoms.

13. The ceria-based composite particle dispersion according to claim 6, wherein the child particle has a geometric mean particle size of 10 to 30 nm.

14. A polishing abrasive particle dispersion containing the ceria-based composite particle dispersion described in claim 6.

15. The polishing abrasive particle dispersion according to claim 14, intended to be used for planarizing a semiconductor substrate having a silica film formed thereon.

* * * * *